(12) United States Patent
Park

(10) Patent No.: US 11,934,618 B2
(45) Date of Patent: Mar. 19, 2024

(54) DISPLAY DEVICE AND A TOUCH INPUT SYSTEM INCLUDING THE SAME

(71) Applicant: SAMSUNG DISPLAY CO., LTD., Yongin-si (KR)

(72) Inventor: Won Sang Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/485,605

(22) Filed: Sep. 27, 2021

(65) Prior Publication Data

US 2022/0229514 A1 Jul. 21, 2022

(30) Foreign Application Priority Data

Jan. 21, 2021 (KR) ........................ 10-2021-0008710

(51) Int. Cl.
*G06F 3/044* (2006.01)
*H01L 27/15* (2006.01)
*H01L 33/50* (2010.01)
*H01L 33/58* (2010.01)
*H10K 50/844* (2023.01)
*H10K 50/86* (2023.01)
*H10K 59/12* (2023.01)
*H10K 59/38* (2023.01)
*H10K 59/40* (2023.01)

(52) U.S. Cl.
CPC .......... *G06F 3/0443* (2019.05); *G06F 3/0446* (2019.05); *H01L 27/156* (2013.01); *H01L 33/50* (2013.01); *H01L 33/58* (2013.01); *H10K 50/844* (2023.02); *H10K 50/865* (2023.02); *H10K 59/12* (2023.02); *H10K 59/38* (2023.02); *H10K 59/40* (2023.02); *G06F 2203/04103* (2013.01); *G06F 2203/04112* (2013.01); *H01L 2933/0091* (2013.01)

(58) Field of Classification Search
CPC .... G06F 3/0443; G06F 3/0446; G06F 3/0448; G06F 2203/04103; G06F 2203/04112; G06F 3/044
See application file for complete search history.

(56) References Cited

U.S. PATENT DOCUMENTS

2005/0162400 A1 7/2005 Tseng et al.
2016/0182767 A1 6/2016 Yoshida
(Continued)

FOREIGN PATENT DOCUMENTS

CN 108874220 * 11/2018
JP 2003-228036 8/2003
KR 10-2013-0095264 8/2013
(Continued)

OTHER PUBLICATIONS

Extended European Search Report issued in corresponding European Application No. 22152444.0 dated Jun. 14, 2022.

*Primary Examiner* — Dennis P Joseph
(74) *Attorney, Agent, or Firm* — F. Chau & Associates, LLC

(57) ABSTRACT

A display device including: a display unit including a plurality of emission areas which emit light; and a plurality of touch electrodes disposed on the display unit to detect a touch input, wherein at least some of the touch electrodes include a code pattern part including a plurality of code patterns that include cutouts corresponding to location information.

23 Claims, 27 Drawing Sheets

(56) References Cited

U.S. PATENT DOCUMENTS

2017/0364175 A1\* 12/2017 Park ................ B60R 11/04
2022/0206615 A1\* 6/2022 Kong ................ G06F 3/0412

FOREIGN PATENT DOCUMENTS

| KR | 10-2014-0011046 | 1/2014 |
| KR | 10-2014-0126091 | 10/2014 |
| TW | 201947381 | \* 12/2019 |

\* cited by examiner

FIG. 10

| | Col1 | Col2 | Col3 | Col4 | Col5 | Col6 | |
|---|---|---|---|---|---|---|---|
| DC11 → | 00 | 01 | 01 | 11 | 10 | 11 | ← Row1 (DC16) |
| | 00 | 01 | Null | 10 | 00 | 10 | ← Row2 |
| | 01 | 01 | 01 | 01 | Null | 10 | ← Row3 |
| | 01 | 10 | 00 | 00 | 01 | 11 | ← Row4 |
| | 01 | 01 | 00 | 10 | 01 | 11 | ← Row5 |
| DC61 → | 01 | 10 | 11 | 11 | 11 | 01 | ← Row6 (DC66) |

FIG. 12

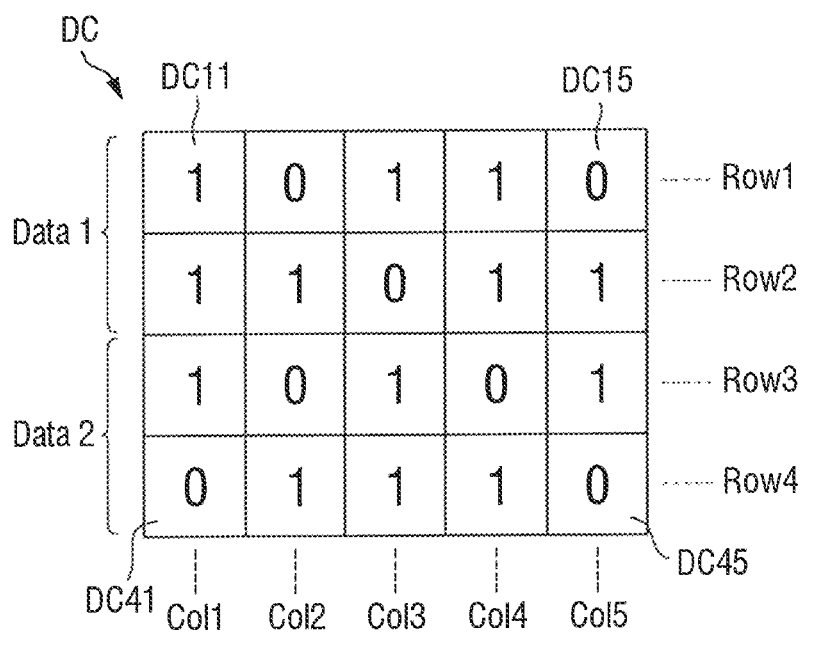

|  | Col1 | Col2 | Col3 | Col4 | Col5 |
|---|---|---|---|---|---|
| Row1 | 1 | 0 | 1 | 1 | 0 |
| Row2 | 1 | 1 | 0 | 1 | 1 |
| Row3 | 1 | 0 | 1 | 0 | 1 |
| Row4 | 0 | 1 | 1 | 1 | 0 |

Data 1: Row1, Row2
Data 2: Row3, Row4
DC: DC11 (top-left) to DC15 (top-right), DC41 (bottom-left) to DC45 (bottom-right)

FIG. 14

| | Col1 | Col2 | Col3 | |
|---|---|---|---|---|
| Data 1 | RP1 | 01 | 10 | Row1 |
| | 01 | 00 | 11 | Row2 |
| Data 2 | RP2 | 11 | 01 | Row3 |
| | 01 | 00 | 10 | Row4 |

RP: RP1, RP2

DISPLAY DEVICE AND A TOUCH INPUT SYSTEM INCLUDING THE SAME

CROSS-REFERENCE TO RELATED APPLICATION

This application claims priority under 35 U.S.C. § 119 to Korean Patent Application No. 10-2021-0008710 filed on Jan. 21, 2021, the disclosure of which is incorporated by reference herein in its entirety.

1. Technical Field

The present disclosure relates to a display device and a touch input system including the same.

2. Description of the Related Art

A display device is an output device for presentation of information in visual form, for example. As the usage, creation, distribution, manipulation and integration of information increases in today's society, the demand for display devices has increased and their applications is have diversified. For example, display devices have been applied to various electronic devices such as smart phones, digital cameras, notebook computers, navigation systems, and smart televisions. Examples of display devices include flat panel display devices such as a liquid crystal display (LCD) device, a field emission display (FED) device, or an organic light-emitting diode (OLED) display device. The OLED display device includes self-emissive light-emitting elements, which allow a display panel to emit light without the aid of a backlight.

Recent display devices support a touch input made with parts of the human body (e.g., a finger) and a touch input made with an electronic pen. Display devices can detect a touch input made with an electronic pen more precisely than a touch input made with a part of the human body.

SUMMARY

Embodiments of the present disclosure provide a display device, which is capable of reducing cost and power consumption and simplifying a driving process thereof by generating touch coordinate data of a touch input device, without using a complicated computation/correction process, in a case where a touch input is entered to the touch input device, and a touch input system including the display device.

According to an embodiment of the disclosure, a display device includes: a display unit including a plurality of emission areas which emit light; and a plurality of touch electrodes disposed on the display unit to detect a touch input, wherein at least some of the touch electrodes include a code pattern part including a plurality of code patterns that include cutouts corresponding to location information.

The touch electrodes may be formed in a mesh shape in a plan view and surround at least one of the emission areas.

The code pattern part may further include: a reference point, which is used to identify the code pattern part; a first reference line extending in a first direction from the reference point; and a second reference line extending in a second direction intersecting the first direction, from the reference point, and the code patterns are disposed in an area defined by the first and second reference lines.

The reference point may correspond to a cutout between intersecting touch electrodes.

The first reference line may be extended from the reference point along a plurality of intersection points of the touch electrode that are arranged in the first direction.

The second reference line may be extended from the reference point along a plurality of intersection points of the touch electrodes that are arranged in the second direction.

Each of the code patterns may correspond to an intersection between the at least some of the touch electrodes, and a directional location corresponding to the cutout may correspond to a predefined data code associated with the location information.

At least one of the code patterns may not include a cutout such that the at least one code pattern does not have a data code value.

The code pattern part may further include first and second reference points, which are used to identify the code pattern part, and the plurality of code patterns are disposed in an area defined by the first and second reference points.

The first and second reference points may be disposed on sides of the code patterns and spaced apart from each other.

The code patterns may include sides that are cut to form the cutouts and sides that are not cut, the location or absence of the cut side in each of the code patterns may correspond to a particular data code.

The first and second reference points may be arranged in rows and columns where the code patterns are arranged.

The first and second reference points may correspond to an area where stems of the sensing electrodes are completely removed.

Each of the code patterns may include a cutout at one of its sides, and a location of the cutout may correspond to a predefined data code associated with the location information.

The display unit may further include: a substrate; a thin-film transistor layer including a plurality of thin-film transistors disposed on the substrate; a light-emitting element layer disposed on the thin-film transistor layer and including a plurality of light-emitting elements; and an encapsulation layer covering the light-emitting element layer, and the touch electrodes may be disposed on the encapsulation layer.

The display device may further include: a plurality of color filters disposed in the emission areas on the display unit; and a light-blocking part surrounding each of the color filters on the display unit, wherein the touch electrodes may be covered by the light-blocking part.

The light-blocking part may include an organic light-blocking material and transmit infrared light or ultraviolet light therethrough, and the touch electrodes may include an infrared reflective material or an ultraviolet reflective material.

The display unit may further include: a first substrate; a thin-film transistor layer including a plurality of thin-film transistors disposed on the first substrate; and a light-emitting element layer disposed on the thin-film transistor layer and including a plurality of light-emitting elements, the display device may further include: a second substrate facing the first substrate; wavelength conversion parts disposed on a surface of the second substrate that faces the first substrate to correspond to the emission areas; and a light-blocking part surrounding the wavelength conversion parts, on the surface of the second substrate, and the touch electrodes may be disposed on the surface of the second substrate and covered by the light-blocking part.

The display unit may further include: a substrate; a thin-film transistor layer disposed on the substrate and including a plurality of thin-film transistors; and a light-emitting element layer disposed on the thin-film transistor layer and including a plurality of light-emitting elements, the display device may further include: wavelength conversion parts disposed on the light-emitting element layer to correspond to the emission areas; and a light-blocking part disposed on the light-emitting element layer and surrounding the wavelength conversion parts, and the touch electrodes may be disposed on the light-emitting element layer and covered by the light-blocking part.

The display unit may further include: a first substrate; a thin-film transistor layer disposed on the first substrate and including a plurality of thin-film transistors; and a light-emitting element layer disposed on the thin-film transistor layer and including a plurality of light-emitting elements, the display device may further include; a second substrate facing the first substrate; light-transmitting parts disposed on a surface of the second substrate that faces the first substrate to correspond to the emission areas; and a light-blocking part disposed on the surface of the second substrate and surrounding the light-transmitting parts, and the touch electrodes may be disposed on the surface of the second substrate and covered by the light-blocking part.

According to an embodiment of the disclosure, a touch input system includes: a display device for displaying an image; and a touch input device for entering a touch input to the display device, wherein the display device includes: a display unit including a plurality of emission areas that emit light; and a plurality of touch electrodes disposed on the display unit to detect the touch input, at least some of the touch electrodes include a code pattern part including a plurality of code patterns having cutouts corresponding to location information, and the touch input device is configured to capture an image of the code patterns, convert the code patterns into predefined data codes, and transmit coordinate data that consists of the data codes to the display device.

The touch input device may include: a camera for capturing an image of the code patterns; a processor for converting the code patterns into the predefined data codes by analyzing the captured image of the code patterns and generating coordinate data that consists of the data codes; and a communication module for transmitting the coordinate data to the display device.

The display device may further include: a communication unit for receiving coordinate data from the communication module; and a main processor for generating image data based on the received coordinate data, wherein the display unit displays an image based on the image data.

According to an embodiment of the disclosure, a display device includes: a display unit including a plurality of emission areas which emit light; and a plurality of touch electrodes disposed on the display unit to detect a touch input, wherein a first touch electrode includes a first pattern corresponding to first location information, and a second touch electrode includes a second pattern corresponding to second location information.

The first pattern may be different from the second pattern.

The first pattern may include a first cut portion of the first touch electrode.

The first location may correspond to a row and column where the first touch electrode is located in a matrix formed by the plurality of touch electrodes.

The row and column where the first touch electrode is located may correspond to a data code.

According to the aforementioned and other embodiments of the present disclosure, since a display device includes a plurality of code patterns provided in touch electrodes, a touch input can be received from a touch input device such as a smart pen. Each of the code patterns may be cut in accordance with a predetermined set of criteria to have location information and may correspond one-to-one to a predefined data code. Thus, since the display device can generate coordinate data that consists of data codes, without using a complicated computation/correction process, the display device can reduce cost and power consumption and can simplify a driving process thereof. In addition, since the display device includes a plurality of code patterns provided in the touch electrodes, the display device can be applied to nearly all types of electronic devices having a touch function without any size limitations.

BRIEF DESCRIPTION OF THE DRAWINGS

The above and other features of the present disclosure will become more apparent by describing in detail embodiments thereof with reference to the attached drawings, in which:

FIG. 10 is a table showing data codes corresponding to the code pattern part of FIG. to 9;

FIG. 12 is a table showing data codes corresponding to the code pattern part of FIG. 11;

FIG. 14 is a table showing data codes corresponding to the code pattern part of FIG. 13;

DETAILED DESCRIPTION OF THE EMBODIMENTS

Figure 1:
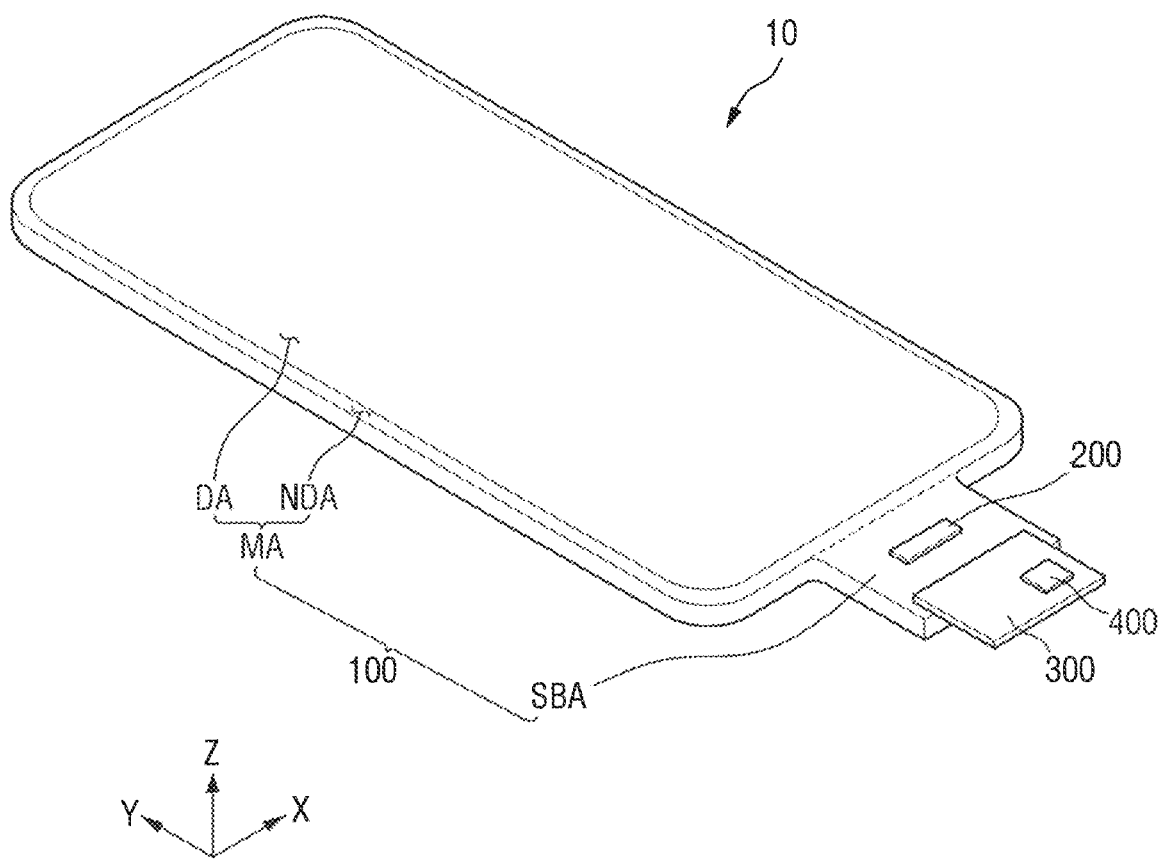
FIG. 1 is a perspective view of a display device according to an embodiment of the present disclosure.

In the following description, for the purposes of explanation, numerous details are set forth to provide a thorough understanding of various embodiments or implementations of the disclosure. As used herein "embodiments" and "implementations" are interchangeable words that are nonlimiting examples of devices or methods employing one or more of the implementations or embodiments disclosed herein. It is apparent, however, that various embodiments may be practiced without these details or with one or more equivalent arrangements. In other instances, structures and devices may be shown in block diagram form to avoid unnecessarily obscuring various embodiments. Further, various embodiments may be different, but do not have to be exclusive. For example, shapes, configurations, and characteristics of an embodiment may be used or implemented in another embodiment.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, andlor aspects, etc. (hereinafter individually or collectively referred to as "elements"), of the various embodiments may be otherwise combined, separated, interchanged, and/or rearranged.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated is elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. In addition, like reference numerals may denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. The term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or."

Although the terms "first," "second," etc. may be used herein to describe various types of elements, these elements should not be limited by these terms. These terms are used to distinguish one element from another element. Thus, a first element discussed below could be termed a second element.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include terms such as layer, stack, face or facing, extending over, covering, or partly covering or any other suitable term.

When an element is described as 'not overlapping' or 'to not overlap' another element, this may mean that the elements are spaced apart from each other, offset from each other, or set aside from each other or any other suitable term.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (e.g., the limitations of the measurement system). For example, "about" may mean within one or more standard deviations, or within 30%, 20%, 10%, 5% of the stated value.

Various embodiments are described herein with reference to sectional and/or exploded illustrations that are schematic illustrations of embodiments acrd/or intermediate structures. As such, variations from the shapes of the illustrations as a result, for example, of manufacturing techniques and/or tolerances, are to be expected. Thus, embodiments disclosed herein shotild not necessarily be construed as limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. In addition, each block, unit, and/or module of some or a number of embodiments may be physically separated into two or more interacting and discrete blocks, units, and/or modules. Further, the blocks, units, and/or modules of some or a number of embodiments may be physically combined into more complex blocks, units, and/or modules.

Unless otherwise defined, all terms (including technical and scientific terms) used herein have the same meaning as commonly understood by one of ordinary skill in the art to which this disclosure pertains. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of a display device according to an embodiment of the present disclosure.

Referring to FIG. 1, a display device 10 may be applicable to a portable electronic device such as a mobile phone, a smartphone, a tablet personal computer (PC), a mobile communication terminal, an electronic notepad, an electronic book (e-book), a portable multimedia player (PMP), a navigation device, or an ultra-mobile PC (UMPC). In one example, the display device 10 may be used as the display unit of a television (TV), a laptop computer, a monitor, a billboard, or an Internet-of-Things (IoT) device. In another example, the display device 10 may be applicable to a wearable device such as a smartwatch, a watchphone, a glasses display, or a head-mounted display (HMD). In yet another example, the display device 10 may be applicable to the dashboard, the center fascia, or the center information display (CID) of a vehicle, the room mirror display of a vehicle that can replace side-view mirrors, or an entertainment display disposed at the rear of the front seat of a vehicle.

The display device 10 may have an almost rectangular shape in a plan view. In one example, the display device 10 may have an almost rectangular shape with short sides in an X-axis direction and lona sides in a Y-axis direction in a plan view. The corners at which the short sides and the long sides of the display device 10 meet may be rounded or right-angled. The planar shape of the display device 10 is not limited to a rectangular shape, and the display device 10 may be formed in various other shapes, such as another polygonal shape, a circular shape, or an elliptical shape.

The display device 10 may include a display panel 100, a display driver 200, a circuit board 300, and a touch driver 400.

The display panel 100 may include a main area MA and a subarea SBA.

The main area MA may include a display area DA in which pixels for displaying an image are provided and a non-display area NDA which is disposed around the display area DA. The non-display area NDA may be disposed on fewer than all sides of the display area DA. The display area DA may emit light through a plurality of emission areas or a plurality of opening areas. In one example, the display panel 100 may include pixel circuits including switching elements, a pixel defining film defining emission areas or opening areas, and self-light-emitting elements.

In one example, the self-light-emitting elements may include organic light-emitting diodes (OLEDs) including organic light-emitting layers, quantum-dot light-emitting diodes (QLEDs) including quantum-dot light-emitting layers, and/or inorganic light-emitting diodes (ILEDs) including inorganic semiconductors, but the present disclosure is not limited thereto.

The non-display area NDA may be an area outside the display area DA. The non-display area NDA may be an edge area of the main area MA of the display area 100. The non-display area NDA may include a gate driver providing gate signals to scan lines and fan-out lines connecting the display driver 200 and the display area DA.

The subarea SBA may extend from one side of the main area MA. For example, the subareas SBA may extend from a short side of the main area MA. The subarea SBA may include a flexible material that is bendable, foldable, or rollable. In one example, as the subarea SBA is bent, the subarea SBA may overlap with the main area MA in a Z-axis direction. In other words, the subarea SBA may be bent such that it is disposed beneath the main area MA. The subarea SBA may include the display driver 200 and a pad unit, which is connected to the circuit board 300. Optionally, the subarea SBA may not be provided, and the display driver 200 and the pad unit may be disposed in the non-display area NDA.

The display driver 200 may output signals and voltages for driving the display panel 100. The display driver 200 may provide data voltages to data lines. The display driver 200 may provide power supply voltages to power supply lines and may provide scan control signals to the gate driver. The display driver 200 may be formed as an integrated circuit (IC) and may be mounted on the display panel 100 in a chip-on-glass (COG) or chip-on-plastic (COP) manner or via ultrasonic bonding. In one example, the display driver 200 may be disposed in the subarea SBA, and as the subarea SBA is bent, the display driver 200 may overlap with the main area MA in the Z-axis direction. in another example, the display driver 200 may be mounted on the circuit board 300.

The circuit board 300 may be attached on the pad unit of the display panel 100 via an anisotropic conductive film (ACF). The lead lines of the circuit board 300 may be electrically connected to the pad unit of the display panel 100. The circuit board 300 may be a flexible printed circuit board (FPCB), a printed circuit board (PCB), or a flexible film such as a (COF).

The touch driver 400 may be mounted on the circuit board 300. In another example, the touch driver 400 may be mounted on the subarea SBA with the display driver 200. The touch driver 400 may be connected to the touch sensing unit of the display panel 100. The touch driver 400 may provide touch driving signals to a plurality of touch electrodes and may detect variations in the capacitances of the touch electrodes. In one example, the touch driving signals may be pulse signals having a predetermined frequency. The touch driver 400 may detect the presence of a touch input and calculate the touch coordinates of the touch input based on the variations in the capacitances of the touch electrodes. The touch driver 400 may be formed as an IC.

Figure 2:
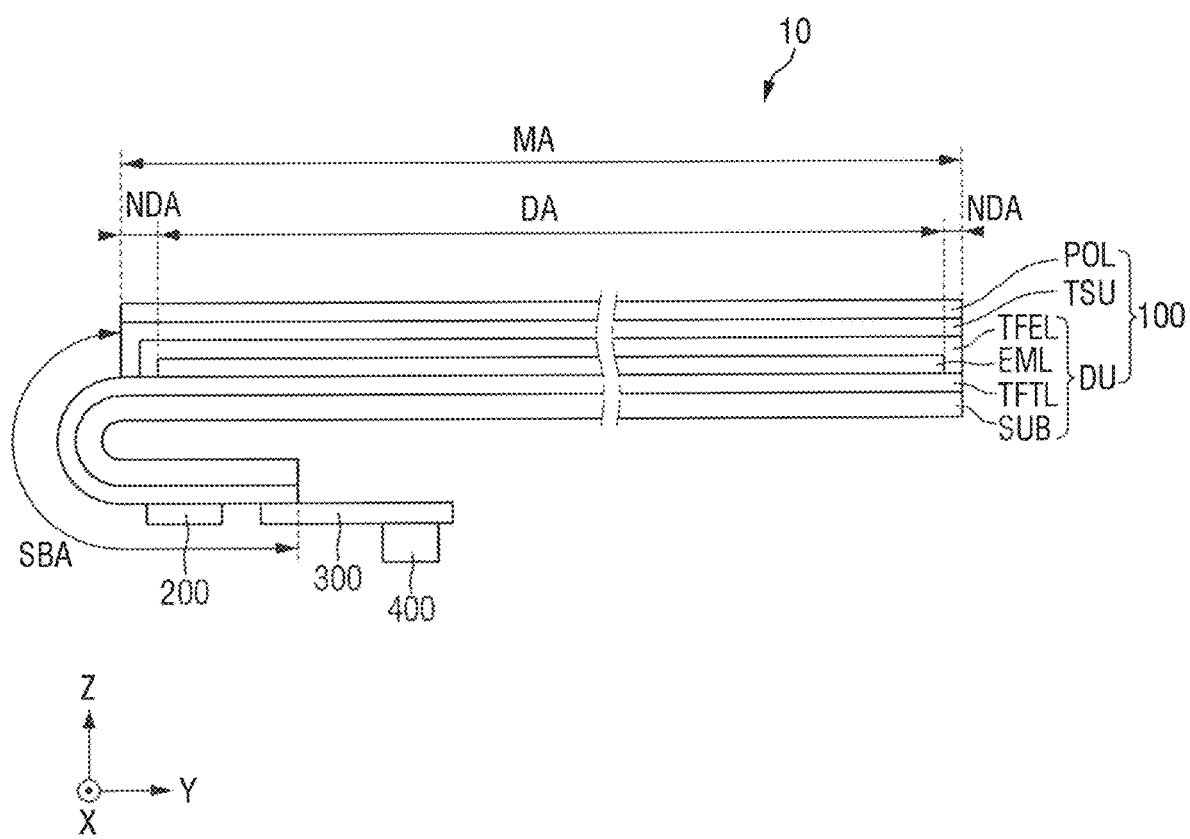
FIG. 2 is a cross-sectional view of the display device of FIG. 1.

FIG. 2 is a cross-sectional view of the display device of FIG. 1.

Referring to FIG. 2, the display panel 100 may include a display unit DU, a touch sensing unit TSU, and a polarizing film POL. The display unit DU, touch sensing unit TSU and polarizing film POL may be sequentially stacked. The display unit DU may include a substrate SUB, a thin-film transistor (TFT) layer TFTL, a light-emitting element layer EML, and an encapsulation layer TFEL.

The substrate SUB may be a base substrate or a base member. The substrate SUB may be a flexible substrate that is bendable, foldable, or rollable. In one example, the substrate SUB may include a glass material or a metallic material, but the present disclosure is not limited thereto. In another example, the substrate SUB may include a polymer resin such as polyimide (PI).

The TFT layer TFTL may be disposed on the substrate SUB. The TFT layer TFTL may include a plurality of TFTs that form the pixel circuits of pixels. The TFT layer TFTL may include gate lines, data lines, power supply lines, gate control lines, and fan-out lines, which connect the display driver 200 and the data lines, and lead lines, which connect the display driver 200 and the pad unit. Each of the TFTs may include a semiconductor region, a source electrode, a drain electrode, and a gate electrode. In one example, in a case where the gate driver is formed on one side of the non-display area NDA of the display panel 100, the gate driver may include the TFTs.

The TFT layer TFTL may be disposed in the display area DA, the non-display area NDA, and the subarea SBA. The TFTs, the gate lines, the data lines, and the power supply lines of the TFT layer TFTL may be disposed in the display area DA. The gate control lines and the fan-out lines of the TFT layer TFTL may be disposed in the non-display area NDA. The lead lines of the TFT layer TFTL may be disposed in the subarea SBA.

The light-emitting element layer EML may be disposed on the TFT layer TFTL. The light-emitting element layer EML may include a plurality of light-emitting elements, in which first electrodes, emission layers, and second electrodes are sequentially stacked to emit light, and a pixel-defining film, which defines pixels. The light-emitting elements of the light-emitting element layer EML may be disposed in the display area DA.

In one example, the emission layers may be organic emission layers including an organic material. The light-emitting layers may include hole transport layers, organic light-emitting layers, and electron transport layers. As the first electrodes receive a predetermined voltage via the TFTs of the TFT layer TFTL and the second electrodes receive a cathode electrode, holes and electrons may move to the emission layers through the hole transport layers and the electron transport layers and may be combined together in the emission layers to emit light. In one example, the first electrodes may be anode electrodes, and the second electrodes may be cathode electrodes. However, the present disclosure is not limited to this example.

In another example, the light-emitting elements of the light-emitting element layer EML may include QLEDs including quantum-dot light-emitting layers or ILEDs including an inorganic semiconductor.

The encapsulation layer TFEL may cover the top surface and the side surfaces of the light-emitting element layer EML and may protect the light-emitting element layer EML. For example, the encapsulation layer TFEL may contact the TFT layer TFTL at opposite sides of the light-emitting layer EML. The encapsulation layer TFEL may include at least one inorganic film and at least one organic film for encapsulating the light-emitting element layer EML.

The touch sensing unit TSU may be disposed on the encapsulation layer TFEL. The touch sensing unit TSU may be in contact with an upper surface of the TFT layer TFTL. The touch sensing unit TSU may include a plurality of touch electrodes for detecting a touch input from a user in a capacitive manner and touch lines for connecting the touch electrodes and to the touch driver 400. In one example, the touch sensing unit TSU nay detect a touch input from the user in a self-capacitive manner or a mutual capacitance manner.

Alternatively, the touch sensing unit TSU may be disposed on a separate substrate disposed on the display unit DU. In this case, the substrate that supports the touch sensing unit TSU may be a base member that encapsulates the display unit DU.

The touch electrodes of the touch sensing unit TSU may be disposed in a touch sensor area that overlaps with the display area DA. The touch lines of the touch sensing unit TSU may be disposed in a touch peripheral area that overlaps with the non-display area NDA.

The polarizing film POL may be disposed on the touch sensing unit TSU. The polarizing film POL may be attached on the touch sensing unit TSU via an optically clear adhesive (OCA) film or an optically clear resin (OCR). In one example, the polarizing film POL may include a linear polarizing plate and a phase retardation film such as a quarter-wave ($\lambda/4$) plate, and the linear polarizing plate and the phase retardation film may be sequentially stacked on the touch sensing unit TSU.

The subarea SBA may extend from one side of the main area MA. The subarea SBA may include a flexible material that is bendable, foldable, or rollable. In one example, as the subarea SBA is bent, the subarea SBA may overlap with the main area MA in the Z-axis direction. The subarea SBA may include the display driver 200 and the pad unit, which is connected to the circuit board 300.

Figure 3:
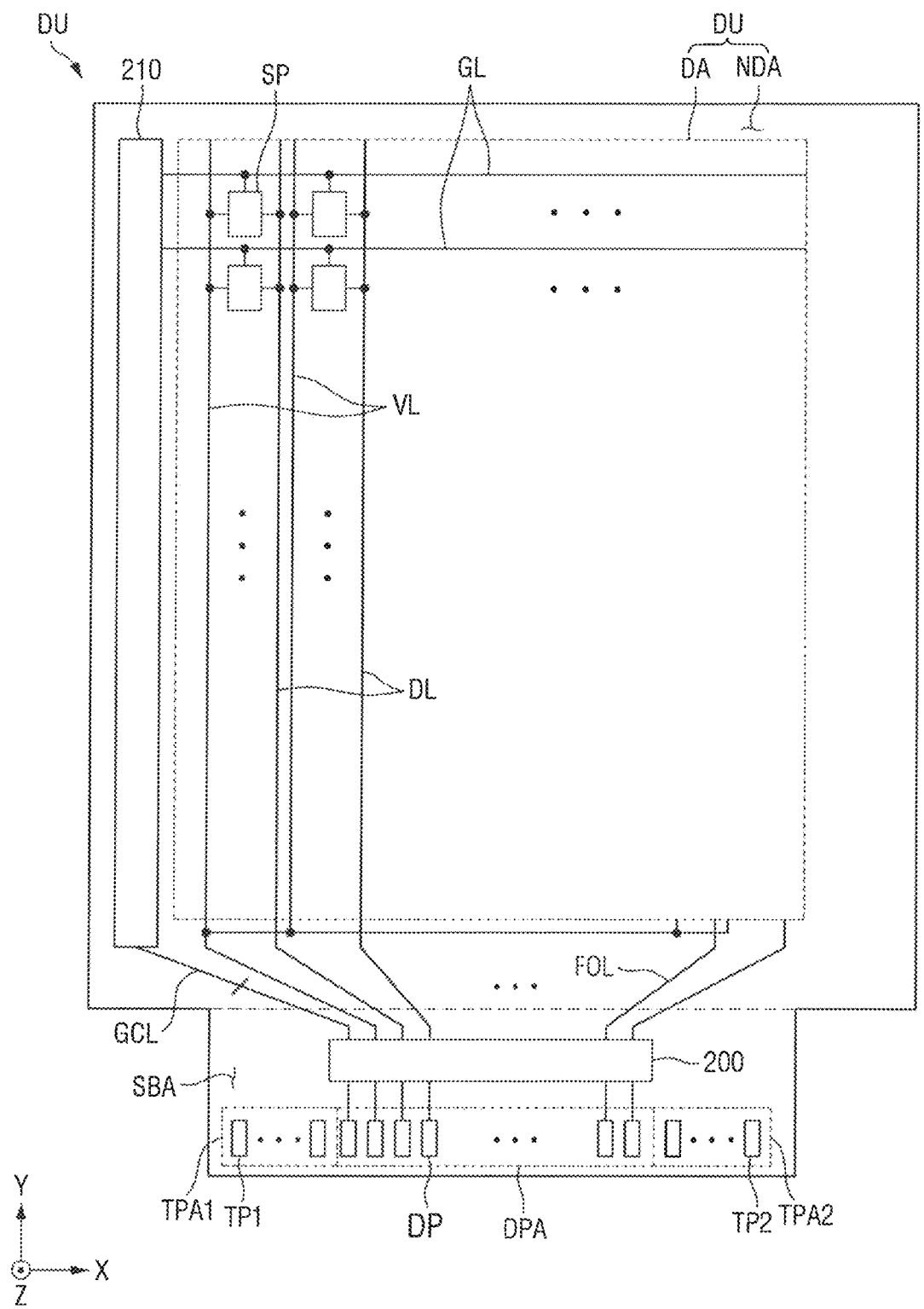
FIG. 3 is a plan view of a display unit of the display device of FIG. 1.

FIG. 3 is a plan view of the display unit of the display device of FIG. 1.

Referring to FIG. 3, the display unit DU may include a display area DA and a non-display area NDA.

The display area DA, which is an area that displays an image, may be a central part of the display panel 100. The display area DA may include a plurality of pixels SP, a plurality of gate lines GL, a plurality of data lines DL, and a plurality of power supply lines VL. The pixels SP may be minimal units for outputting light.

The gate lines GL may provide gate signals from a gate driver 210 to the pixels SP. The gate lines GL may extend in the X-axis direction and may be spaced apart from one another in the Y-axis direction, which intersects the X-axis direction.

The data lines DL may provide data voltages from the display driver 200 to the pixels SP. The data lines DL may extend in the Y-axis direction and may be spaced apart from one another in the X-axis direction.

The power supply lines VL may provide power supply voltages from the display driver 200 to the pixels SP. Here, the power supply voltages may include at least one of a driving voltage, an initialization voltage, and a reference voltage. The power supply lines VL may extend in the Y-axis direction and may be spaced apart from one another in the X-axis direction.

The non-display area NDA may surround the display area DA. The non-display area NDA may include the gate driver 210, fan-out lines FOL, and gate control lines GCL. The gate driver 210 may generate a plurality of gate signals based on gate control signals and may sequentially provide the gate signals to the gate lines GL in a predefined order.

The fan-out lines FOL may extend from the display driver 200 to the display area DA. The fan-out lines FOL may provide data voltages from the display driver 200 to the data lines DL.

The gate control lines GCL may extend from the display driver 200 to the gate driver 210. The gate control lines GCL may provide the gate control signals from the display driver 200 to the gate driver 210.

The subarea SBA may include the display driver 200, a display pad area DPA, and first and second touch pad areas TPA1 and TPA2. The display pad area DPA may be disposed between the first and second touch pad areas TPA1 and TPA2.

The display driver 200 may output signals and voltages for driving the display panel 100 to the fan-out lines FOL. The display driver 200 may provide data voltages to the data lines DL through the fan-out lines FOL. The data voltages may be provided to the pixels SP and may determine the luminance of the pixels SP. The display driver 200 may provide the gate control signals to the gate driver 210 through the gate control lines GCL.

The display pad area DPA, the first touch pad area TPA1, and the second touch pad area TPA2 may be disposed along an edge of the subarea SBA. The display pad area DPA, the first touch pad area TPA1, and the second touch pad area TPA2 may be electrically connected to the circuit board 300 via a low-resistance, high-reliability member such as an anisotropic conductive film or a self-assembly anisotropic conductive paste (SAP).

The display pad area DPA may include a plurality of display pads DP. The display pads DP may be connected to a main processor through the circuit board 300. The display pads DP may be connected to the circuit board 300 to receive digital video data and to provide digital video data to the display driver 200.

Figure 4:
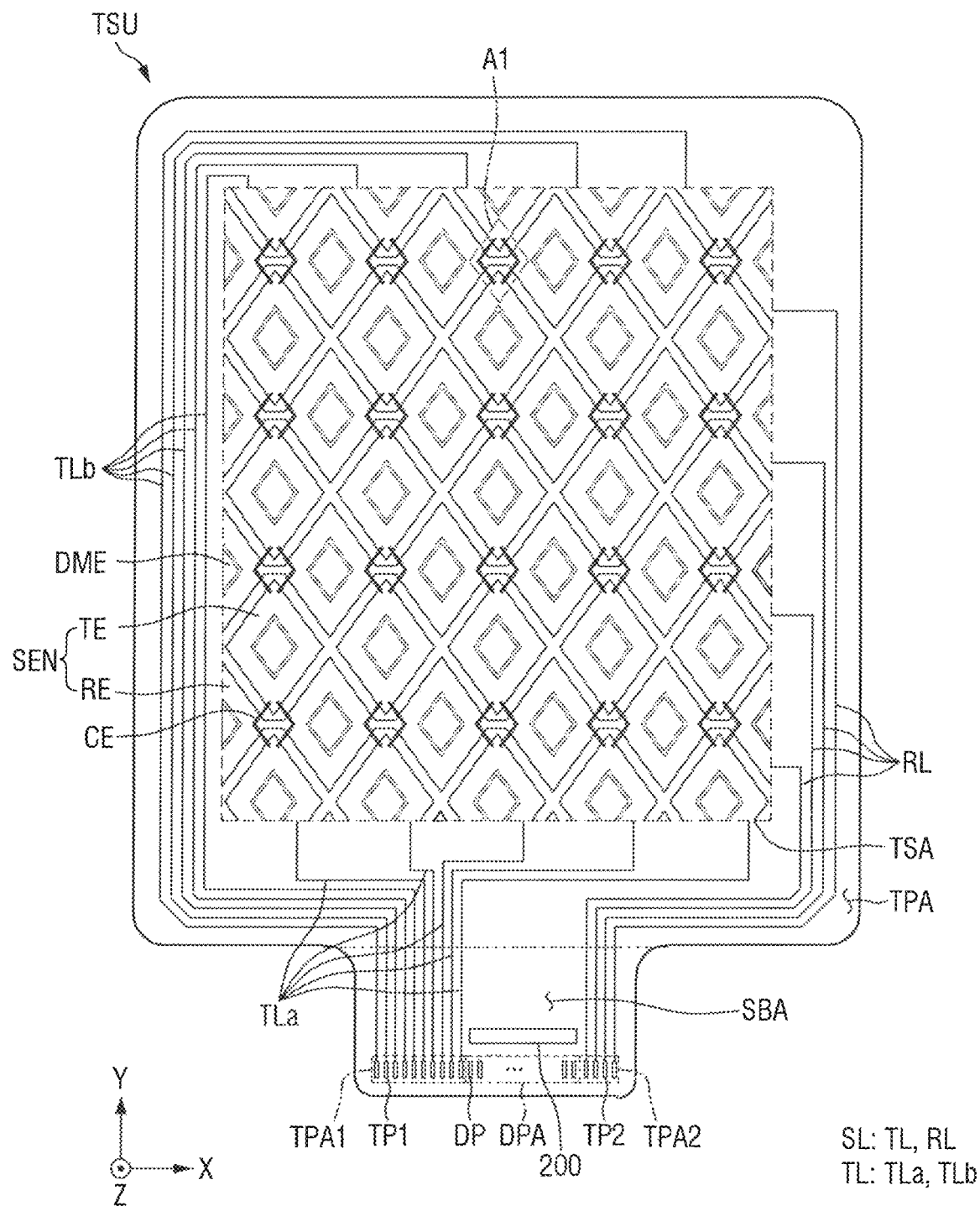
FIG. 4 is a plan view of a touch sensing unit of the display device of FIG. 1.

FIG. 4 is a plan view of the touch sensing unit of the display device of FIG. 1.

Referring to FIG. 4, the touch sensing unit TSU may include a touch sensor area TSA, which detects a touch input from the user, and a touch peripheral area TPA, which is disposed around the touch sensor area TSA. The touch sensor area TSA may overlap with the display area DA of the display unit DU, and the touch peripheral area TPA may overlap with the non-display area NDA of the display unit DU.

The touch sensor area TSA may include a plurality of touch electrodes SEN and a plurality of dummy electrodes DME. The touch electrodes SEN may form mutual capacitances or self-capacitances to detect a touch input from an object or a person. The touch electrodes SEN may include a plurality of driving electrodes TE and a plurality of sensing electrodes RE.

The driving electrodes TE may be arranged in the X- and Y-axis directions. The driving electrodes TE may be spaced apart from one another in the X- and Y-axis directions. Each pair of adjacent driving electrodes TE in the Y-axis direction may be electrically connected via bridge electrodes CE.

The driving electrodes TE may be connected to first touch pad units TP1 via driving lines TL. The driving lines TL may include lower driving lines TLa and upper driving lines TLb. In one example, driving electrodes TE in the lower part of the touch sensor area TSA may be connected to the first touch pad units TP1 via the lower driving lines TLa, and driving electrodes TE in the upper part of the touch sensor area TSA may be connected to the first touch pad units TP1 via the upper driving lines TLb. The lower driving lines TLa may extend to the first touch pad units TP1 through the lower part of the touch peripheral area TPA. The upper driving lines may extend to the first touch pad units TP1 through the upper, left, and lower parts of the touch peripheral area TPA. The first touch pad units TP1 may be connected to the touch driver 400 via the circuit board 300.

The bridge electrodes CE may be bent at least once. In one example, the bridge electrodes CE may be in the shape of angle brackets (e.g., "<" and ">"), but the shape of the bridge electrodes CE is not particularly limited. Each pair of adjacent driving electrodes TE in the Y-axis direction may be connected by multiple bridge electrodes CE, and thus, even if one of the bridge electrodes CE is disconnected, the driving electrodes TE can be stably connected via the other non-disconnected bridge electrodes CE. Each pair of adjacent driving electrodes TE may be connected by two bridge electrodes CE, but the number of bridge electrodes CE is not particularly limited.

The bridge electrodes CE may be disposed in a different layer from the driving electrodes TE and the sensing electrodes RE. Each pair of adjacent sensing electrodes RE in the X-axis direction may be electrically connected via connectors disposed in the same layer as is the driving electrodes TE or the sensing electrodes RE, and each pair of adjacent driving electrodes TE in the Y-axis direction may be electrically connected via bridge electrodes CE disposed in a different layer from the driving electrodes TE or the sensing electrodes RE. Thus, even if the bridge electrodes CE overlap with the sensing electrodes RE in the Z-axis direction, the driving electrodes TE can be insulated from the sensing electrodes RE. Mutual capacitances may be formed between the driving electrodes TE and the sensing electrodes RE.

The sensing electrodes RE may extend in the X-axis direction and may be spaced apart from one another in the Y-axis direction. The sensing electrodes RE may be arranged in the X- and Y-axis directions, and each pair of adjacent sensing electrodes RE in the X-axis direction may be electrically connected by a connector. The connector may be integrally formed with the pair of adjacent sensing electrodes RE.

The sensing electrodes RE may be connected to second touch pad units TP2 via sensing lines RL. In one example, sensing electrodes RE disposed on a right part of the touch sensor area TSA may be connected to the second touch pad units TP2 via the sensing lines RL. The sensing lines RL may extend to the second touch pad units TP2 through the right and lower parts of the touch peripheral area TPA. The second touch pad units TP2 may be connected to the touch driver 400 via the circuit board 300.

Each of the dummy electrodes DME may be surrounded by the driving electrodes TE or the sensing electrodes RE. Each of the dummy electrodes DME may be spaced apart from, and insulated by, the driving electrodes TE or the sensing electrodes RE. Thus, the dummy electrodes DME may be electrically floated.

A display pad area DPA, a first touch pad area TPA1, and a second touch pad area TPA2 may be disposed on one edge of the subarea SBA. The display pad area DPA, the first touch pad area TPA1, and the second touch pad area TPA2 may be electrically connected to the circuit board 300 via a low-resistance, high-reliability material such as an ACF or a self-assembly anisotropic conductive paste (SAP).

The first touch pad area TPA1 may be disposed on one side of the display pad area DPA and may include a plurality of first touch pad units TP1. The first touch pad units TP1 may be electrically connected to the touch driver 400, which is disposed on the circuit board 300. The first touch pad units TP1 may provide touch driving signals to the driving electrodes TE via the driving lines TL.

The second touch pad area TPA2 may be disposed on the other side of the display pad area DPA and may include a plurality of second touch pad units TP2. The second touch pad units TP2 may be electrically connected to the touch driver 400, which is disposed on the circuit board 300. The second touch pad units TP2 may receive touch sensing signals via the sensing lines RL, which are connected to the second touch pad units TP2, and may detect variations in the mutual capacitances between the driving electrodes TE and the sensing electrodes RE.

Alternatively, the touch driver 400 may provide touch driving signals to the driving electrodes TE and the sensing electrodes RE and may receive touch sensing signals from the driving electrodes TE and the sensing electrodes RE. The touch driver 400 may detect charge variations in the driving electrodes TE and the sensing electrodes RE based on touch sensing signals.

Figure 5:
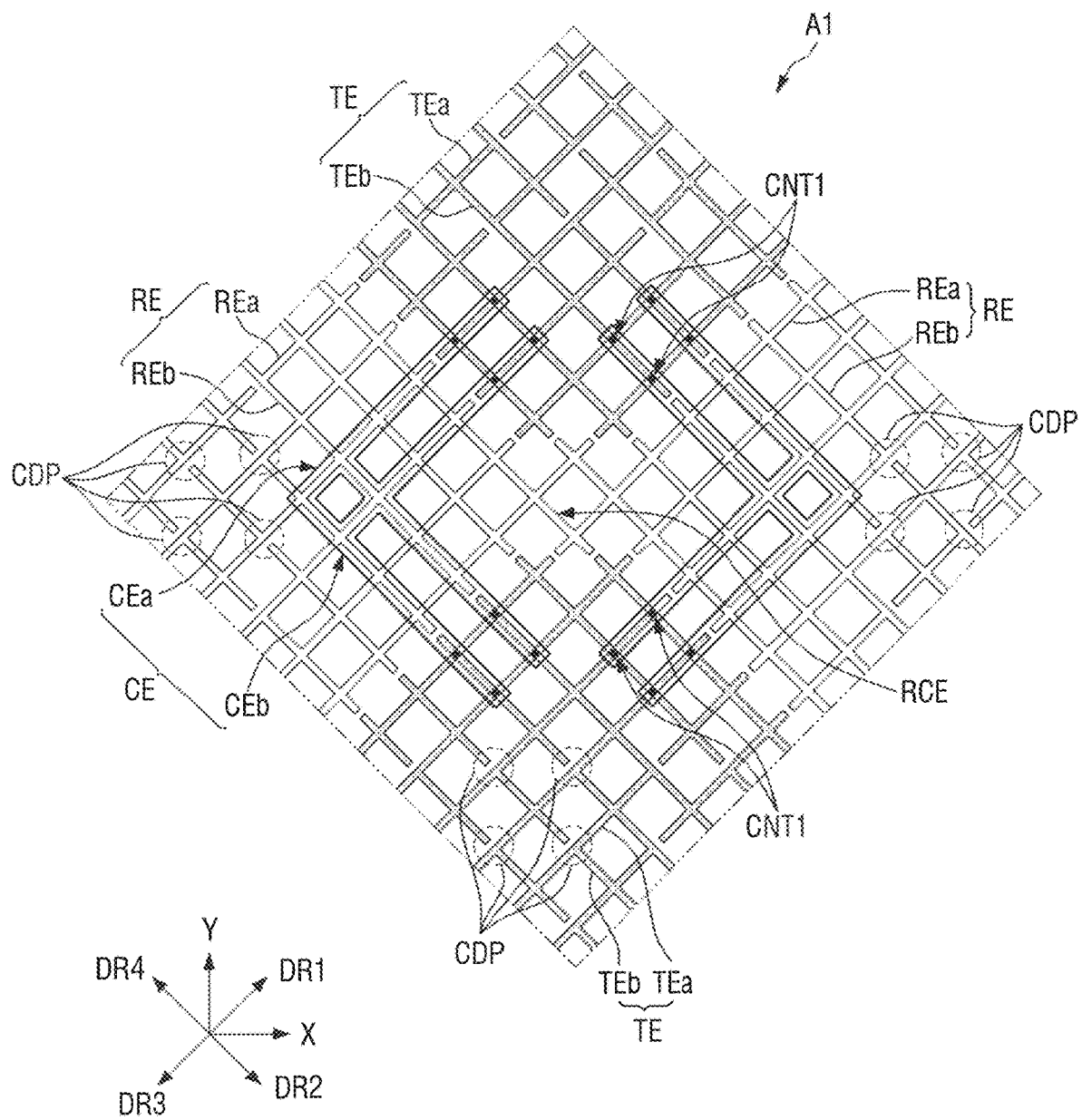
FIG. 5 is an enlarged view of an area A1 of FIG. 4.
Figure 6:
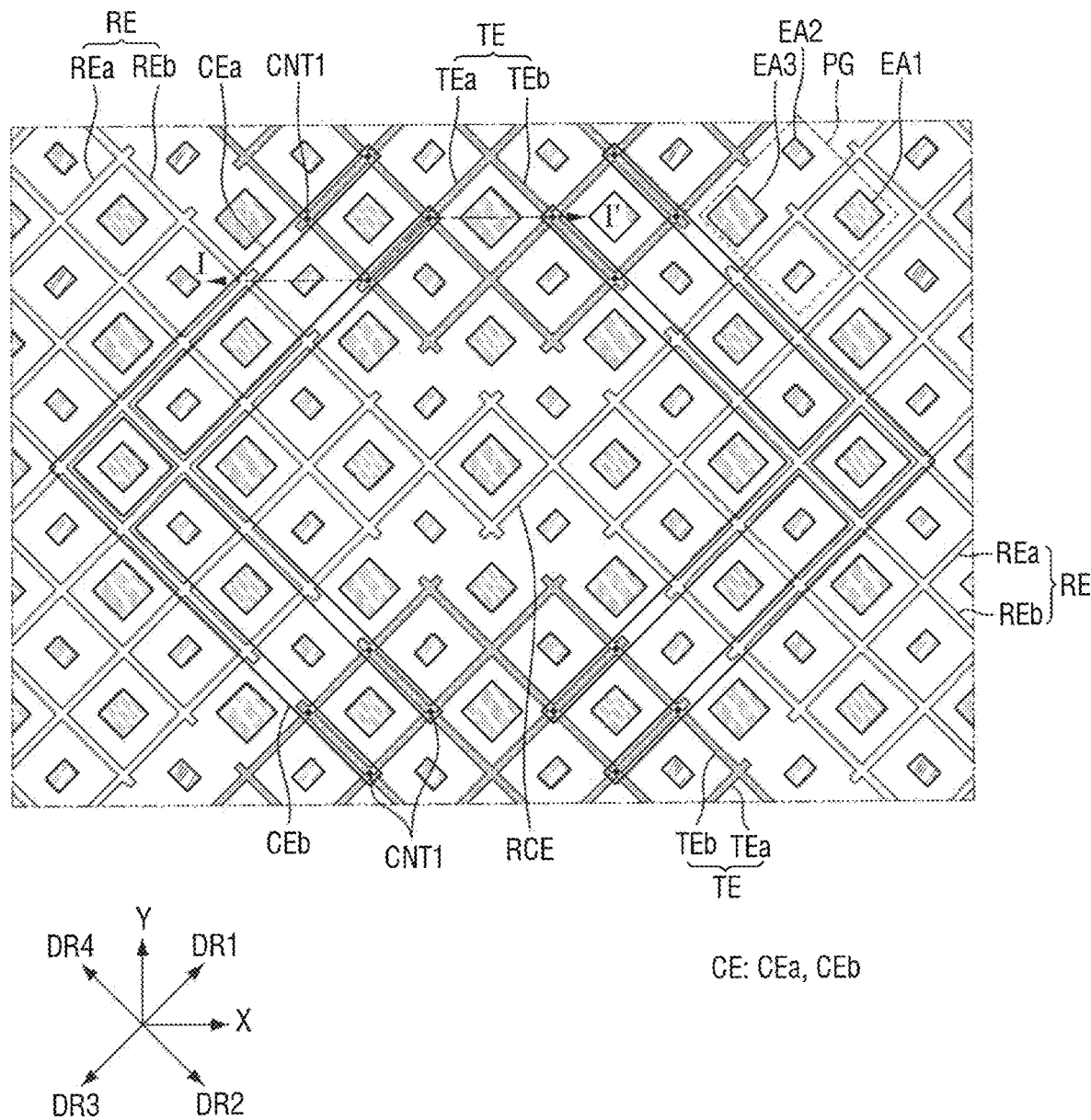
FIG. 6 is an enlarged plan view of a part of the display device of FIG. 1.

FIG. 5 is an enlarged plan view of an area A1 of FIG. 4, and FIG. 6 is an enlarged plan view of a part of the display device of FIG. 1.

Referring to FIGS. 5 and 6, the driving electrodes TE, the sensing electrodes RE, and the dummy electrodes DME may be disposed in the same layer and may be spaced apart from one another.

The driving electrodes TE may be arranged in the X- and Y-axis directions. The driving electrodes TE may be spaced apart from one another in the X- and Y-axis directions. Each pair of adjacent driving electrodes TE in the Y-axis direction may be electrically connected by bridge electrodes CE. In FIG. 5, two bridge electrodes CE are shown.

The sensing electrodes RE may extend in the X-axis direction and may be spaced apart from one another in the Y-axis direction. The sensing electrodes RE may be arranged in the X- and Y-axis directions, and each pair of adjacent sensing electrodes RE in the X-axis direction may be electrically connected by a connector RCE. The connector RCE may be disposed between the two bridge electrodes CE. In one example, the connector RCE may be disposed within the shortest distance of a corresponding pair of adjacent driving electrodes TE.

A plurality of bridge electrodes CE may be disposed in a different layer from the driving electrodes TE and the sensing electrodes RE. Each of the bridge electrodes CE may include first and second portions CEa and CEb. In one example, the first portion CEa of each of the bridge electrodes CE may be connected to a driving electrode TE via first contact holes CNT1 to extend in a third direction DR3. The second portion CEb of each of the bridge electrodes CE may be bent from the first portion CEa of a corresponding bridge electrode CE to extend in a second direction DR2, in an area that overlaps with a sensing electrode RE, and may be connected to a driving electrode TE via first contact holes CNT1. A first direction DR1 may be a direction between the X- and Y-axis directions, the second direction DR2 may be a direction between the X-axis direction and the opposite direction of the Y-axis direction, the third direction DR3 may be the opposite direction of the first direction DR1, and a fourth direction DR4 may be the opposite direction of the second direction DR2. Thus, each of the bridge electrodes CE may connect a pair of adjacent driving electrodes TE in the Y-axis direction.

In one example, the driving electrodes TE, the sensing electrodes RE, and the dummy electrodes DME may be formed in a mesh or fishnet shape in a plan view. The driving electrodes TE, the sensing electrodes RE, and the dummy electrodes DME may surround a plurality of emission areas (EA1, EA2, and EA3) of each pixel group PG in a plan view. Thus, the driving electrodes TE, the sensing electrodes RE, and the dummy electrodes DME may not overlap with the emission areas (EA1, EA2, and EA3). In addition, the bridge electrodes BE may not overlap with the emission areas (EA1, EA2, and EA3) of each of the pixel groups PG. Therefore, none of the light output by the emission areas (EA1, EA2, and EA3) is blocked by the driving electrodes TE, the sensing electrodes RE, the dummy electrodes DME and the bridge electrodes BE. Accordingly, the display device 10 can prevent the luminance of light emitted from the emission areas (EA1, EA2, and EA3) from being lowered by the touch sensing unit TSU.

Each of the driving electrodes TE may include first and second portions TEa and TEb, which extend in the first and second directions DR1 and DR2, respectively. Each of the sensing electrodes RE may include first and second portions REa and REb, which extend in the first and second directions DR1 and DR2, respectively.

At least some of the touch electrodes SEN may include a code pattern part CDP. At least some of the driving electrodes TE or at least some of the sensing electrodes RE may include a code pattern part CDP. A code pattern part CDP may include a plurality of code patterns that are cut in accordance with a predetermined set of criteria and thus have location information. Each of the code patterns may correspond to a predefined data code. In one example, each of the code patterns may be obtained by cutting one of a plurality of stems extended from a corresponding intersection between the touch electrodes SEN, but the present disclosure is not limited thereto. A plurality of stems may extend from an intersection between at least some of the touch electrodes SEN in the first, second, third, and fourth directions DR1, DR2, DR3, and DR4, and one of the plurality of stems may be cut. The direction corresponding to the cut stem may correspond to a predefined data code that forms location information.

Each of a plurality of pixels may include first, second, and third subpixels, which include first, second, and third emission areas EA1, EA2, and EA3, respectively. In one example, the first emission area EA1 may emit first-color light or red light, the second emission area EA2 may emit second-color light or green light, and the third emission area EA3 may emit third-color light or blue light. However, the present disclosure is not limited to this example.

One pixel group PG may include one first emission area EA1, two second emission areas EA2, and one third emission area EA3 and may thereby display a white gradation. Thus, a white gradation may be displayed by the combination of light emitted from one first emission area EA1, tight emitted from two second emission areas EA2, and light emitted from one third emission area EA3.

Figure 7:
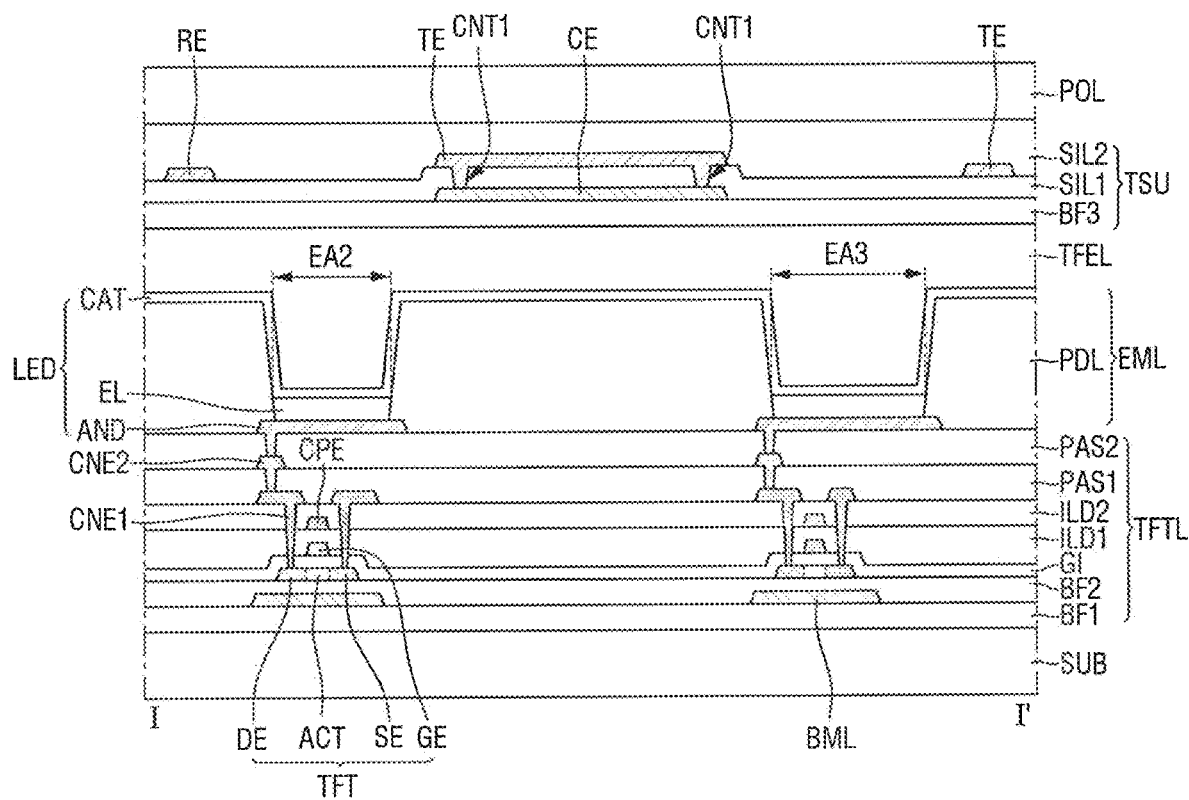
FIG. 7 is a cross-sectional view taken along line I-I' of FIG. 6.

FIG. 7 is a cross-sectional view taken along line I-I' of FIG. 6.

Referring to FIG. 7, the display panel 100 may include the display unit DU, the touch sensing unit TSU, and the polarizing film POL. The display unit DU may include the substrate SUB, the TFT layer TFTL, the light-emitting element layer EML, and the encapsulation layer TFEL.

The substrate SUB may be a base substrate or a base member. The substrate SUB may be a flexible substrate that is bendable, foldable, or rollable. In one example, the substrate SUB may include a glass material or a metallic material, but the present disclosure is not limited thereto. In another example, the substrate SUB may include a polymer resin such as PI.

The TFT layer TFTL may include a first buffer layer BF1, a light-blocking layer BML, a second buffer layer BF2, TFTs "TFT", a gate insulating film GI, a first interlayer insulating film ILD1, capacitor electrodes CPE, a second interlayer insulating film ILD2, first connecting electrodes CNE1, a first passivation layer PAS1, second connecting electrodes CNE2, and a second passivation layer PAS2.

The first buffer layer BF1 may be disposed on the substrate SUB. The first buffer layer BF1 may include one or more inorganic films capable of preventing the penetration of the air or moisture. In one example, the first buffer layer BF1 may include a plurality of inorganic films that are alternately stacked.

The light-blocking layer BML may be disposed on the first buffer layer BF1. In one example, the light-blocking layer BML may be formed as a single layer or a multilayer including molybdenum (Mo), aluminum (Al), chromium (Cr), gold (Au), titanium (Ti), nickel (Ni), neodymium (Nd), copper (Cu), or an alloy thereof. In another example, the light-blocking layer BML may be an organic film including a black pigment.

The second buffer layer BF2 may cover the first buffer layer BF1 and the light-blocking layer BML. The second buffer layer BF2 may include one or more inorganic films capable of preventing the penetration of the air or moisture. In one example, the second buffer layer BF2 may include a plurality of inorganic films that are alternately stacked.

The TFTs "TFT" may be disposed on the second buffer layer BF2 and may configure the pixel circuit of each of a plurality of pixels. In one example, the TFTs "TFT" may be the driving or switching transistors of a pixel circuit. The TFTs "TFT" may include semiconductor regions ACT, source electrodes SE, drain electrodes DE, and gate electrodes GE.

The semiconductor regions ACT, the source electrodes SE, and the drain electrodes DE may be disposed on the second buffer layer BF2. The semiconductor regions ACT, the source electrodes SE, and the drain electrodes DE may overlap with the light-blocking layer BML in a thickness direction. For example, the semiconductor regions ACT, the source electrodes SE, and the drain electrodes DE may be disposed between the light-blocking layer BML and the gate insulating film GI. The semiconductor regions ACT may overlap with the gate electrodes GE in a thickness direction and may be insulated from the gate electrodes GE by the gate insulating film GI. The source electrodes SE and the drain electrodes DE may be provided by turning the material of the semiconductor regions ACT into conductors.

The gate electrodes GE may be disposed on the gate insulating film GI. The gate electrodes GE may overlap with the semiconductor regions ACT with the gate insulating film GI interposed therebetween.

The gate insulating film GI may be provided on the semiconductor regions ACT, the source electrodes SE, and the drain electrodes DE. In one example, the gate insulating film GI may cover the semiconductor regions ACT, the source electrodes SE, the drain electrodes DE, and the second buffer layer BF2 and may insulate the semiconductor regions ACT from the gate electrodes GE. The gate insulating film GI may include contact holes that are penetrated by the first connecting electrodes CNE1. For example, the first connecting electrodes CNE1 may contact the source electrodes SE and the drain electrodes DE via the contact holes in the gate insulating film GI.

The first interlayer insulating film ILD1 may cover the gate electrodes GE and the gate insulating film GI. The first interlayer insulating film ILD1 may include contact holes that are penetrated by the first connecting electrodes CNE1. The contact holes of the first interlayer insulating film ILD1 may be connected to the contact holes of the gate insulating film GI and the contact holes of the second interlayer insulating film ILD2.

The capacitor electrodes CPE may be disposed on the first interlayer insulating film ILD1. The capacitor electrodes CPE may overlap with the gate electrodes GE in the thickness direction.

The second interlayer insulating layer ILD2 may cover the capacitor electrodes CPE and the first interlayer insulating film ILD1. The second interlayer insulating film ILD2 may include contact holes that are penetrated by the first connecting electrodes CNE1. The contact holes of the second interlayer insulating film ILD2 may be connected to the contact holes of the first interlayer insulating film ILD1 and the contact holes of the gate insulating film GI.

The first connecting electrodes CNE1 may be disposed on the second interlayer insulating film ILD2. The first connecting electrodes CNE1 may connect the drain electrodes DE of the TFTs "TFT" and the second connecting electrodes CNE2. The first connecting electrodes CNE1 may be inserted in the contact holes of the second interlayer insulating film ILD2, the contact holes of the first interlayer insulating film ILD1, and the contact holes of the gate insulating film GI and may thus be in contact with the drain electrodes DE of the TFTs "TFT".

The first passivation layer PAS1 may cover the first connecting electrodes CNE1 and the second interlayer insulating film ILD2. The first passivation layer PAS1 may protect the TFTs "TFT". The first passivation layer PAS1 may include contact holes that are penetrated by the second connecting electrodes CNE2. The contact holes penetrated by the second connecting electrodes CNE2 may be offset from the contact holes penetrated by the first connecting electrodes CNE1.

The second connecting electrodes CNE2 may be disposed on the first passivation layer PAS1. The second connecting electrodes CNE2 may connect the first connecting electrodes CNE1 and pixel electrodes AND of light-emitting elements LED. The second connecting electrodes CNE2 may be inserted in the contact holes of the first passivation layer PAS1 and may thus be in contact with the first connecting electrodes CNE1.

The second passivation layer PAS2 may cover the second connecting electrodes CNE2 and the first passivation layer PAS1. The second passivation layer PAS2 may include contact holes that are penetrated by the pixel electrodes AND of the light-emitting elements LED.

The light-emitting elements LED may be disposed on the TFT layer TFTL. The light-emitting element layer EML, may include the light-emitting elements LED and a pixel-defining film PDL. For example, a pixel definition layer. Each of the light-emitting elements LED may include a first electrode AND, an emission layer EL, and a common electrode CAT.

The pixel electrodes AND may be disposed on the second passivation layer PAS2. Each of the pixel electrodes AND may be disposed to overlap with one of first, second, and third emission areas EA1, EA2, and EA3, which are defined by the pixel-defining film PDL. The pixel electrodes AND may be connected to the drain electrodes DE of the TFTs "TFT" through the first connecting electrodes CNE1 and the second connecting electrodes CNE2. The sizes of the pixel electrodes AND may be different from each other in the first, second, and third emission areas EA1, EA2, and EA3.

The emission layers EL may be disposed on the pixel electrodes AND. In one example, the emission layers EL may be organic emission layers including an organic material, but the present disclosure is not limited thereto. In this example, as the TFTs "TFT" apply a predetermined voltage to the pixel electrodes AND, the common electrode CAT receives a common voltage or a cathode electrode voltage, holes and electrons may move to the emission layers EL through hole transport layers and electron transport layers and may be combined together in the emission layers EL to emit light.

The common electrode CAT may be disposed on the emission layer EL. The common electrode CAT may be implemented as a common electrode for all pixels. In one example, the common electrode CAT may be disposed on the emission layers EL in the first, second, and third emission areas EA1, EA2, and EA3 and on the pixel-defining film PDL in areas other than the first, second, and third emission areas EA1, EA2, and EA3.

The common electrode CAT may receive a common voltage or a low-potential voltage. As the pixel electrodes AND receive a data voltage and the common electrode CAT receives a low-potential voltage, an electric potential difference is formed between the pixel electrodes AND the common electrode CAT, and as a result, the emission layer EL can emit to light. Thus, the display device 10 can display an image in a first mode.

The pixel-defining film PDL may define the first, second, and third emission areas EA1, EA2, and EA3. The pixel-defining film PDL may separate and insulate the pixel electrodes AND from one another.

The encapsulation layer TFEL may be disposed on the common electrode CAT and may cover the light-emitting elements LED. The encapsulation layer TFEL may include at least one inorganic film and may prevent the penetration of oxygen or moisture into the light-emitting element layer EML. The encapsulation layer TFEL may include at least one organic film and may protect the light-emitting element layer EML from a foreign material such as dust.

The touch sensing unit TSU may be disposed on the encapsulation layer TFEL. The touch sensing unit TSU may include a third buffer layer BF3, a bridge electrode CE, a first insulating film SIL1, driving electrodes TE, sensing electrodes RE, and a second insulating film SIL2.

The third buffer layer BF3 may be disposed on the encapsulation layer TFEL. The third buffer layer BF3 may have an insulating function and an optical function. The third buffer layer BF3 may include at least one inorganic film. Optionally, the third buffer layer BF3 may not be provided.

The bridge electrode CE may be disposed on the third buffer layer BF3. The bridge electrode CE may be in direct contact with the third buffer layer BF3. The bridge electrode CE may be disposed in a different layer from the driving electrodes TE and the sensing electrodes RE and may connect a pair of adjacent driving electrodes TE in the Y-axis direction.

The first insulating film SIL1 may cover the bridge electrode CE and the third buffer layer BF3. The first insulating film SIL1 may have an insulating function and an optical function. In one example, the first insulating film SIL1 may be an inorganic film including at io least one of a silicon nitride layer, a silicon oxynitride layer, a silicon oxide layer, a titanium oxide layer, and an aluminum oxide layer.

The driving electrodes TE and the sensing electrodes RE may be disposed on the first insulating film SIL1. The driving electrodes TE and the sensing electrodes RE may not overlap with the first, second, and third emission areas EA1, EA2, and EA3. The driving electrodes TE and the sensing electrodes RE may each be formed as a single layer including Mo, Ti, Cu, or Al or as a stack of Al and Ti (e.g., Ti/Al/Ti), a stack of Al and ITO (e.g., ITO/Al/ITO), an APC alloy, or a stack of an APC alloy and ITO (e.g., ITO/APC/ITO).

The second insulating film SIL2 may cover the driving electrodes TE, the sensing electrodes RE, and the first insulating film SIL1. The second insulating film SIL2 may have an insulating function and an optical function. In one example, the second insulating film SIL2 may be formed of one of the above-described materials that can be used to form the first insulating film SIL1.

The polarizing film POL may be disposed on the touch sensing unit TSU. The polarizing film POL may be attached on the touch sensing unit TSU via an OCA film or an OCR. In one example, the polarizing film POL may include a linear polarizing plate and a phase retardation film such as a λ/4 plate, and the linear polarizing plate and the phase retardation film may be sequentially stacked on the touch sensing unit TSU.

Figure 8:
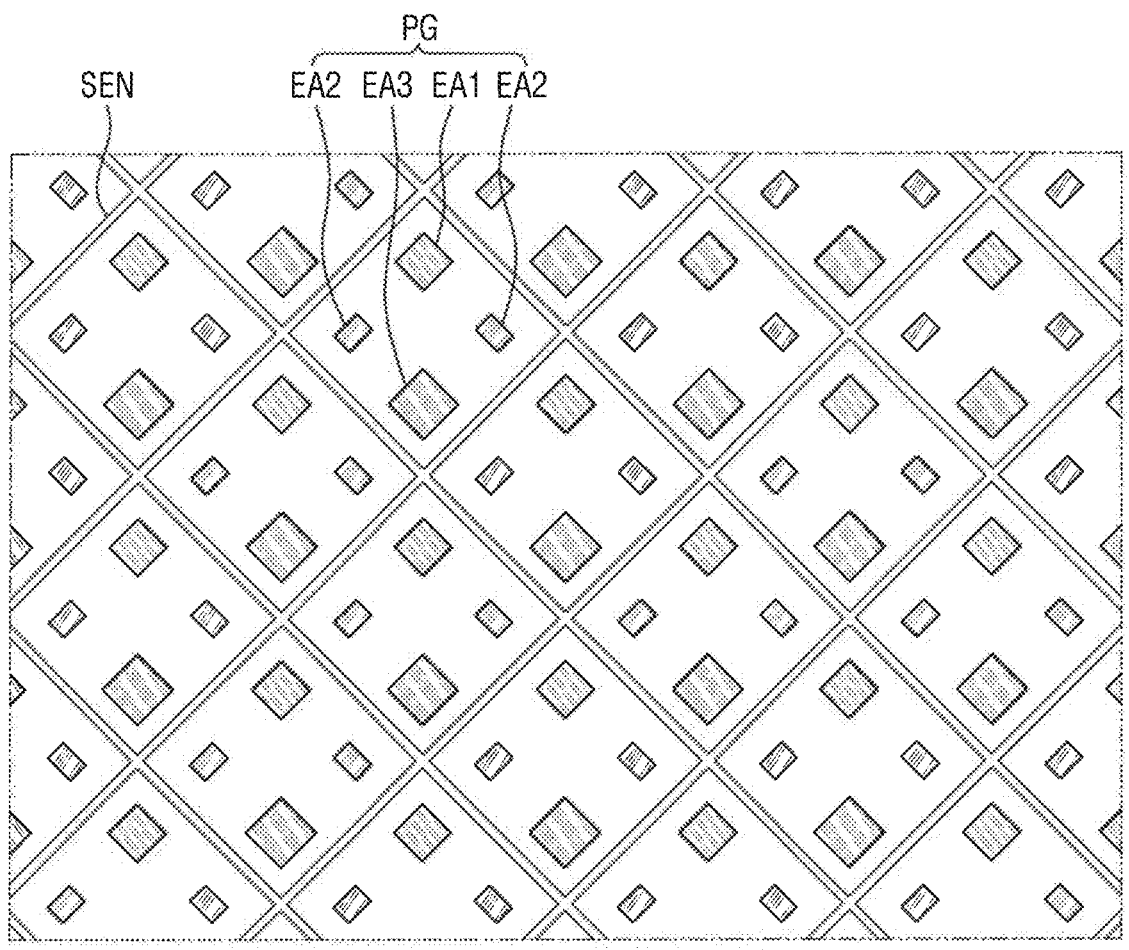
FIG. 8 is an enlarged plan view of another part of the display device of FIG. 1.
Figure 8:
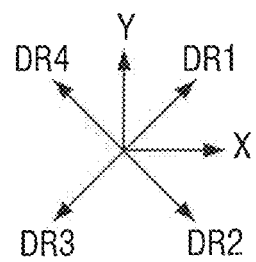

FIG. 8 is an enlarged plan view of another part of the display device of FIG. 1. The embodiment of FIG. 8 differs from the embodiment of FIG. 6 in the configuration of a s plurality of touch electrodes. Descriptions of elements or features that have already been described above may be omitted or simplified.

Referring to FIG. 8, the touch sensor area TSA may include a plurality of touch electrodes SEN and a plurality of dummy electrodes DME. The touch electrodes SEN may form mutual capacitances or self-capacitances to detect a touch input from an object or a person. The touch electrodes SEN may include a plurality of driving electrodes TE and a plurality of sensing electrodes RE.

The driving electrodes TE, the sensing electrodes RE, and a plurality of dummy electrodes DME may be formed in a mesh or fishnet shape in a plan view. The driving electrodes TE, the sensing electrodes RE, and the dummy electrodes DME may surround a is plurality of emission areas in a plan view. In one example, the driving electrodes TE, the sensing electrodes RE, and the dummy electrodes DME may surround a plurality of emission areas (EA1, EA2, and EA3) of each pixel group PG, e.g., a first emission area EA1, second emission areas EA2, and a third emission area EA3, in a plan view. Thus, the driving electrodes TE, the sensing electrodes RE, and the dummy electrodes DME may not overlap with the first emission areas EA1, the second emission areas EA2, and the third emission areas EA3. Accordingly, the display device 10 can prevent the luminance of light emitted from the first emission areas EA1, the second emission areas EA2, and the third. emission areas EA3 from being lowered by the touch sensing unit TSU.

Figure 9:
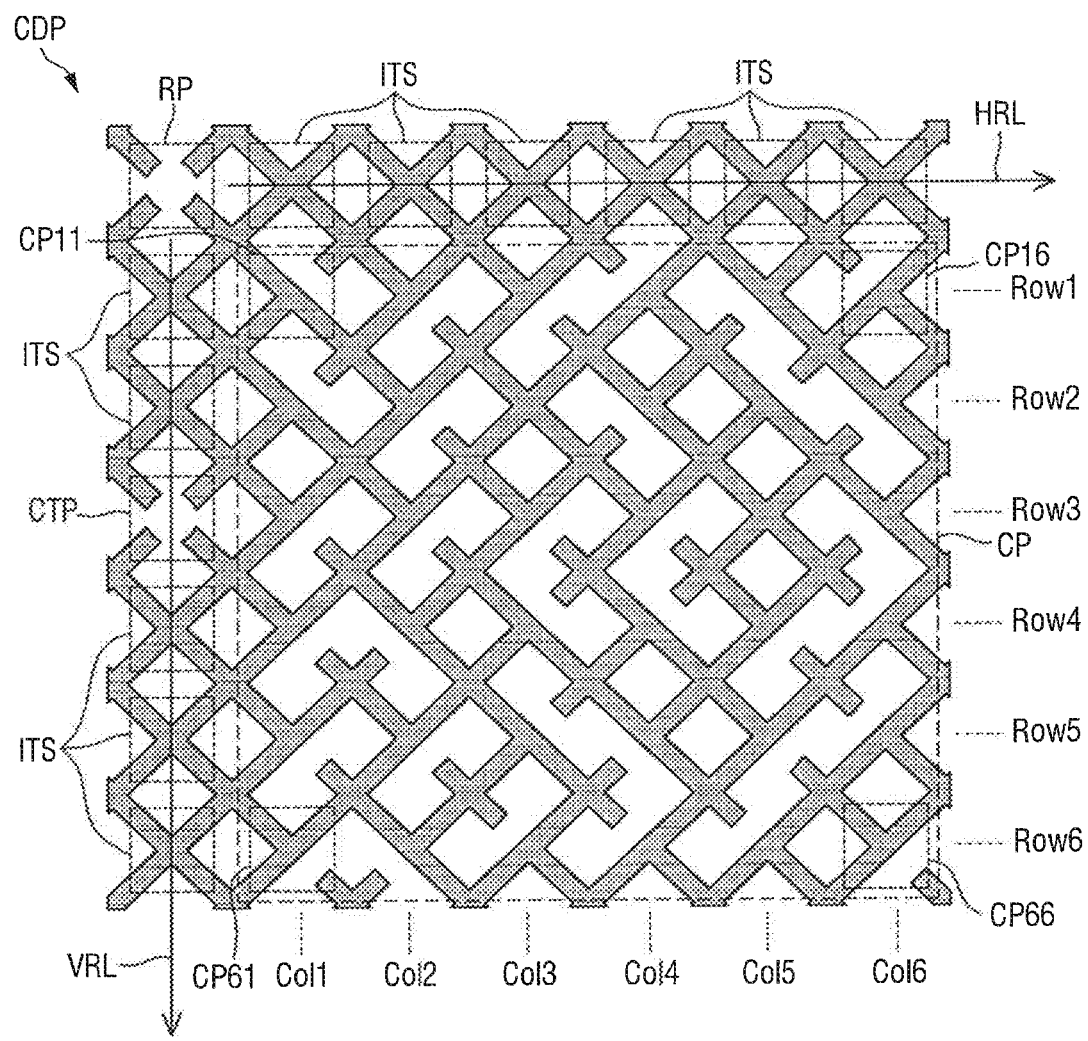
FIG. 9 is a plan view of a code pattern part of the display device of FIG. 1.

FIG. 9 is a plan view of a code pattern part of the display device of FIG. 1, and FIG. 10 is a table showing data codes corresponding to the code pattern part of FIG. 9.

Referring to FIGS. 9 and 10, a plurality of touch electrodes SEN may be formed in a mesh or fishnet shape in a plan view. The minimum unit sides of each of the touch electrodes SEN may extend in the first and second directions DR1 and DR2 to intersect one another. At least some of the touch electrodes SEN may include a code pattern part CDP. At least some of a plurality of driving electrodes TE or at least some of a plurality of sensing electrodes RE may include a code pattern part CDP.

A code pattern part CDP may include a reference point RP, a first reference line HRL, a second reference line VRL, and a plurality of code patterns CP.

The reference point RP may be used to identify the code pattern part CDP. In one example, the reference point RP may be a cutout at an intersection between at least some of the touch electrodes SEN. In one example, the reference point RP may be disposed in an upper left part of the code pattern part CDP, but the present disclosure is not limited thereto. For example, the reference point RP may be disposed at any edge of the code pattern part CDP.

The first reference line may extend from the reference point RP in the X-axis is direction. The first reference line HRL may be formed by connecting a plurality of intersection points ITS that are arranged in the X-axis direction with respect to the reference point RP. In one example, in a case where the first reference line HRL is formed by connecting six intersection points ITS, the code patterns CDP may be arranged in six columns including the six intersection points ITS. This case is shown in the example of FIG. 9.

The second reference line VRL may extend from the reference point RP in the Y-axis direction. The second reference line VRL may be formed by connecting a plurality of intersection points ITS that are arranged in the Y-axis direction with respect to the reference point RP and a cutout part CTP disposed between the intersection points ITS. In one example, in a case where the second reference line VRL is formed by connecting two intersection points ITS, one cutout part CTP, and three intersection points ITS, the code patterns CDP may be arranged in six rows including the five intersection points ITS and the cutout part CTP. This is the case shown in FIG. 9.

The code patterns CP may be disposed in an area formed by the first and second reference lines HRL and VRL. The slope or the rotation angle of the code patterns CP with respect to a camera may be determined based on the first and second reference lines HRL and VRL. In one example, in a case where the first reference line HRL is fomied by connecting six intersection points ITS and the second reference line VRL is formed by connecting two intersection points ITS, one cutout part CTP, and three intersection points ITS, the code patterns CP may be arranged in a 6×6 matrix.

Each of the code patterns CP may be cut in accordance with a predetermined set of criteria and may thus have location information. The code patterns CP may correspond to data codes DC. In one example, each of the code patterns CP may be obtained by cutting one of a plurality of stems extended from a corresponding intersection between at least some of the touch electrodes SEN. A plurality of stems may extend from an intersection between at least some of the touch electrodes SEN in the first, second, third, and fourth directions DR1, DR2, DR3, and DR4, and one of the plurality of sterns may be cut. The direction corresponding to the cut stern may correspond to a predefined data code DC that forms location information. In one example, a code pattern CP in an m-th row (where in is a natural number) and an n-th column (where n is a natural number) of the code pattern part CDP may correspond to a data code DC in an m-th row and an n-th column of the table of FIG. 10.

In other words, an individual code pattern CP is formed by removing a portion of its touch electrode SEN. The area where the portion of the touch electrode SEN has been removed may correspond to a particular data code. For example, when the touch electrode SEN is not present in a first area, the code pattern CP may correspond to first data and when the touch electrode SEN is not present in a second area, the code pattern CP may correspond to second data.

In one example, a code pattern CP having a stem in the first direction DR1 cut may correspond to a data code DC of [00], a code pattern CP having a stern in the second direction DR2 cut may correspond to a data code DC of [01], a code pattern CP having a stem in the third direction DR3 cut may correspond to a data code DC of [10], and a code pattern CP having a stem in the fourth direction DR4 cut may correspond to a data code DC of [11]. A code pattern CP having no cut, may be null.

Code pattern 11 "CP11" in a first row Row1 and a first column Col1 may have a stem in the first direction DR1 cut, and data code 11 "DC11" may have a value of [00]. Code pattern 61 "CP61" in a sixth row Row6 and the first column Col1 may have a stem in the second direction DR2 cut, and data code 64 "DC61" may have a value of [01]. Code pattern 66 "CP62" in the sixth row Row6 and a sixth column Col6 may have a stem in the second direction DR2 cut, and data code 66 "DC66" may have a value of [01]. Code pattern 16 "CP16" in the first row Row1 and the sixth column Col6 may have a stem in the fourth direction DR4 cut, and data code 16 "DC16" may have a value of [11].

The code patterns CP may further include an uncut pattern having none of the stems extended from a corresponding intersection between the touch electrodes SEN cut. The uncut pattern may not have a data code value (e.g., Null). The uncut pattern may be disposed at any location to allow the touch electrodes SEN to perform a touch operation properly. As the code patterns CP include the uncut pattern, the deterioration of the touch electrodes SEN can be prevented. In one example, code pattern 23 "CP23" in a second row Row2 and a third column Col3 may correspond to an uncut pattern, and data code 23 "DC23" may not have any value ("Null").

As the display device 10 includes a plurality of code patterns CP provided in at least some of the touch electrodes SEN, a touch input can be received from a touch input device such as a smart pen. Each of the code patterns CP may be cut in accordance with a predetermined set of criteria to have location information and may correspond one-to-one to a predefined data code DC. Thus, since the display device 10 can receive coordinate data generated using data codes DC, without requiring a complicated computation/correction process, the display device 10 can reduce cost arid power consumption and can simplify a driving process thereof. In addition, since the display device 10 includes a plurality of code patterns CP provided in at least some of the touch electrodes SEN, the display device 10 can be applied to nearly all types of electronic devices having a touch function without any size limitations.

An embodiment of the disclosure provides a display device including: a display unit DU including a plurality of emission areas EA which emit light; and a plurality of touch electrodes SEN disposed on the display unit DU to detect a touch input, wherein at least some of the touch electrodes SEN include a code pattern part CDP including a plurality of code patterns CP that include cutouts corresponding to location information.

Figure 11:
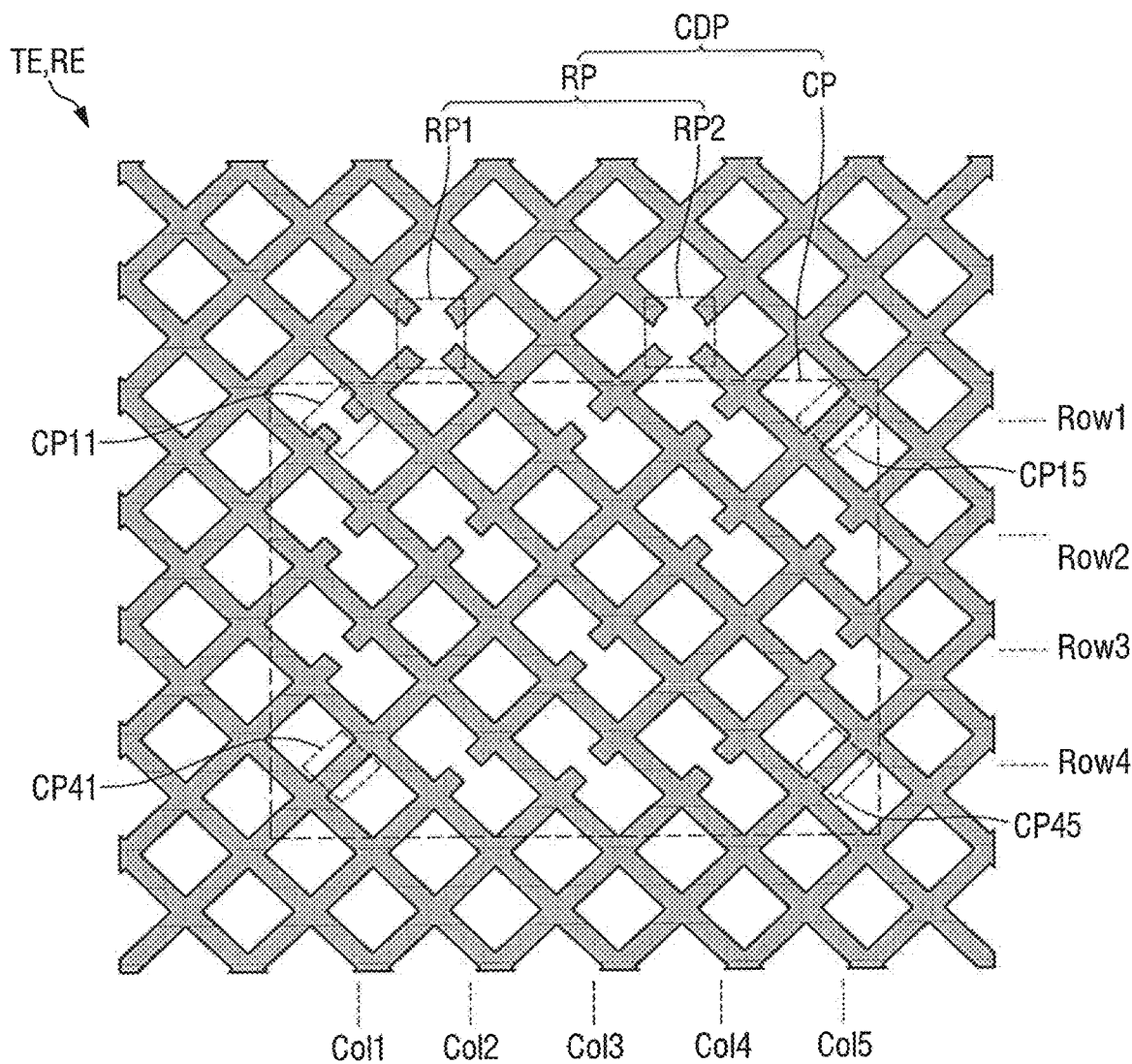
FIG. 11 is a plan view of another code pattern part of the display device of FIG. 1.

FIG. 11 is a plan view of another code pattern part of the display device of FIG. 1, and FIG. 12 is a table showing data codes corresponding to the code pattern part of FIG. 11.

Referring to FIGS. 11 and 12, a plurality of touch electrodes SEN may be formed in a mesh or fishnet shape in a plan view. The minimum unit sides of each of the touch electrodes SEN may extend in the first and second directions DR1 and DR2 to intersect one another. At least some of the touch electrodes SEN may include a code pattern part CDP. At least some of a plurality of driving electrodes TE or at least some of a plurality of sensing electrodes RE may include a code pattern part CDP.

A code pattern part CDP may include reference points RP and a plurality of code patterns CP.

The reference points RP may be a criterion for the identification of the code pattern part CDP. In other words, the reference points RP may identify the location of the code pattern part CDP. In one example, the reference points RP may be cutouts at intersections between at least some of the touch electrodes SEN. The reference points RP may include first and second reference points RP1 and RP2. In one example, the first and second reference points RP1 and RP2 may be disposed above the code patterns CP to be spaced apart from each other, but the present disclosure is not limited thereto. For example, the first and second reference points RP1 may be disposed at opposite sides of the code patterns CP.

The code patterns CP may be disposed in an area defined by the first and second reference points RP1 and RP2. The slope or the rotation angle of the code patterns CP with respect to a camera may be determined based on the first and second reference lines HRL and VRL. In one example, in a case where the first and second reference points RP1 and RP2 are spaced apart from each other in a particular row, the code patterns CP may be arranged in rows subsequent to the particular row in an m×n matrix.

Each of the code patterns CP may be cut in accordance with a predetermined set of criteria and may thus have location information. The code patterns CP may correspond to data codes DC. In one example, the code patterns CP may include sides that are not cut and sides that are cut, among a plurality of sides that form the mesh shape of the code pattern part CDP together. For example, a first code pattern CP may have a space between two stems and a second code pattern CP may be a continuous stem. Here, each of the code patterns CP may have a side thereof cut in the middle, but the location where the side of each of the code patterns CP is cut is not particularly limited. Whether the side of each of the code patterns CP is cut may correspond to a data code DC. In one example, a code pattern CP in an m-th row and an n-th column of the code pattern part CDP may correspond to a data code DC in an m-th row and an n-th column of the table of FIG. 12.

In one example, a code pattern CP having a side not cut may correspond to a data code DC of [0], and a code pattern CP having a side cut may correspond to a data code DC of [1].

Code pattern 11 "CP11" in a first row Row1 and a first column Col1 may have a side cut, and data code 11 "DC11" may have a value of [1]. Code pattern 45 "CP45" in a fourth row Row4 and a fifth column Col5 may have no cut, and data code 45 "DC45" may have a value of [0].

Data codes DC in some rows of the table of FIG. 12 may form first data Data1 of coordinate data, and data codes DC in the other rows may form second data Data2 of the coordinate data. In one example, the first data Data1 may correspond to the X-axis coordinate of a touch location, and the second data Data2 may correspond to the Y-axis coordinate of the touch location. However, the present disclosure is not limited to this example.

In one example, data codes DC in first and second rows Row1 and Row2 of the table of FIG. 12 may form the first data Data1, and data codes in third and fourth rows Row3 and Row4 of the table of FIG. 12 may form the second data Data2. Thus, the code patterns CP can be converted into data codes DC, and coordinate data can be quickly generated based on the data codes DC, without using a complicated computation/correction process.

As the display device 10 includes a plurality of code patterns CP provided in some of the touch electrodes SEN, a touch input can be received from a touch input device such as a smart pen. Each of the code patterns CP may be cut in accordance with a predetermined set of criteria to have location information and may correspond one-to-one to a predefined data code DC. Thus, since the display device 10 can receive coordinate data generated using data codes DC, without using a complicated computation/correction process, the display device 10 can reduce cost and power consumption and can simplify a driving process thereof. In addition, since the display device 10 includes a plurality of code patterns CP provided in at least some of the touch electrodes SEN, the display device 10 can be applied to nearly all types of electronic devices having a touch function without any size limitations.

Figure 13:
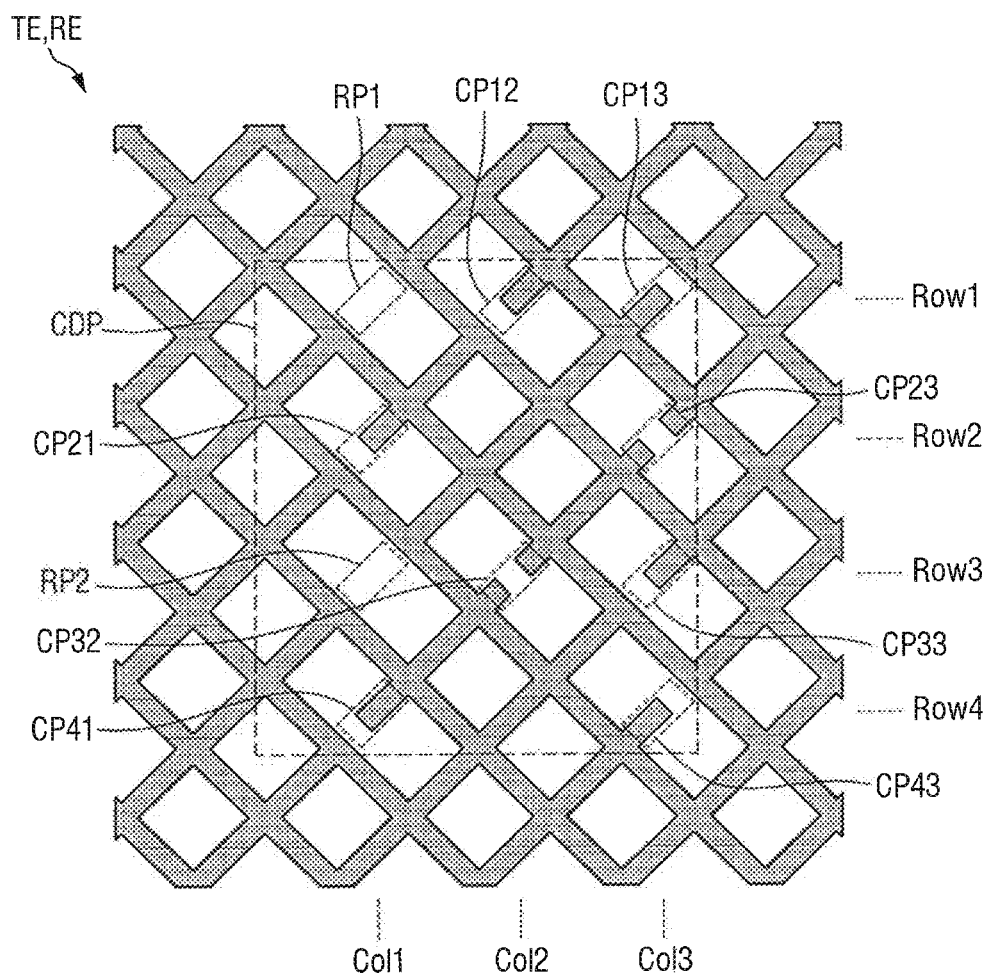
FIG. 13 is a plan view of another code pattern part of the display device of FIG. 1.
Figure 13:
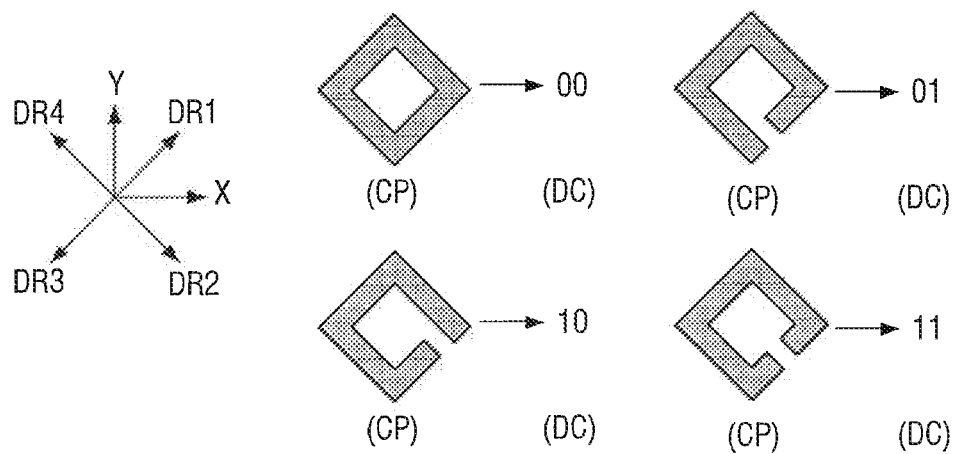

FIG. 13 is a plan view of another code pattern part of the display device of FIG. 1, and FIG. 14 is a table showing data codes corresponding to the code pattern part of FIG. 13.

Referring to FIGS. 13 and 14, a plurality of touch electrodes SEN may be formed in a mesh or fishnet shape in a plan view. The minimum unit sides of each of the touch electrodes SEN may extend in the first and second directions DR1 and DR2 to intersect one another. At least some of the touch electrodes SEN may include a code pattern part CDP. At least some of a plurality of driving electrodes TE or at least some of a plurality of sensing electrodes RE may include a code pattern part CDP.

A code pattern part CDP may include reference points RP and a plurality of code patterns CP.

The reference points RP may be a criterion for the identification of the code pattern part CDP. In one example, the reference points RP may correspond to sides of the touch electrodes SEN that are completely cut out, among a plurality of sides that form a mesh shape together. The reference points RP may include first and second reference points RP1 and RP2. The first and second reference points RP1 and RP2 may be arranged in rows and columns where the code patterns CP are arranged. In other words, the first and second reference points RP1 and RP2 may be disposed on the code pattern part CDP. In one example, in a case where the code pattern part CDP is arranged in a 4×3 matrix, the first reference point RP1 may be arranged in a first row Row1 and a first column Col1, the second reference point RP2 may be arranged in a third row Row3 and the first column Col1, and the code patterns Cp may be arranged in other rows and other columns. However, the present disclosure is not limited to this example.

The code patterns CP may be disposed in an area defined by the first and second reference points RP1 and RP2. The slope or the rotation angle of the code patterns CP with respect to a camera may be determined based on the first and second reference lines HRL and VRL.

Each of the code patterns CP may be cut in accordance with a predetermined set of criteria and may thus have location information. The code patterns CP may correspond to data codes DC. In one example, each of the code patterns CP may have a particular part of a side thereof cut. The locations where sides of the code patterns CP are cut may correspond to data codes DC that form location information. In other words, a cutout in a code pattern CP may correspond to a particular data code DC and that particular data code DC may correspond to a particular location coordinate. In one example, a code pattern CP in an m-th row and an n-th column of the code pattern part CDP may correspond to a data code DC in an m-th row and an n-th column of the table of FIG. 14.

In one example, a code pattern CP having no cutout may correspond to a data code DC of [00], a code pattern CP having a cutout in a lower part of a side thereof in the first direction DR1 may correspond to a data code DC of [01], a code pattern CP having a cutout in an upper part of a side thereof in the first direction DR1 may correspond to a data code DC of [10], and a code pattern CP having a cutout in the middle of a side thereof in the first direction DR1 may correspond to a data code DC of [11].

Code pattern 22 "CP22" in a second row Row2 and a second column Col2 may not have any cutout, and data code 22 "DC22" may have a value of [00]. Code pattern 12 "CP12" in a first row Row1 and the second column Col2 may have a cutout in the lower part of a side thereof, and data code 12 "DC12" may have a value of [01]. Code pattern 13 "CP13" in the first row Row1 and a third column Col3 may have a cutout in the upper part of a side thereof, and data code 13 "DC13" may have a value of [10]. Code pattern 23 "CP23" in the second row Row2 and the third column Col3 may have a cutout in the middle part of a side thereof, and data code 23 "DC23" may have a value of [11].

Data codes DC in some rows of the table of FIG. 14 may form first data Data1 of coordinate data, and data codes DC in the other rows may form second data Data2 of the coordinate data. In one example, the first data Data1 may correspond to the X-axis coordinate of a touch location, and the second data Data2 may correspond to the Y-axis coordinate of the touch location. However, the present disclosure is not limited to this example.

In one example, data codes DC in first and second rows Row1 and Row2 of the table of FIG. 14 may form the first data Data1, and data codes in third and fourth rows Row3 and Row4 of the table of FIG. 14 may form the second data Data2. Thus, the code patterns CP can be converted into data codes DC, and coordinate data can be quickly generated based on the data codes DC, without a complicated computationlcorrection process.

Since the display device 10 includes a plurality of code patterns CP provided in some of the touch electrodes SEN, a touch input can be received from a touch input device such as a smart pen. Each of the code patterns CP may be cut in accordance with a predetermined set of criteria to have location information and may correspond one-to-one to a predefined data is code DC. Thus, since the display device 10 can receive coordinate data generated using data codes DC, without using a complicated computationkonection process, the display device 10 can reduce cost and power consumption and can simplify a driving process thereof. In addition, since the display device 10 includes a plurality of code patterns CP provided in at least some of the touch electrodes SEN, the display device 10 can be applied to nearly all types of electronic devices having a touch function without any size limitations.

Figure 15:
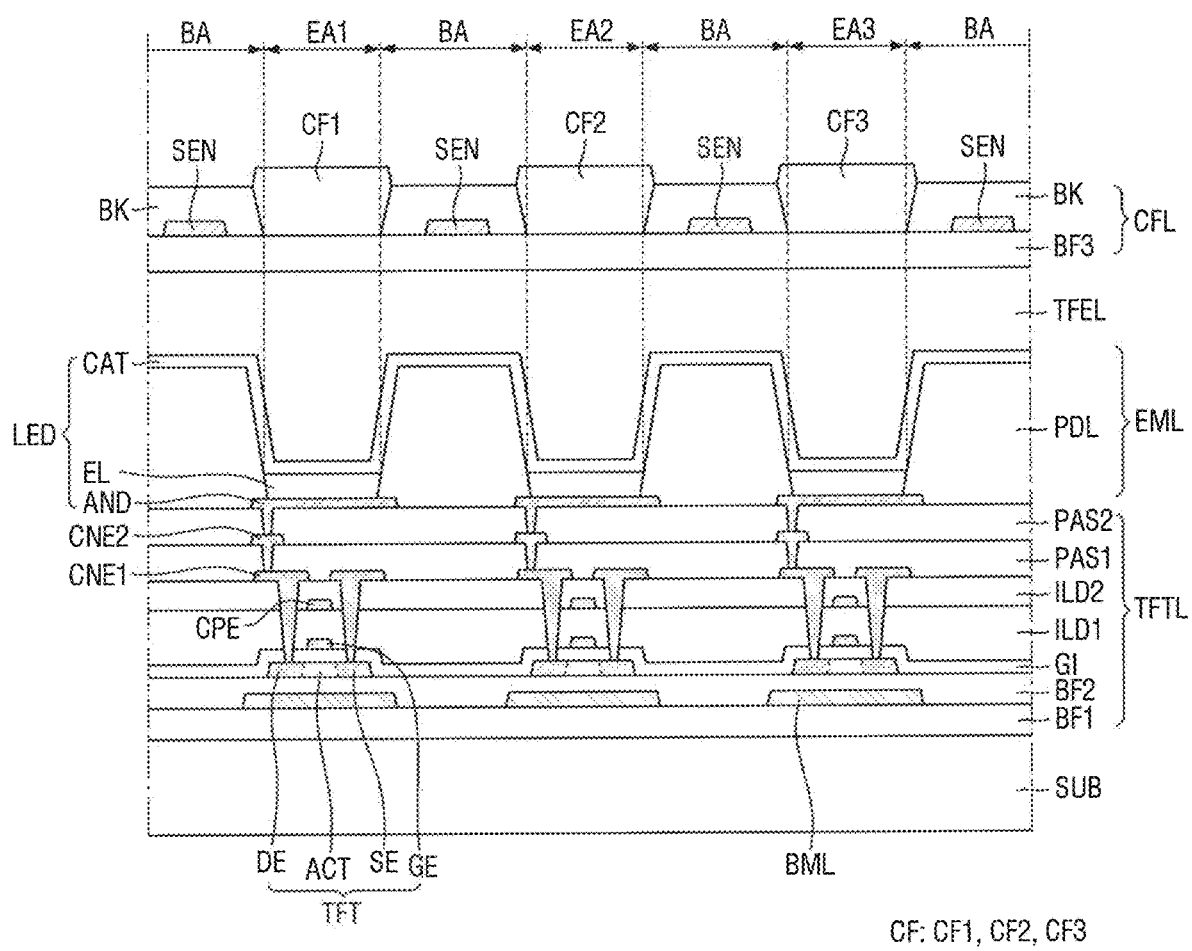
FIG. 15 is a cross-sectional view of a display device according to another embodiment of the present disclosure.

FIG. 15 is a cross-sectional view of a display device according to another embodiment of the present disclosure. The display device of FIG. 15 differs from the display device of FIG. 7 in the elements above an encapsulation layer and thus will hereinafter be described, focusing mainly on the differences with the display device of FIG. 7.

Referring to FIG. 15, a display panel 100 may include a substrate SUB, a TFT layer TFTL, a light-emitting element layer EML, an encapsulation layer TFEL, and a color filter layer CFL.

The substrate SUB may be a base substrate or a base member. In one example, the substrate SUB may include a glass material or a metallic material. In another example, the substrate SUB may include a polymer resin such as PI.

The TFT layer TFTL may be disposed on the substrate SUB. The TFT layer TFTL may include a first buffer layer BF1, a light-blocking layer BML, a second buffer layer BF2, TFTs "TFT", a gate insulating film GI, a first interlayer insulating film ILD1, capacitor electrodes CPE, a second interlayer insulating film ILD2, first connecting electrodes CNE1, a first passivation layer PAS1, second connecting electrodes CNE2, and a second passivation layer PAS2.

The light-emitting element layer EML may be disposed on the TFT layer TFTL. The light-emitting element layer EML may include light-emitting elements LED and a pixel-defining film PDL. The light-emitting elements LED may include pixel electrodes AND, emission layers EL, and a common electrode CAT.

The encapsulation layer TFEL may be disposed on the common electrode CAT and may cover the light-emitting elements LED.

The color filter layer CFL may be disposed on the encapsulation layer TFEL. The color filter layer CFL may be in direct contact with the encapsulation layer TFEL. The color filter layer CFL may include a third buffer layer BF3, a plurality of color filters CF, a light-blocking part BK, and a plurality of touch electrodes SEN.

The third buffer layer BF3 may be disposed on the encapsulation layer TFEL. The third buffer layer BF3 may have insulating and optical functions. The third buffer layer BF3 may include at least one inorganic film. Optionally, the third buffer layer BF3 may not be provided.

A plurality of color filters CF may include first, second, and third color filters CF1, CF2, and CF3. The first, second, and third color filters CF1, CF2, and CF3 may be disposed on the third buffer layer BF3 to correspond to first, second, and third emission areas EA1, EA2, and EA3, respectively. In other words, the first, second and third color filters CF1, CF2 and CF3 may overlap the first, second, and third emission areas EA1, EA2, and EA3, respectively.

The first color filter CF1 may be disposed in the first emission area EA1, on the third buffer layer BF3. The first color filer CF1 may be surrounded by the light-blocking part BK. The first color filter CF1 may selectively transmit light of a first color (e.g., red light) therethrough and may block or absorb light of a second color (e.g., green light) and light of a third color (e.g., blue light). In one example, the first color filter CF1 may be a red filter and may include a red colorant.

The second color filter CF2 may be disposed in the second emission area EA2, on is the third buffer layer BF3. The second color filter CF2 may be surrounded by the light-blocking part BK. The second color filter CF2 may selectively transmit light of the second color (e.g., green light) therethrough and may block or absorb light of the first color (e.g., red light) and light of the third color (e.g., blue light). In one example, the second color filter CF2 may be a green filter and may include a green colorant.

The third color filter CF3 may be disposed in the third emission area EA3, on the third buffer layer BF3. The third color filter CF3 may be surrounded by the light-blocking part BK. The third color filter CF3 may selectively transmit light of the third color (e.g., blue light) therethrough and may block or absorb light of the first color (e.g., red light) and light of the second color (e.g., green light). In one example, the third color filter CF3 may be a blue filter and may include a blue colorant.

The first, second, and third color filters CF1, CF2, and CF3 may reduce the reflection of external light by absorbing some of the external light. Thus, the first, second, and third color filters CF1, CF2, and CF3 can prevent the distortion of colors by the reflection of external light.

Since the color filter layer CFL is disposed directly on the encapsulation layer TFEL, the display device 10 may not need a separate substrate for the color filter layer CFL. Thus, the thickness of the display device 10 can be reduced.

The light-blocking part BK may be disposed on the encapsulation layer TFEL, in light-blocking areas BA. The light-blocking part BK may overlap the pixel-defining film PDL in a thickness direction. The light-blocking part BK may block visible light and may transmit infrared (IR) light or ultraviolet (UV) light therethrough. The light-blocking part BK. may improve the color reproducibility of the display device 10 by preventing visible light from infiltrating between the first, second, and third emission areas EA1, EA2, and EA3 to cause color mixing. The light-blocking part BK may be arranged in a lattice form in a plan view to surround the first, second, and third emission areas EA1, EA2, and EA3.

In one example, the light-blocking part BK may include an organic black pigment. The organic black pigment may include Lactam Black, Perylene Black, or Aniline Black, preferably, Lactam Black.

The touch electrodes SEN may be disposed in the light-blocking areas BA, on the encapsulation layer TFEL, and may be covered by the light-blocking part BK. The touch electrode SEN may be in direct contact with the encapsulation layer TFEL. Thus, the touch electrodes SEN may not need a separate touch sensor layer and may be disposed in the color filter layer CFL. The touch electrodes SEN may include an infrared (IR) reflective material or an ultraviolet (UV) reflective material. Thus, the touch electrodes SEN may reflect IR light or UV light transmitted through the light-blocking part BK. At least some of the touch electrodes SEN may include a code pattern part CDP. An image of the code pattern part CDP may be captured with IR light or UV light.

Figure 16:
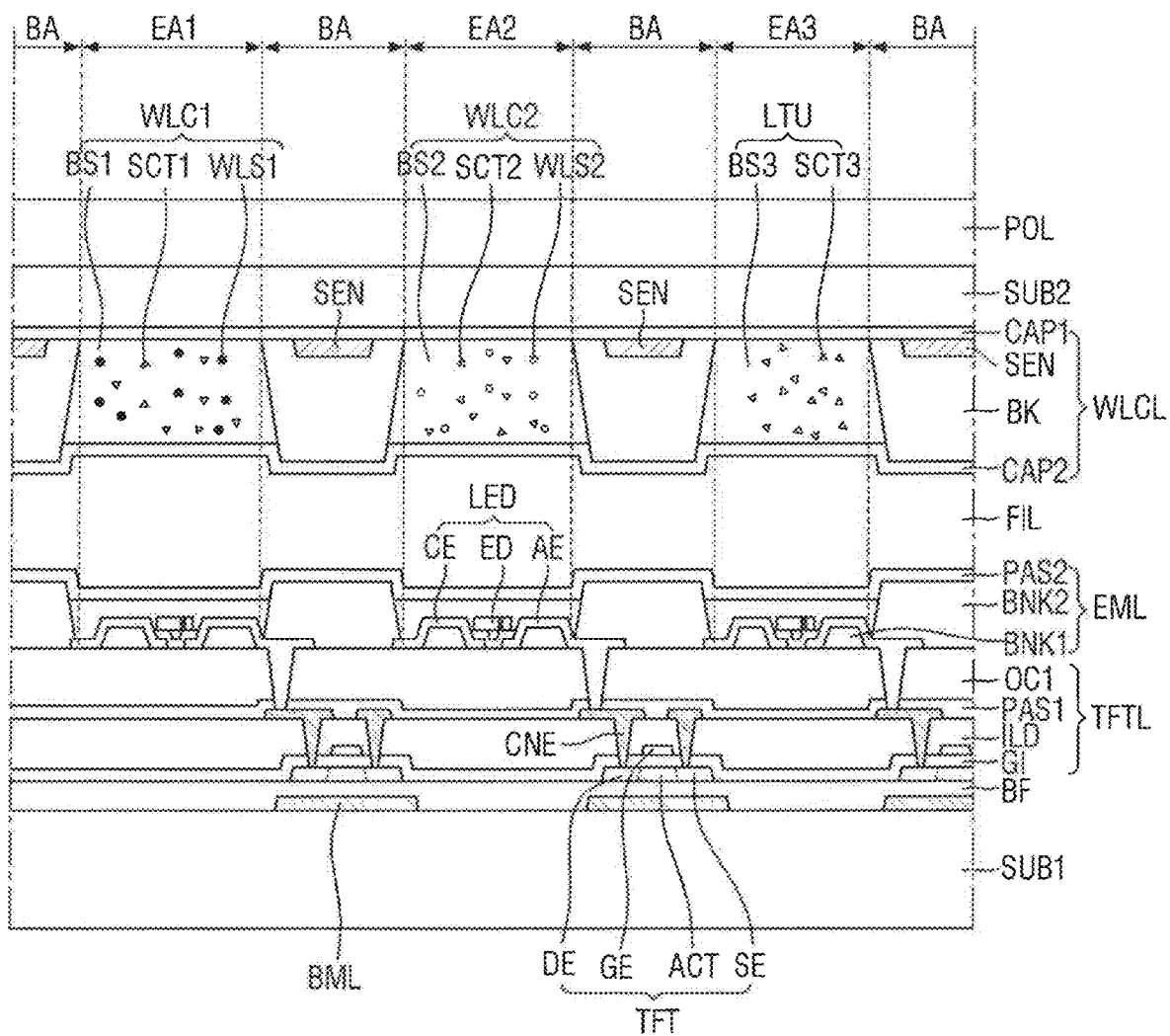
FIG. 16 is a cross-sectional view of a display device according to another embodiment of the present disclosure.

FIG. 16 is a cross-sectional view of a display device according to another embodiment of the present disclosure. The display device of FIG. 16 differs from the display device of FIG. 7 in the configuration of a light-emitting element layer EML and the presence of a wavelength conversion layer WLCL and thus will hereinafter be described, focusing mainly on the differences with the display device of FIG. 7.

Referring to FIG. 16, a display panel 100 may include a first substrate SUB1, a TFT layer TFTL, a light-emitting element layer EML, a filler layer FIL, a wavelength conversion layer WLCL, a second substrate SUB2, and a polarizing film POL.

The first substrate SUB1 may be a base substrate or a base member. In one example, the first substrate SUB1 may include a glass material or a metallic material. In another example, the first substrate SUB1 may include a polymer resin such as PI.

The TFT layer TFTL may be disposed on the first substrate SUB1. The TFT layer TFTL may include a buffer layer BF, a light-blocking layer BML, TFTs "TFT", a gate insulating film GI, an interlayer insulating film ILD, connecting electrodes CNE, a first passivation layer PAS1, and a first planarization layer OC1.

The light-emitting element layer EML may be disposed on the TFT layer TFTL. The light-emitting element layer EML may include light-emitting elements LED, first banks BNK1, a second bank BNK2, and a second passivation layer PAS2.

The light-emitting elements LED may be disposed on the TFT layer TFTL. The light-emitting elements LED may include first electrodes AE, second electrodes CE, and light-emitting diodes (LEDs) ED.

The first electrodes AE may be disposed on the first planarization layer OC1. In one example, the first electrodes AE may cover the first banks BNK1 on the first planarization layer OC1. The first electrodes AE may overlap with one of first, second, and third emission areas EA1, EA2, and EA3, which are defined by the second bank BNK2. The first electrodes AE may be connected to drain electrodes DE of the TFTs "TFT" through connecting electrodes CNE. The first electrodes AE may be the anodes of the light-emitting elements LED, but the present disclosure is not limited thereto.

The second electrodes CE may be disposed on the first planarization layer OC1 to he spaced apart from the first electrodes AE. In one example, the second electrodes CE may cover the first banks BNK1 on the first planarization layer OC1. The second electrodes CE may overlap with one of first, second, and third emission areas EA1, EA2, and EA3, which are defined by the second bank BNK2. In one example, the second electrodes CE may receive low-potential voltages provided from low-potential lines to all pixels. The second electrodes CE may be the cathodes of the light-emitting elements LED, but the present disclosure is not limited thereto.

The LEDs ED may be disposed on the first planarization layer OC1, between the first electrodes AE and the second electrodes CE. First ends of the LEDs ED may be connected to the first electrodes AE, and second ends of the LEDs ED may be connected to the second electrodes CE. The LEDs ED may have a size of several micrometers or nanometers and may be inorganic LEDs including an inorganic material. The inorganic LEDs may be aligned between two opposing electrodes in accordance with an electric field formed between the two opposing electrodes in a particular direction.

In one example, the LEDs ED may include active layers that include the same material and may thus emit light of the same wavelength range or the same color. Beams of light emitted from the first, second, and third emission areas EA1, EA2, and EA3 may all have the same color. In one example, the LEDs ED may emit light of the third color or blue light having a peak wavelength of 440 nm to 480 nm. Thus, the light-emitting element layer EML can emit light of the third color or blue light.

The second bank BNK2 may be disposed in light-blocking areas BA, on the first planarization layer OC1. The second bank BNK2 may define the first, second, and third emission areas EA1, EA2, and EA3. In one example, the second bank BNK2 may surround each of the first, second, and third emission areas EA1, EA2, and EA3, but the present disclosure is not limited thereto. The second bank BNK2 may isolate and insulate the first electrodes AE or the second electrodes CE of the light-emitting elements LED from one another.

The second passivation layer PAS2 may be disposed on the light-emitting elements LED and the second bank BNK2. The second passivation layer PAS2 may cover and protect the light-emitting elements LED. The second passivation layer PAS2 may prevent damage to the light-emitting elements LED by preventing the infiltration of impurities such as moisture or the air from the outside.

The filler layer FIL may fill the space between the light-emitting element layer EML and the wavelength conversion layer WLCL and may be surrounded by a sealing member. In one example, the filler layer FIL may be formed of an organic material and may transmit light therethrough. The filler layer FIL may be formed of a silicone-based organic material or an epoxy-based organic material, but the present disclosure is not limited thereto. Optionally, the filler layer FIL may not be provided.

The wavelength conversion layer WLCL may include a second capping layer CAP2, a light-blocking part BK, a plurality of touch electrodes SEN, a first wavelength conversion part WLC1, a second wavelength conversion part WLC2, a light-transmitting part LTU, and a first capping layer CAP1.

The second capping layer CAP2 may be disposed on the filler layer FIL. The second capping layer CAP2 may be continuously formed on the filler layer FIL. The second capping layer CAP2 may cover the bottom surfaces of the first and second wavelength conversion parts WLC1 and WLC2, the light-transmitting part LTU, and the light-blocking part BK. In one example, the second capping layer CAP2 may seal the first and second wavelength conversion parts WLC1 and WLC2 and the light-transmitting part LTU and may thereby prevent the first and second wavelength conversion parts WLC1 and WLC2 and the light-transmitting part LTU from being damaged or polluted. In one example, the second capping layer CAP2 may include an inorganic material.

The light-blocking part BK may be disposed in the light-blocking areas BA, on the second capping layer CAP2. The light-blocking part BK may overlap with the second bank BNK2 in a thickness direction. The light-blocking part BK may sunround the first and second wavelength conversion parts WLC1 and WLC2 and the light-transmitting part LTU in a plan view. The light-blocking part BK may block the transmission of light. The light-blocking part BK may improve the color reproducibility of a display device 10 by preventing light from infiltrating between the first, second, and third emission areas EA1, EA2, and EA3 to cause color is mixing. The light-blocking part BK may be arranged in a lattice form in a plan view to surround the first, second, and third emission areas EA1, EA2, and EA3.

The touch electrodes SEN may be disposed on a surface of the first capping layer CAP1 that faces the first substrate SUB1. In other words, the touch electrodes SEN may be disposed on a bottom surface of the first capping layer CAP1. The touch electrodes SEN may be disposed in the light-blocking areas BA, on the bottom surface of the first capping layer CAP1, and may be covered by the light-blocking part BK. In other words, the touch electrodes SEN may be disposed between the bottom surface of the first capping layer CAP1 and the light-blocking part BK. Thus, the touch electrodes SEN may not need a separate touch sensor layer and may be disposed in the wavelength conversion layer WLCL. At least some of the touch electrodes SEN may include a code pattern part CDP.

The first wavelength conversion part WLC1 may be disposed in the first emission area EA1, on the second capping layer CAP2. The first wavelength conversion part WLC1 may be surrounded by the light-blocking part BK. For example, the light-blocking part BK may be disposed on opposite sides of the first wavelength conversion part WLC1 in a first direction. The first wavelength conversion part WLC1 may include a first base resin BS1, a first scatterer SCT1, and a first wavelength shifter WLS1.

The first base resin BS1 may include a material having a relatively high light transmittance. The first base resin BS1 may be formed of a transparent organic material.

The first scatterer SCT1 may have a different refractive index from the first base to resin BS1 and may form an optical interface with the first base resin BS1. In one example, the first scatterer SCT1 may include a light-scattering material or light-scattering particles capable of scattering at least some light. The first scatterer SCT1 may scatter incident light in random directions, regardless of the incidence angle of the incident light, substantially without changing the peak wavelength of the incident light.

The first wavelength shifter WLS1 may convert or shift the peak wavelength of incident light into a first peak wavelength. In one example, the first wavelength shifter WLS1 may convert blue light provided by the display device 10 into red light having a single peak wavelength of 610 nm to 650 nm and may emit the red light.

The second wavelength conversion part WLC2 may be disposed in the second emission area EA2, on the second capping layer CAP2. The second wavelength conversion part WLC2 may be surrounded by the light-blocking part BK. The second wavelength conversion part WLC2 may include a second base resin BS2, a second scatterer SCT2, and a second wavelength shifter WLS2. Like the first wavelength conversion part WLC1, the second wavelength conversion part WLC2 may be sandwiched between the first and second capping layers CAP1 and CAP2.

The second base resin BS2 may include a material having a relatively high light transmittance. The second base resin BS2 may be formed of a transparent organic material.

The second scatterer SCT2 may have a different refractive index from the second base resin BS2 and may form an optical interface with the second base resin BS2. In one example, the second scatterer SCT2 may include a light-scattering material or light-scattering particles capable of scattering at least some light. The second scatterer SCT2 may scatter incident light in random directions, regardless of the incidence angle of the incident light, substantially without changing the peak wavelength of the incident light.

The second wavelength shifter WLS2 may convert or shift the peak wavelength of incident light into a second peak wavelength, which is different from the first peak wavelength. In one example, the second wavelength shifter WLS2 may convert the blue light provided by the display device 10 into green light having a single peak wavelength of 510 nm to 550 nm and may emit the green light.

The light-transmitting part LTU may be disposed in the third emission area EA3, can the second capping layer CAP2. In another example, the light-transmitting part LTU may be disposed in the second emission area EA2 and the second wavelength conversion part WLC2 may be disposed in the third emission area EA3. The light-transmitting part LTU may be surrounded by the light-blocking part BK. The light-transmitting part LTU may transmit incident light therethrough while maintaining the peak wavelength of the incident light. The light-transmitting part LTU may include a third base resin BS3 and a third scatterer SCT3. A wavelength shifter may not be provided in light-transmitting part LTU.

The third base resin BS3 may include a material having a relatively high light transmittance. The third base resin BS3 may be formed of a transparent organic material.

The third scatterer SCT3 may have a different refractive index from the third base resin BS3 and may form an optical interface with the third base resin BS3. In one example, the third scatterer SCT3 may include a light-scattering material or light-scattering particles capable of scattering at least some light. The third scatterer SCT3 may scatter incident light in random directions, regardless of the incidence angle of the incident light, substantially without changing the peak wavelength of the incident light.

The first capping layer CAP1 may be disposed on the first and second wavelength conversion parts WLC1 and WLC2, the light-transmitting part LTU, the light-blocking part BK, and the touch electrodes SEN. The first capping layer CAP1 may be disposed on a surface of the second substrate SUB2 that faces the first substrate SUB1. For example, the first capping layer CAP1 may be disposed on a bottom surface of the second substrate SUB2. The first capping layer CAP1 may seal the top surfaces of the first and second wavelength conversion parts WLC1 and WLC2 and the light-transmitting part LTU and may thereby prevent the first and second wavelength conversion parts WLC1 and WLC2 and the light-transmitting part LTU from being damaged or polluted. In one example, the first capping layer CAP1 may include an inorganic material.

The second substrate SUB2 may be disposed on the wavelength conversion layer WLCL. The second substrate SUB2 may support and protect the display device 10. The second substrate SUB2 may be a base substrate or a base member. In one example, the second substrate SUB2 may include a glass material or a metallic material. In another example, the second substrate SUB2 may include a polymer resin such as PI.

The polarizing film POL may be disposed on the second substrate SUB2. In one example, the polarizing film POL may include a linear polarizing plate and a phase retardation film such as λ/4 plate. The linear polarizing plate and the phase retardation film may be sequentially stacked on the second substrate SUB2.

Figure 17:
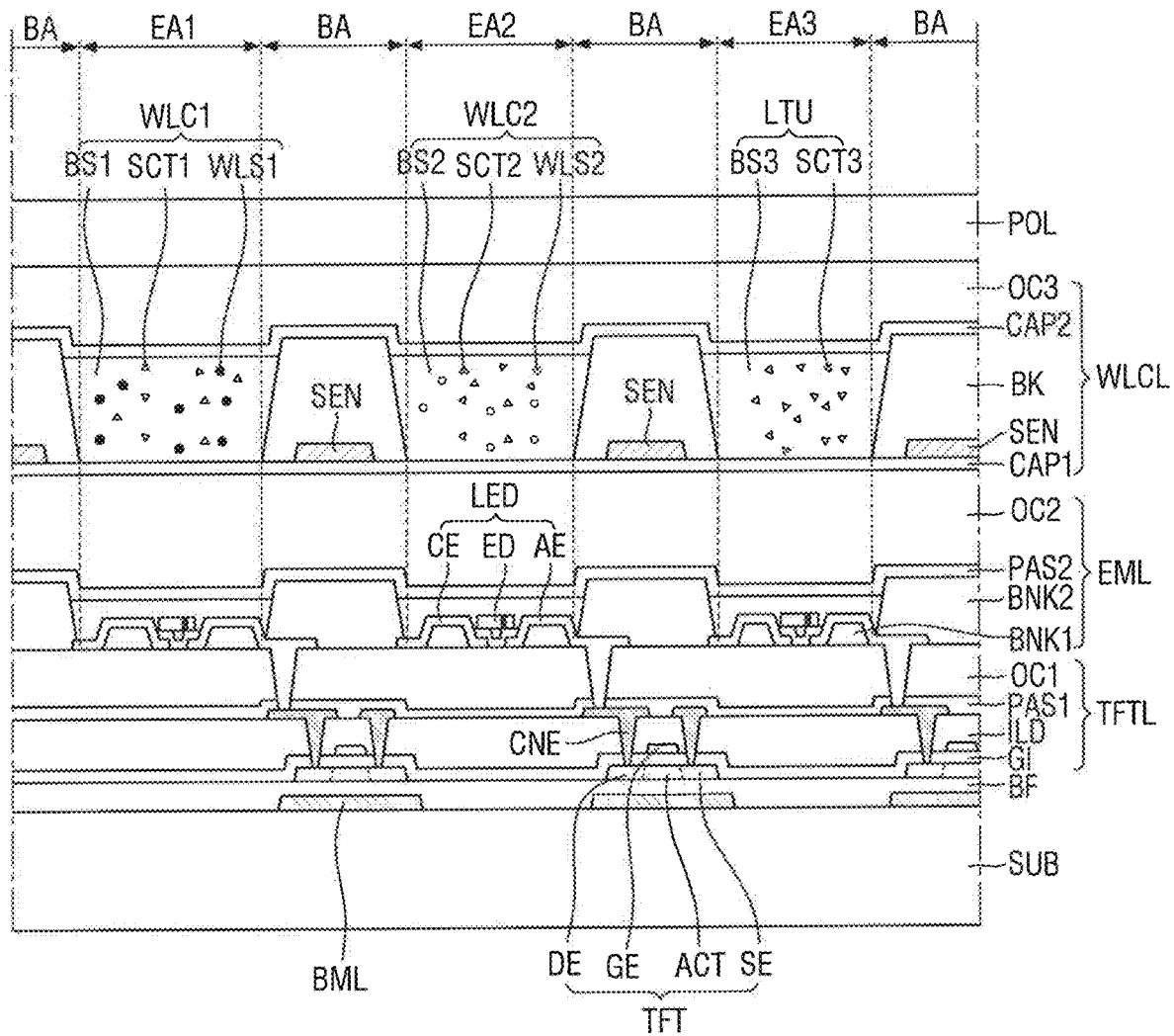
FIG. 17 is a cross-sectional view of a display device according to another embodiment of the present disclosure.

FIG. 17 is a cross-sectional view of a display device according to another embodiment of the present disclosure. The display device of FIG. 17 differs from the display device of FIG. 7 in the configuration of a wavelength conversion layer WLCL and the absence of a second substrate SUB2 and thus will hereinafter be described, focusing mainly on the differences with the display device of FIG. 7.

Referring to FIG. 17, a display panel 100 may include a substrate SUB, a TFT layer TFTL, a light-emitting element layer EML, a wavelength conversion layer WLCL, and a polarizing film POL.

The substrate SUB may be a base substrate or a base member. In one example, the substrate SUB may include a glass material or a metallic material. In another example, the substrate SUB may include a polymer resin such as PI.

The TFT layer TFTL may be disposed on the substrate SUB. The TFT layer TFTL may include a buffer layer BF, a light-blocking layer BML, TFTs "TFT", a gate insulating film GI, ain interlayer insulating film ILD, connecting electrodes CNE, a first passivation layer PAS1, and a first planarization layer OC1.

The light-emitting element layer EML may be disposed on the TFT layer TFTL. The light-emitting element layer EML may include light-emitting elements LED, first banks BNK1, a second bank BNK2, a second passivation layer PAS2, and a second planarization layer OC2. The second planarization layer OC2 may be provided on the second passivation layer PAS2 to planarize the top of the light-emitting element layer EML. In one example, the second planarization layer OC2 may include an organic material.

The wavelength conversion layer WLCL may include a first capping layer CAP1, a light-blocking part BK, a plurality of touch electrodes SEN, a first wavelength conversion part WLC1, a second wavelength conversion part WLC2, a light-transmitting part LTU, a second capping layer CAP2, and a third planarization layer OC3.

The first capping layer CAP1 may be disposed on the second planarization layer OC2 of the light-emitting element layer EML. The first capping layer CAP1 may seal the bottom surfaces of the first and second wavelength conversion parts WLC1 and WLC2 and the light-transmitting part LTU. In one example, the first capping layer CAP1 may include an inorganic material.

The light-blocking part BK may be disposed in light-blocking areas BA, on the first capping layer CAP1. The light-blocking part BK may overlap with the second hank BNK2 in a thickness direction. The light-blocking part BK may surround the first and second wavelength conversion parts WLC1 and WLC2 and the light-transmitting part LTU in a plan view. The light-blocking part BK may block visible light and may transmit IR light or UV light therethrough. The light-blocking part BK may improve the color reproducibility of a display device 10 by preventing visible light from infiltrating between first, second, and third emission areas EA1, EA2, and EA3 to cause color mixing. The light-blocking part BK may be arranged in a lattice form in a plan view to surround the first, second, and third emission areas EA1, EA2, and EA3.

In one example, the light-blocking part BK may include an organic black pigment. The organic black pigment may include Lactam Black, Perylene Black, or Aniline Black, preferably, Lactam Black.

The touch electrodes SEN may be disposed in the light-blocking areas BA, on the first capping layer CAP1, and may be covered by the light-blocking part BK. For example, the touch electrodes SEN may be in direct contact with the first capping layer CAP1 and the light-blocking part BK. Thus, the touch electrodes SEN may not need a separate touch sensor layer and may be disposed in the wavelength conversion layer WLCL. In addition, the touch electrodes SEN in FIG. 17 may be disposed closer to the light-emitting element layer EML than the touch electrodes SEN in FIG. 16. The touch electrodes SEN may include an IR reflective material or a UV reflective material. Thus, the touch electrodes SEN may reflect IR light or UV light transmitted through the light-blocking part BK. At least some of the touch electrodes SEN may include a code pattern part CDP. An image of the code pattern part CDP may be captured with IR light or UV light.

The first wavelength conversion part WLC1 may be disposed in the first emission area EA1, on the first capping layer CAP1. The first wavelength conversion part WLC1 may be surrounded by the light-blocking part BK. The first wavelength conversion part WLC1 may include a first base resin BS1, a first scatterer SCT1, and a first wavelength shifter WLS1.

The second wavelength conversion part WLC2 may be disposed in the second emission area EA2, on the first capping layer CAP1. In the alternative, the second wavelength conversion part WLC2 may be disposed in the first emission area EA1 and the first wavelength conversion part WLC1 may be disposed in the second emission area EA2. The second wavelength conversion part WLC2 may be surrounded by the light-blocking part BK. The second wavelength conversion part WLC2 may include a second base resin BS2, a second scatterer SCT2, and a second wavelength shifter WLS2.

The light-transmitting part LTU may be disposed in the third emission area EA3, on is the first capping layer CAP1. The light-transmitting part LTU may be surrounded by the light-blocking part BK. The light-transmitting part LTU may transmit incident light therethrough while maintaining the peak wavelength of the incident light. The light-transmitting part uru may include a third base resin BS3 and a third scatterer SCT3. In the case the light-transmitting part LTU includes a wavelength shifter, the light-transmitting part LTU would be converted to a wavelength conversion part.

The second capping layer CAP2 may cover the first and second wavelength conversion parts WLC1 and WLC2, the light-transmitting part LTU, and the light-blocking part BK. In one example, the second capping layer CAP2 may seal the first and second wavelength conversion parts WLC1 and WLC2 and the light-transmitting part LTU and may thereby prevent the first and second wavelength conversion parts WLC1 and WLC2 and the light-transmitting part LTU from being damaged or polluted. In one example, the second capping layer CAP2 may include an inorganic material.

The third planarization layer OC3 may be disposed on the second capping layer CAP2 to planarize the tops of the first and second wavelength conversion parts WLC1 and WLC2 and the light-transmitting part LTU. In one example, the third planarization layer OC3 may include an organic material.

The polarizing film POL may be disposed on the third planarization layer OC3. In one example, the polarizing film POL may include a linear polarizing plate and a phase retardation film such as a λ/4 plate. The linear polarizing plate and the phase retardation film may be sequentially stacked on the third planarization layer OC3.

Figure 18:
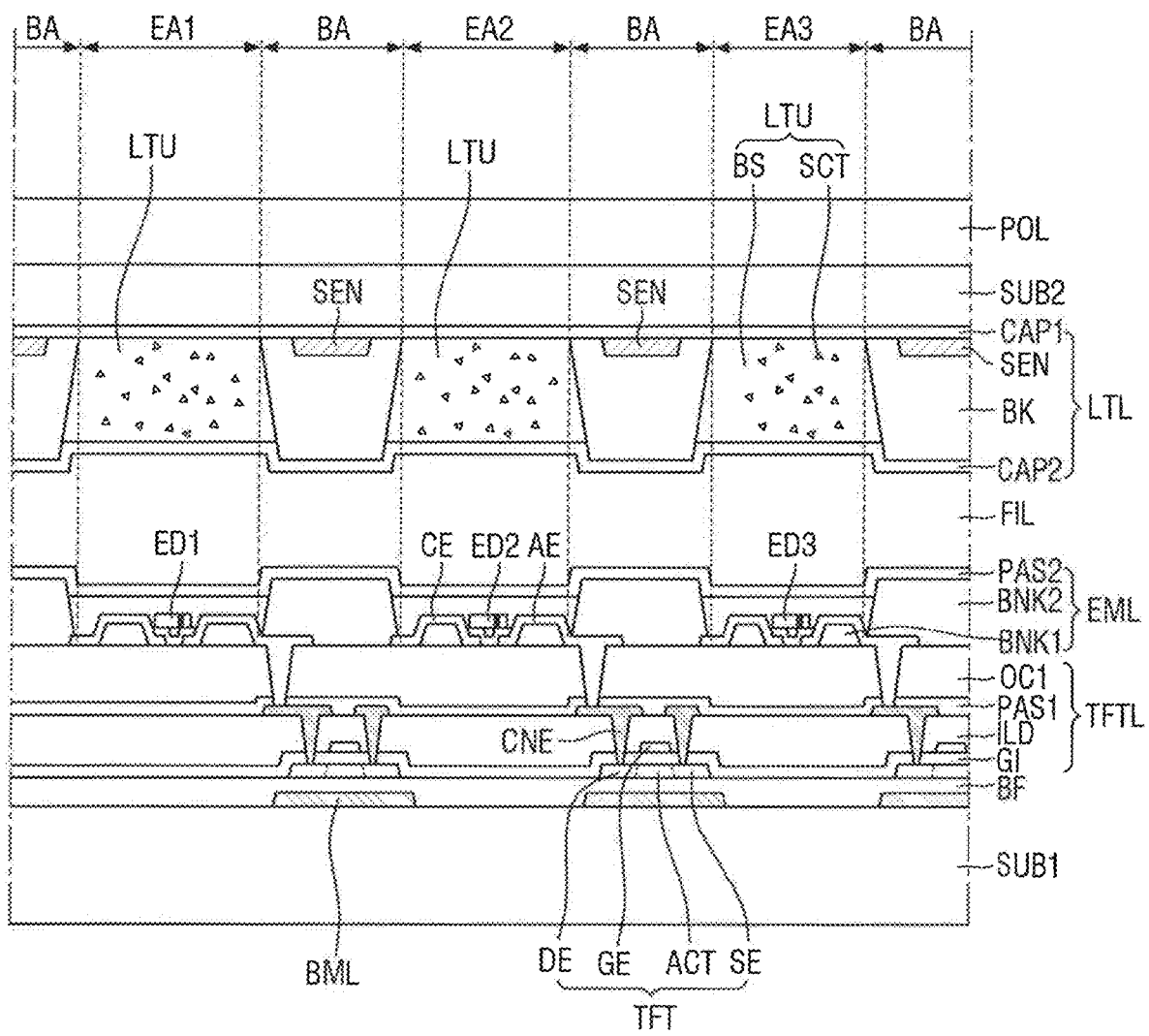
FIG. 18 is a cross-sectional view of a display device according to another embodiment of the present disclosure.

FIG. 18 is a cross-sectional view of a display device according to another embodiment of the present disclosure.

The display device of FIG. 18 differs from the display device of FIG. 16 in the presence of first, second, and third LEDs ED1, ED2, and ED3 and a light-transmitting layer LTL and thus will hereinafter be described, focusing mainly on the differences with the display device of FIG. 16.

Referring to FIG. 18, a display panel 100 may include a first substrate SUB1, a TFT layer TFTL, a light-emitting element layer EML, a filler layer FIL, a light-transmitting layer LTL, a second substrate SUB2, and a polarizing film POL.

The first substrate SUB1 may be a base substrate or a base member. In one example, the first substrate SUB1 may include a glass material or a metallic material. In another example, the first substrate SUB1 may include a polymer resin such as PI.

The TFT layer TFTL may be disposed on the first substrate SUB1. The TFT layer TFTL may include a buffer layer BF, a light-blocking layer BML, TFTs "TFT", a gate insulating film GI, an interlayer insulating film ILD, connecting electrodes CNE, a first passivation layer PAS1, and a first planarization layer OC1.

The light-emitting element layer EML may be disposed on the TFT layer TIFTL. The light-emitting element layer EML may include light-emitting elements LED, first banks BNK1, a second bank BNK2, and a second passivation layer PAS2.

The light-emitting elements LED may be disposed on the TFT layer TFTL. The light-emitting elements LED may include first, second, and third LEDs ED1, ED2, and ED3.

The first LED ED1 may be disposed in a first emission area EA1, on the first planarization layer OC1. The first LED ED1 may be disposed between first and second electrodes AE and CE. The first LED ED1 may be an inorganic LED including an inorganic material. In one example, the first LED ED1 may emit red light having a peak wavelength of 610 nm to 650 nm.

The second ED2 may be disposed in a second emission area EA2, on the first planarization layer OC1. The second LED ED2 may be disposed between first and second electrodes AE and CE. The second LED ED2 may be an inorganic LED including an inorganic material. In one example, the second LED ED2 may emit green light having a peak wavelength of 510 nm to 550 nm.

The third LED ED3 may be disposed in a third emission area EA3, on the first planarization layer OC1. The third LED ED3 may be disposed between first and second electrodes AE and CE. The third LED ED3 may be an inorganic LED including an inorganic material. In one example, the third LED ED3 may emit blue light having a peak wavelength of 440 nm to 480 nm.

The filler layer FIL may fill the space between the emission layer EML and the light-transmitting layer LTL and may be surrounded by a sealing member.

The light-transmitting layer LTL may include a second capping layer CAP2, a light-blocking part BK, a plurality of touch electrodes SEN, light-transmitting parts LTU, and a first capping layer CAP1.

The second capping layer CAP2 may be disposed on the filler layer FIL. The second capping layer CAP2 may cover the bottom surfaces of the light-transmitting parts LTU and the light-blocking part BK. In one example, the second capping layer CAP2 may seal the light-transmitting parts LTU and may thereby prevent the light-transmitting parts LTU from being damaged or polluted. In one example, the second capping layer CAP2 may include an inorganic material.

The light-blocking part BK may be disposed in light-blocking areas BA, on the second capping layer CAP2. The light-blocking part BK may overlap with the second bank BNK2 in a thickness direction. The light-blocking part BK may block the transmission of light. The light-blocking part BK may improve the color reproducibility of a display device 10 by preventing light from infiltrating between the first, second, and third emission areas EA1, EA2, and EA3 to cause color mixing. The light-blocking part BK may be arranged in a lattice form in a plan view to surround the first, second, and third emission areas EA1, EA2, and EA3.

The touch electrodes SEN may be disposed on a surface of the first capping layer CAP1 that faces the first substrate SUB1. For example, the touch electrodes SEN may be disposed on a bottom surface of the first capping layer CAP1. The touch electrodes SEN may be disposed in the light-blocking areas BA, on the bottom surface of the first capping layer CAP1, and may be covered by the light-blocking part BK. The touch electrodes SEN may be spaced apart from an adjacent one of the light-transmitting parts LTU by a portion of the light-blocking part BK. Thus, the touch electrodes SEN may not need a separate touch sensor layer and may be disposed in the light-transmitting layer LTL. At least some of the touch electrodes SEN may include a code pattern part CDP.

The light-transmitting parts LTU may be disposed in the first, second, and third emission areas EA1, EA2, and EA3, on the second capping layer CAP2. The light-transmitting part LTU may be surrounded by the light-blocking part BK. The light-transmitting parts LTU may transmit incident light therethrough while maintaining the peak wavelength of the incident light. Each of the light-transmitting parts LTU may include a base resin BS and a scatterer SCT.

The base resin BS may include a material having a relatively high light transmittance. The base resin BS may be formed of a transparent organic material.

The scatterer SCT may have a different refractive index from the base resin BS and may form an optical interface with the base resin BS. In one example, the scatterer SCT may include a light-scattering material or light-scattering particles capable of scattering at least some light. The scatterer SCT may scatter incident light in random directions, regardless of the incidence angle of the incident light, substantially without changing the peak wavelength of the incident light.

The first capping layer CAP1 may be disposed on the light-transmitting parts LTU, the light-transmitting part LTU, the light-blocking part BK, and the touch electrodes SEN. Top surfaces of the light-transmitting parts LTU and top surfaces of the touch electrodes SEN may be at the same level. The first capping layer CAP1 may be disposed on a surface of the second substrate SUB2 that faces the first substrate SUB1. The first capping layer CAP1 may seal the top surfaces of the light-transmitting parts LTU and may thereby prevent the light-transmitting parts LTU from being damaged or polluted. In one example, the first capping layer CAP1 may include an inorganic material.

The second substrate SUB2 may be disposed on the light-transmitting parts LTU. The second substrate SUB2 may support and protect the display device 10. The second substrate SUB2 may be a base substrate or a base member. In one example, the second substrate SUB2 may include a glass material or a metallic material. In another example, the second substrate SUB2 may include a polymer resin such as PI.

The polarizing film POL may be disposed on the second substrate SUB2. In one example, the polarizing film POL may include a linear polarizing plate and a phase retardation film such as a λ/4 plate. The linear polarizing plate and the phase retardation film may be sequentially stacked on the second substrate SUB2.

Figure 19:
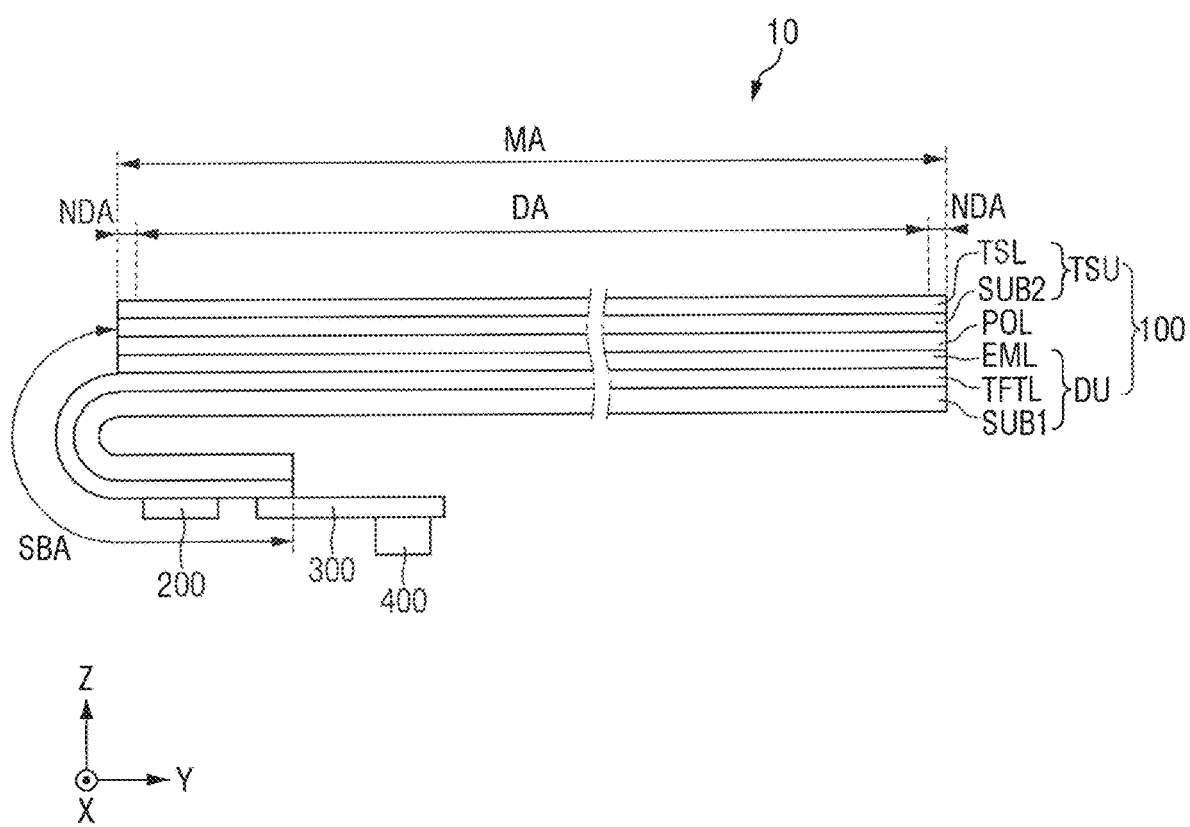
FIG. 19 is a cross-sectional view of a display device according to another embodiment of the present disclosure.

FIG. 19 is a cross-sectional view of a display device according to another embodiment of the present disclosure. The display device of FIG. 19 differs from the display device of FIG. 2 in the configuration of a touch sensing unit and thus will hereinafter be described, focusing mainly on the differences with the display device of FIG. 2.

Referring to FIG. 19, a display panel 100 may include a display unit DU, a polarizing film POL, and a touch sensing unit TSU. The display unit DU may include a first substrate SUB1, a TFT layer TFTL, and a light-emitting element layer EML.

The first substrate SUB1 may be a base substrate or a base member. In one example, the first substrate SUB1 may include a glass material or a metallic material. In another example, the first substrate SUB1 may include a polymer resin such as PI.

The TFT layer TFTL may be disposed on the first substrate SUB1. The TFT layer TFTL may include a plurality of TFTs that form the pixel circuits of pixels. The TFT layer TFTL may further include gate lines, data lines, power supply lines, gate control lines, fare-out lines, which connect a display driver 200 and the data lines, and lead lines, which connect the display driver 200 and a pad unit. In one example, in a case where a gate driver is disposed on one side of a non-display area NDA of the display panel 100, the gate driver may include TFTs.

The TFT layer TFTL may be disposed in a display area DA, a non-display area NDA, and a subarea SBA. The TFTs of each of the pixels of the TFT layer TFTL and the gate lines, the data lines, and the power supply lines of the TFT layer TFTL may be disposed in the non-display area NDA. The gate control lines and the fan-out lines of the TFT layer TFTL may be disposed in the non-display area NDA. The lead lines of the TFT layer TFTL may be disposed in the subarea SBA.

The light-emitting element layer EML may be disposed on the TFT layer TFTL. The light-emitting element layer EML may include a plurality of light-emitting elements, in which first electrodes, emission layers, and second electrodes are sequentially stacked to emit light, and a pixel-defining film, which define the pixels. The light-emitting elements of the light-emitting element layer EML may be disposed in the display area DA.

The polarizing film POL may be disposed on the light-emitting element layer EML. The polarizing film POL may be attached on the light-emitting element layer EML via an OCA film or an OCR. In one example, the polarizing film POL may include a linear polarizing plate and a phase retardation film such as a λ/4 plate. The linear polarizing plate and the phase retardation film may be sequentially stacked on the light-emitting element layer EML.

The touch sensing unit TSU may include a second substrate SUB2 and a touch sensor layer TSL. In one example, the touch sensing unit TSU may be fabricated as a separate element and may then be attached on the polarizing film POL, but the present disclosure is not limited thereto.

The second substrate SUB2 may be disposed on the polarizing film POL. The second substrate SUB2 may be a base substrate or a base member. In one example, the second substrate SUB2 may include a glass material or a metallic material. In another example, the second substrate SUB2 may include a polymer resin such as PI.

The touch sensor layer TSL may be disposed on the second substrate SUB2. The touch sensor layer TSL may be in direct contact with the second substrate SUB2. The touch sensor layer TSL may be disposed in the display area DA and the non-display area NDA. The touch sensor layer TSL may include a plurality of touch electrodes SEN for detecting a touch input from a user in a capacitive manner and touch lines for connecting the touch electrodes SEN and a touch driver 400. In one example, the touch sensing unit TSU may detect a touch input from the user in a self-capacitive manner or a mutual capacitance manner.

Figure 20:
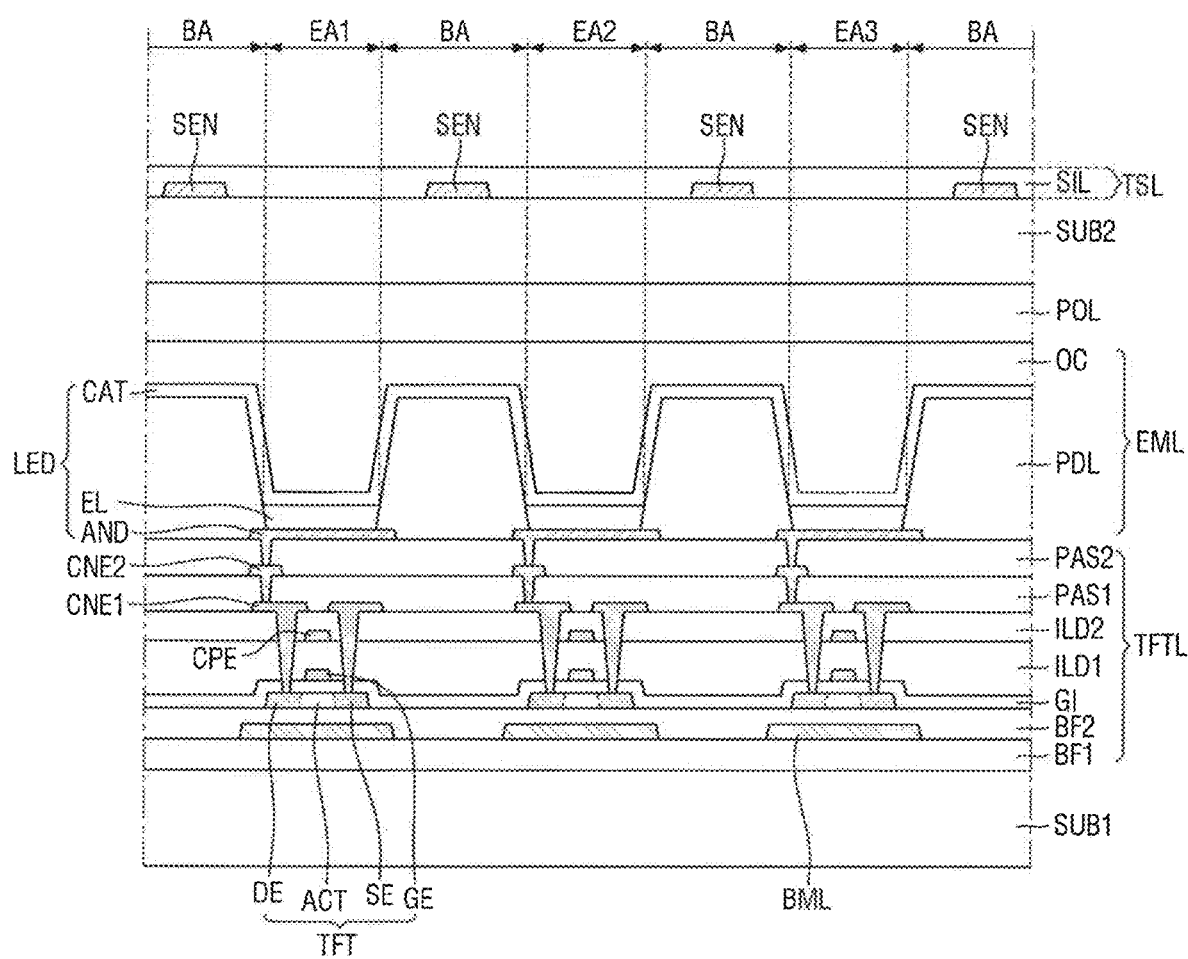
FIG. 20 is a cross-sectional view of a display device according to another embodiment of the present disclosure.

FIG. 20 is a cross-sectional view of a display device according to another embodiment of the present disclosure. The display device of FIG. 20 differs from the display device of FIG. 15 in the elements above an encapsulation layer and thus will hereinafter be described, focusing mainly on the differences with the display device of FIG. 15.

Referring to FIG. 20, a display panel 100 may include a first substrate SUB1, a TFT layer TFTL, a light-emitting element layer EML, a polarizing film POL, a second substrate SUB2, and a touch sensor layer TSL.

The first substrate SUB1 may be a base substrate or a base member. In one example, the first substrate SUB1 may include a glass material or a metallic material. In another example, the first substrate SUB1 may include a polymer resin such as PI.

The TFT layer TFTL may be disposed on the first substrate SUB1. The TFT layer TFTL may include a first buffer layer BF1, a light-blocking layer BML, a second buffer layer BF2, TFTs "TFT", a gate insulating film GI, a first interlayer insulating film ILD1, capacitor electrodes CPE, a second interlayer insulating film ILD2, first connecting electrodes CNE1, a is first passivation layer PAS1, second connecting electrodes CNE2, and a second passivation layer PAS2.

The light-emitting element layer EML may be disposed on the TFT layer TFTL. The light-emitting element layer EML may include light-emitting elements LED, a pixel-defining film PDL, and a planarization layer OC. The light-emitting elements LED may include pixel electrodes AND, emission layers EL, and a common electrode CAT. The pixel-defining film PDL may define first, second, and third emission areas EA1, EA2, and EA3. The planarization layer OC may be disposed on the common electrode CAT to planarize the top of the light-emitting element layer EML.

The polarizing film POL may be disposed on the light-emitting element layer EML. In one example, the polarizing film POL may include a linear polarizing plate and a phase retardation film such as a λ/4 plate.

The second substrate SUB2 may be disposed on the polarizing film POL. The second substrate SUB2 may be a base substrate or a base member. In one example, the second substrate SUB2 may include a glass material or a metallic material. In another example, the second substrate SUB2 may include a polymer resin such as PI.

The touch sensor layer TSL may be disposed on the second substrate SUB2. The touch sensor layer TSL may be disposed on a top surface of the second substrate SUB2. The touch sensor layer TSL may include a plurality of touch electrodes SEN and an insulating film SIL.

The touch electrodes SEN may be disposed on the second substrate SUB2. The touch electrodes SEN may not overlap with the first, second, and third emission areas EA1, EA2, and EA3. The touch electrodes SEN may overlap with the light-blocking areas BA. The touch electrodes SEN may be formed in a mesh or fishnet shape in a plan view. At least some of the touch electrodes SEN may include a code pattern part CDP.

The insulating film SIL may cover the touch electrodes SEN and the second substrate SUB2. For example, insulating film SIL may surround the touch electrodes SEN. The insulating film SIL may have insulating and optical functions.

Figure 21:
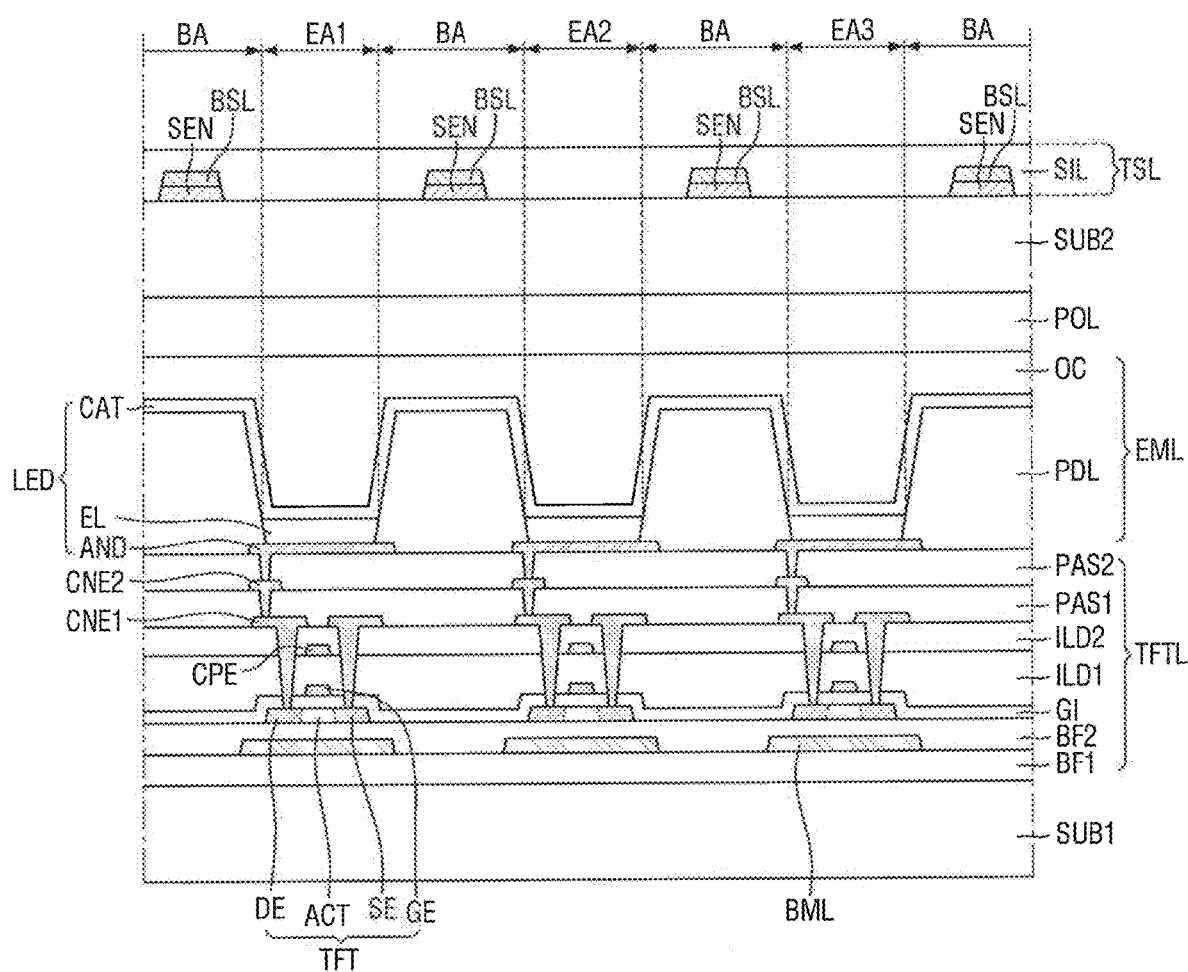
FIG. 21 is a cross-sectional view of a display device according to another embodiment of the present disclosure.

FIG. 21 is a cross-sectional view of a display device according to another embodiment of the present disclosure. The display device of FIG. 21 differs from the display device of FIG. 20 in the presence of light-blocking patterns BSL and thus will hereinafter be described, focusing mainly on the differences with the display device of FIG. 20.

Referring to FIG. 21, a display panel 100 may include a first substrate SUB1, a TFT layer TFTL, a light-emitting element layer EML, a polarizing film POL, a second substrate SUB2, and a touch sensor layer TSL.

The touch sensor layer TSL may be disposed on the second substrate SUB2. The touch sensor layer TSL may include a plurality of touch electrodes SEN, light-blocking patterns BSL, and an insulating film SIL.

The touch electrodes SEN may be disposed on the second substrate SUB2. The touch electrodes SEN may not overlap with first, second, and third emission areas EA1, EA2, and EA3. The touch electrodes SEN may be formed in a mesh or fishnet shape in a plan view. At least some of the touch electrodes SEN may include a code pattern part CDP.

The light-blocking patterns BSL may be disposed on the touch electrodes SEN. For example, the light-blocking patterns BSL and the touch electrodes SEN may form a stacked structure. In one example, the light-blocking patterns BSL may include an organic black pigment. The organic black pigment may include Lactam Black, Perylene Black, or Aniline Black, preferably, Lactam Black. Thus, the light-blocking patterns BSL can prevent the reflection of external light by the touch electrodes SEN.

The touch electrodes SEN may be covered by the light-blocking patterns BSL. The light-blocking patterns BSL may block visible light and may transmit IR light or UV light therethrough. The touch electrodes SEN may include an IR reflective material or a UV reflective material. Thus, the touch electrodes SEN may reflect IR light or UV light transmitted through the light-blocking patterns BSL. At least some of the touch electrodes SEN may include a code pattern part CDP. An image of the code pattern part CDP may be captured with IR light or UV light.

The insulating film SIL may cover the touch electrodes SEN and the second substrate SUB2. The insulating film SIL may surround the stacked structure including the touch electrodes SEN and the light-blocking patterns BSL. The insulating film SIL may have insulating and optical functions.

Figure 22:
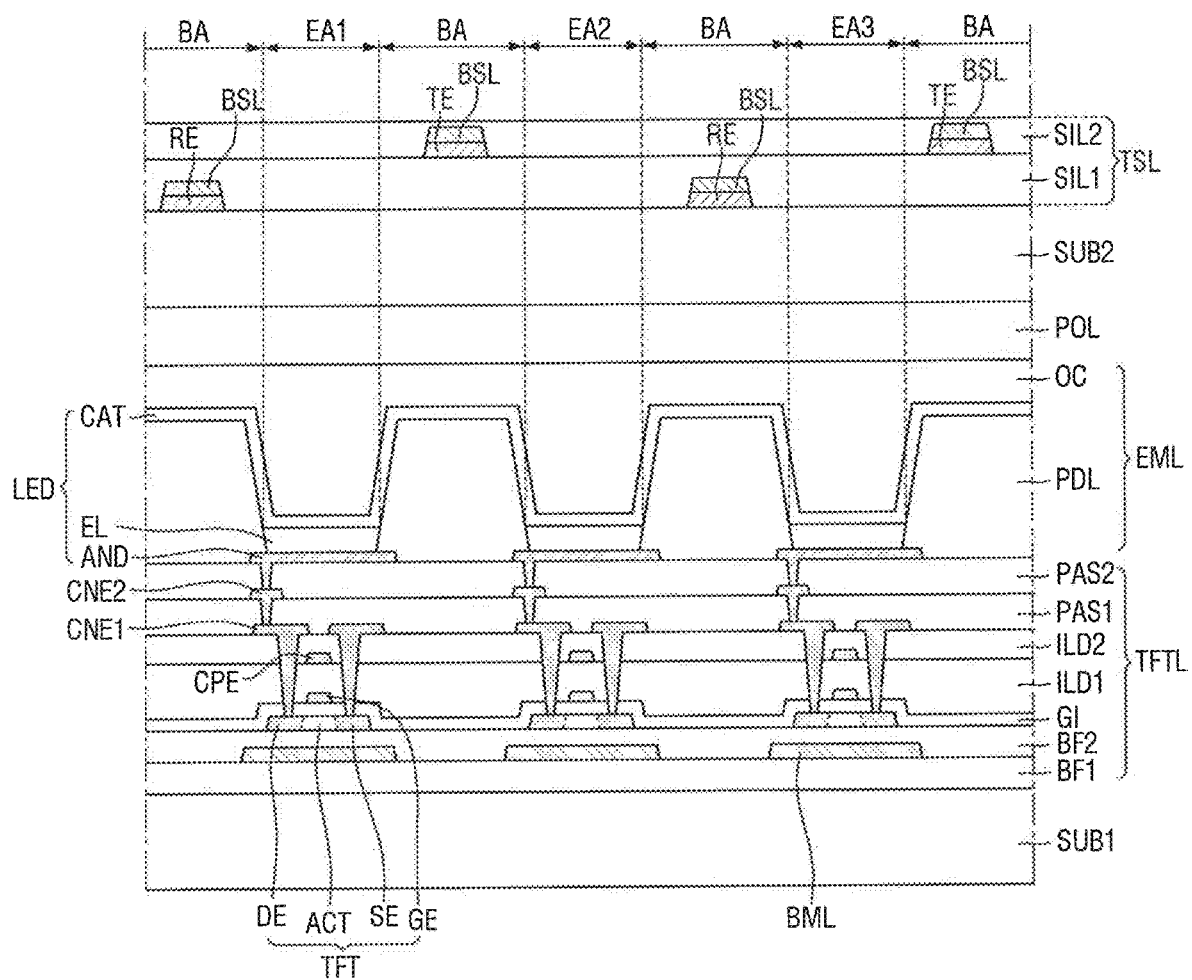
FIG. 22 is a cross-sectional view of a display device according to another embodiment of the present disclosure.

FIG. 22 is a cross-sectional view of a display device according to another embodiment of the present disclosure. The display device of FIG. 22 differs from the display device of FIG. 21 in the configuration of a touch sensor layer TSL and thus will hereinafter be described, focusing mainly on the differences with the display device of FIG. 21.

Referring to FIG. 22, a display panel 100 may include a first substrate SUB1, a TFT layer TFTL, a light-emitting element layer EML, a polarizing film POL, a second substrate SUB2, and a touch sensor layer TSL.

The touch sensor layer TSL may be disposed on the second substrate SUB2. The touch sensor layer TSL may include a plurality of touch electrodes SEN, light-blocking patterns BSL, a first insulating film SIL1, and a second insulating film SIL2. The touch electrodes SEN may include a plurality of driving electrodes TE and a plurality of sensing electrodes RE.

The sensing electrodes RE may be disposed on the second substrate SUB2. For example, the sensing electrodes RE may be in direct contact with the second substrate SUB2. The sensing electrodes RE may not overlap with first, second, and third emission areas EA1, EA2, and EA3. The sensing electrodes RE may be formed in a mesh or fishnet shape in a plan view. At least some of the sensing electrodes RE may include a code pattern part CDP.

The first insulating film SIL1 may cover the touch electrodes SEN, the light-blocking patterns BSL, and the second substrate SUB2. More specifically, the first insulating film SIL1 may cover the sensing electrodes RE. The first insulating film SIL1 may have insulating and optical functions.

The driving electrodes TE may be disposed on the first insulating film SIL1. For example, the driving electrode TE may be in direct contact with a top surface of the first insulating film SIL1 and may be surrounded by the second insulating film SIL2. The driving electrodes TE may not overlap with the first, second, and third emission areas EA1, EA2, and EA3. The driving electrodes TE may be formed in a mesh or fishnet shape in a plan view. At least some of the driving electrodes TE may include a code pattern part CDP.

Alternatively, the driving electrodes TE may be disposed on the second substrate SUB2, and the sensing electrodes RE may be disposed on the first insulating film SIL1. Yet alternatively, the touch electrodes SEN may be disposed on the second substrate SUB2 and the first insulating film SIL1. The driving electrodes TE and the sensing electrodes RE may be alternately arranged such that they do not overlap each other.

The light-blocking patterns BSL may be disposed on the driving electrodes TE and to the sensing electrodes RE. In one example, the light-blocking patterns BSL may include an organic black pigment. The organic black pigment may include Lactam Black, Perylene Black, or Aniline Black, preferably, Lactam Black. Thus, the light-blocking patterns BSL can prevent the reflection of external light by the touch electrodes SEN.

The touch electrodes SEN and the sensing electrodes RE may be covered by the light-blocking patterns BSL. The light-blocking patterns BSL may block visible light and may transmit IR light or UV light therethrough. The touch electrodes SEN and the sensing electrodes RE may include an IR reflective material or a UV reflective material. Thus, the touch electrodes SEN and the sensing electrodes RE may reflect IR light or UV light transmitted through the light-blocking patterns BSL. The touch electrodes SEN and the sensing electrodes RE may include a code pattern part CDP. An image of the code pattern part CDP may be captured with IR light or UV light.

The second insulating film SIL2 may cover the driving electrodes TE, the light-blocking patterns BSL, and the first insulating film SIL1. The second insulating film SIL2 may have insulating and optical functions.

Figure 23:
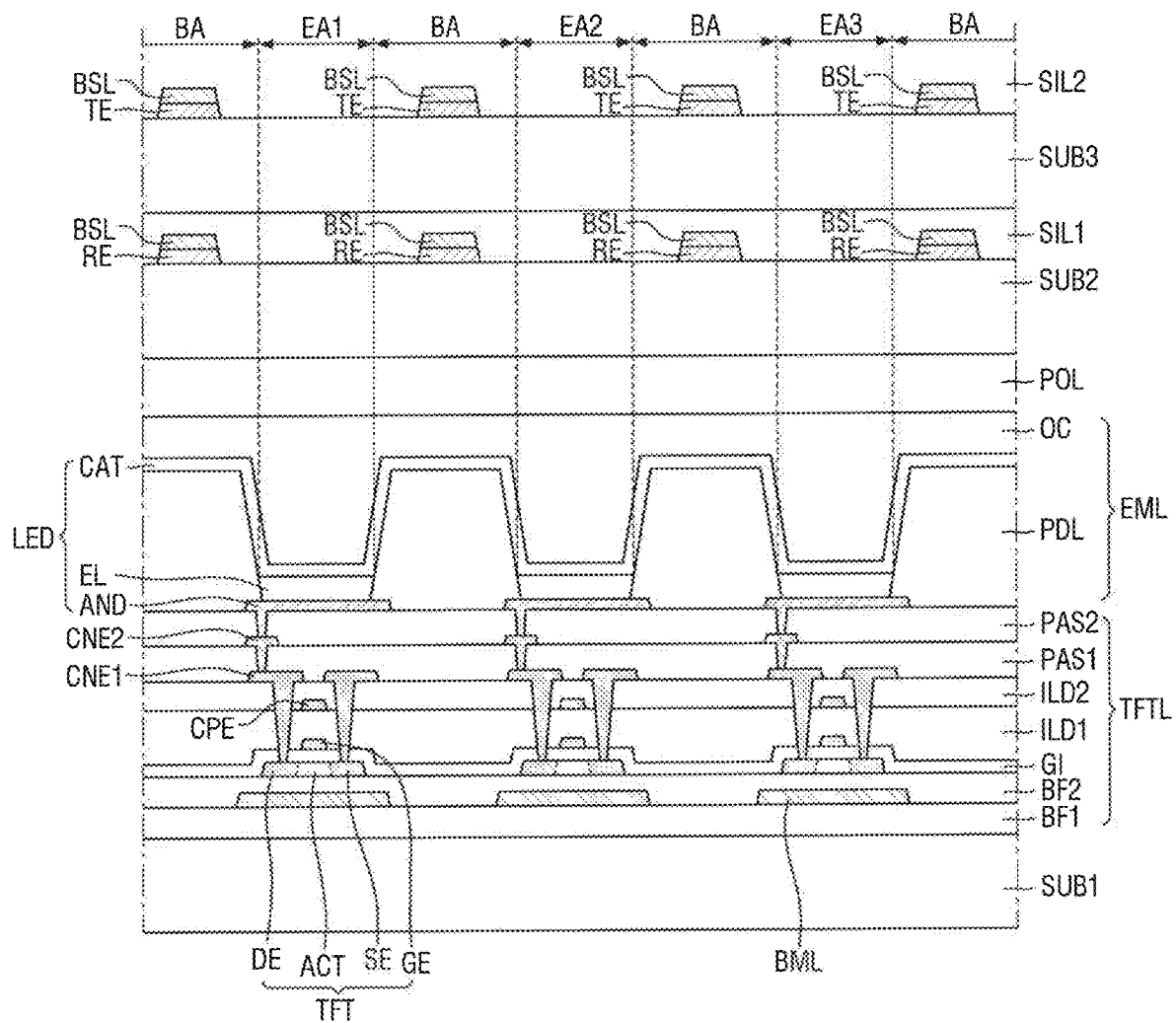
FIG. 23 is a cross-sectional view of a display device according to another embodiment of the present disclosure.

FIG. 23 is a cross-sectional view of a display device according to another embodiment of the present disclosure. The display device of FIG. 23 differs from the display device of FIG. 22 in the elements above a second substrate SUB2 and thus will hereinafter be described, focusing mainly on the differences with the display device of FIG. 22.

Referring to FIG. 23, a display panel 100 may include a first substrate SUB1, a TFT layer TFTL, a light-emitting element layer EML, a polarizing film POL, a second substrate SUB2, a plurality of sensing electrodes RE, a first insulating film SIL1, a third substrate SUB3, a plurality of driving electrodes TE, light-blocking patterns BSL, and a second insulating film SIL2.

The sensing electrodes RE may be disposed on the second substrate SUB2. The sensing electrodes RE may not overlap with first, second, and third emission areas EA1, EA2, and EA3. The sensing electrodes RE may be formed in a mesh or fishnet shape in a plan view. At least some of the sensing electrodes RE may include a code pattern part CDP.

The first insulating film SIL1 may cover the sensing electrodes RE, the light-blocking patterns BSL, and the second substrate SUB2. The first insulating film SIL1 may have insulating and optical functions.

The third substrate SUB3 may be disposed on the first insulating film SIL1. The third substrate SUB3 may be a base substrate or a base member. In one example, the third substrate SUB3 may include a glass material or a metallic material. In another example, the third substrate SUB3 may include a polymer resin such as PI.

The driving electrodes TE may be disposed on the third substrate SUB3. The driving electrodes TE may not overlap with the first, second, and third emission areas EA1, EA2, and EA3. The driving electrodes TE may be formed in a mesh or fishnet shape in a plan view. At least some of the driving electrodes TE may include a code pattern part CDP. The driving electrodes TE may overlap the sensing electrodes RE with the third substrate SUB3 therebetween.

Alternatively, the driving electrodes TE may be disposed on the second substrate SUB2, and the sensing electrodes RE may be disposed on the third substrate SUB3. Yet alternatively, a plurality of touch electrodes SEN may be disposed on the second and third substrates SUB2 and SUB3.

The light-blocking patterns BSL may be disposed on the driving electrodes TE and the sensing electrodes RE. In one example, the light-blocking patterns BSL may include an organic black pigment. The organic black pigment may include Lactam Black, Perylene Black, or Aniline Black, preferably, Lactam Black. Thus, the light-blocking patterns BSL can prevent the reflection of external light by the touch electrodes SEN.

The driving electrodes TE and the sensing electrodes RE may be covered by the light-blocking patterns BSL. The light-blocking patterns BSL may block visible light and may transmit IR light or UV light therethrough. The driving electrodes TE and the sensing is electrodes RE may include an IR reflective material or a UV reflective material. Thus, the driving electrodes TE and the sensing electrodes RE may reflect IR light or UV light transmitted through the light-blocking patterns BSL. The driving electrodes TE and the sensing electrodes RE may include a code pattern part CDP. An image of the code pattern part CDP may be captured with IR light or UV light.

The second insulating film SIL2 may cover the driving electrodes TE, the light-blocking patterns BSL, and the third substrate SUB3. The second insulating film SIL2 may have insulating and optical functions.

Figure 24:
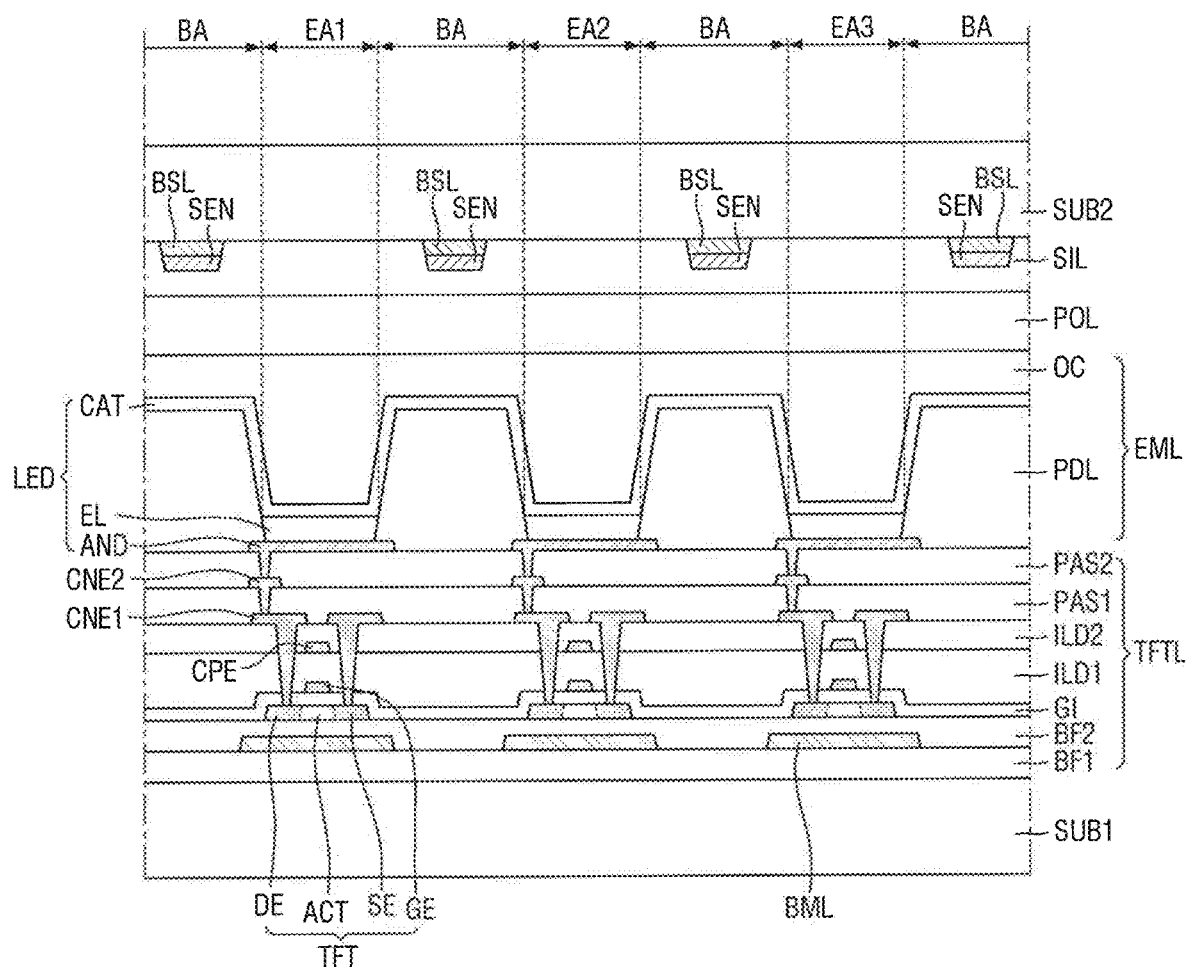
FIG. 24 is a cross-sectional view of a display device according to another embodiment of the present disclosure.

FIG. 24 is a cross-sectional view of a display device according to another embodiment of the present disclosure. The display device of FIG. 24 differs from the display device of FIG. 20 in the elements above a polarizing film POL and thus will hereinafter be described, focusing mainly on the differences with the display device of FIG. 20.

Referring to FIG. 24, a display panel 100 may include a first substrate SUB1, a TFT layer TFTL, a light-emitting element layer EML, a polarizing film POL, a second substrate SUB2, light-blocking patterns BSL, and an insulating film SIL.

The second substrate SUB2 may face the first substrate SUB1. Once the light-blocking patterns BSL, a plurality of touch electrodes SEN, and the insulating film SIL are provided on the second substrate SUB2, the second substrate SUB2 may be bonded to the first substrate SUB1. The light-blocking patterns BSL, the plurality of touch electrodes SEN, and to the insulating film SIL are provided on a surface of the second substrate SUB2 facing the fist substrate SUB1. The second substrate SUB2 may be a base substrate or a base member. In one example, the second substrate SUB2 may include a glass material or a metallic material. In another example, the second substrate SUB2 may include a polymer resin such as PI.

The light-blocking patterns BSL may be disposed below the second substrate SUB2. The light-blocking patterns BSL may be disposed on the surface of the second substrate SUB2 that faces the first substrate SUB1. The light-blocking patterns BSL may be disposed on the touch electrodes SEN. The light-blocking patterns BSL may block visible light and may transmit IR light or UV light therethrough. The touch electrodes SEN may include an IR reflective material or a UV reflective material. Thus, the touch electrodes SEN may reflect IR light or UV light transmitted through the light-blocking patterns BSL. At least some of the touch electrodes SEN may include a code pattern part CDP. An image of the code pattern part CDP may be captured with IR light or UV light.

The touch electrodes SEN may be disposed below the light-blocking patterns BSL. The touch electrodes SEN may be disposed on surfaces of the light-blocking patterns BSL that face the first substrate SUB1. The touch electrodes SEN may not overlap with first, second, and third emission areas EA1, EA2, and EA3.

The insulating film SIL may cover the touch electrodes SEN, the light-blocking patterns BSL, and the second substrate SUB2. The insulating film SIL may be disposed between the polarizing film POL and the second substrate SUB2.

Figure 25:
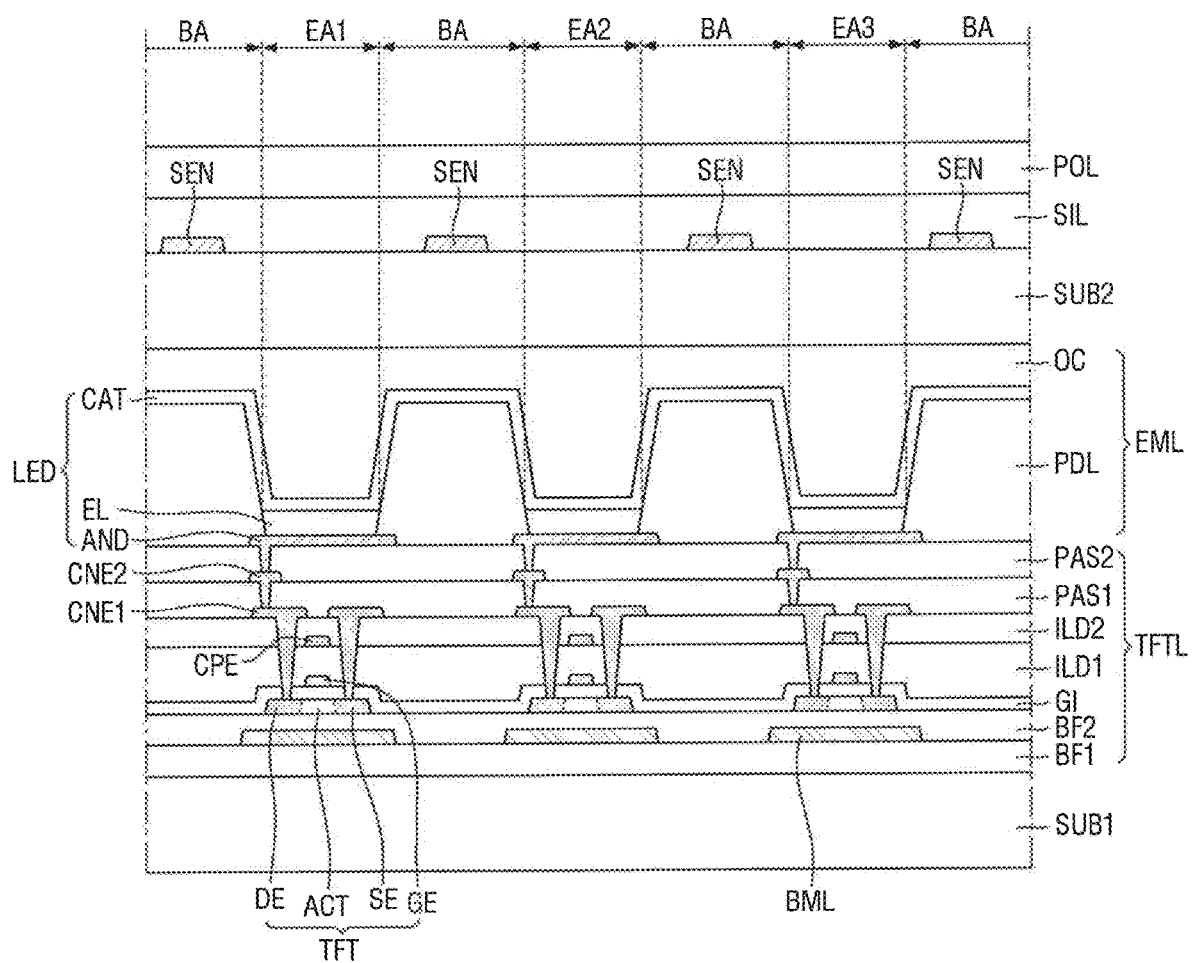
FIG. 25 is a cross-sectional view of a display device according to another embodiment of the present disclosure.

FIG. 25 is a cross-sectional view of a display device according to another embodiment of the present disclosure. The display device of FIG. 25 differs from the display device of FIG. 20 in the location of a polarizing film POL and thus will hereinafter be described, focusing mainly on the differences with the display device of FIG. 20.

Referring to FIG. 25, a display panel 100 may include a first substrate SUB1, a TFT layer TFTL, a light-emitting element layer EML, a second substrate SUB2, a plurality of touch electrodes SEN, an insulating film SIL, and a polarizing film POL.

The second substrate SUB2 may be disposed on the light-emitting element layer EML. The second substrate SUB2 may be a base substrate or a base member. In one example, the second substrate SUB2 may include a glass material or a metallic material. In another example, the second substrate SUB2 may include a polymer resin such as PI.

The touch electrodes SEN may be disposed on the second substrate SUB2. The touch electrodes SEN may not overlap with first, second, and third emission areas EA1, EA2, and EA3. The touch electrodes SEN may be formed in a mesh or fishnet shape in a plan view. At least some of the sensing electrodes RE may include a code pattern part CDP.

The insulating film SIL may cover the touch electrodes SEN and the second substrate SUB2. The insulating film SIL may have insulating and optical functions.

The polarizing film POL may be disposed on the insulating film SIL. For example, the polarizing film POL may cover the insulating film SIL. The insulating film SIL may be disposed between the polarizing film POL and the second substrate SUB2. In one example, the polarizing film POL may include a linear polarizing plate and a phase retardation film such as a λ/4 plate.

Figure 26:
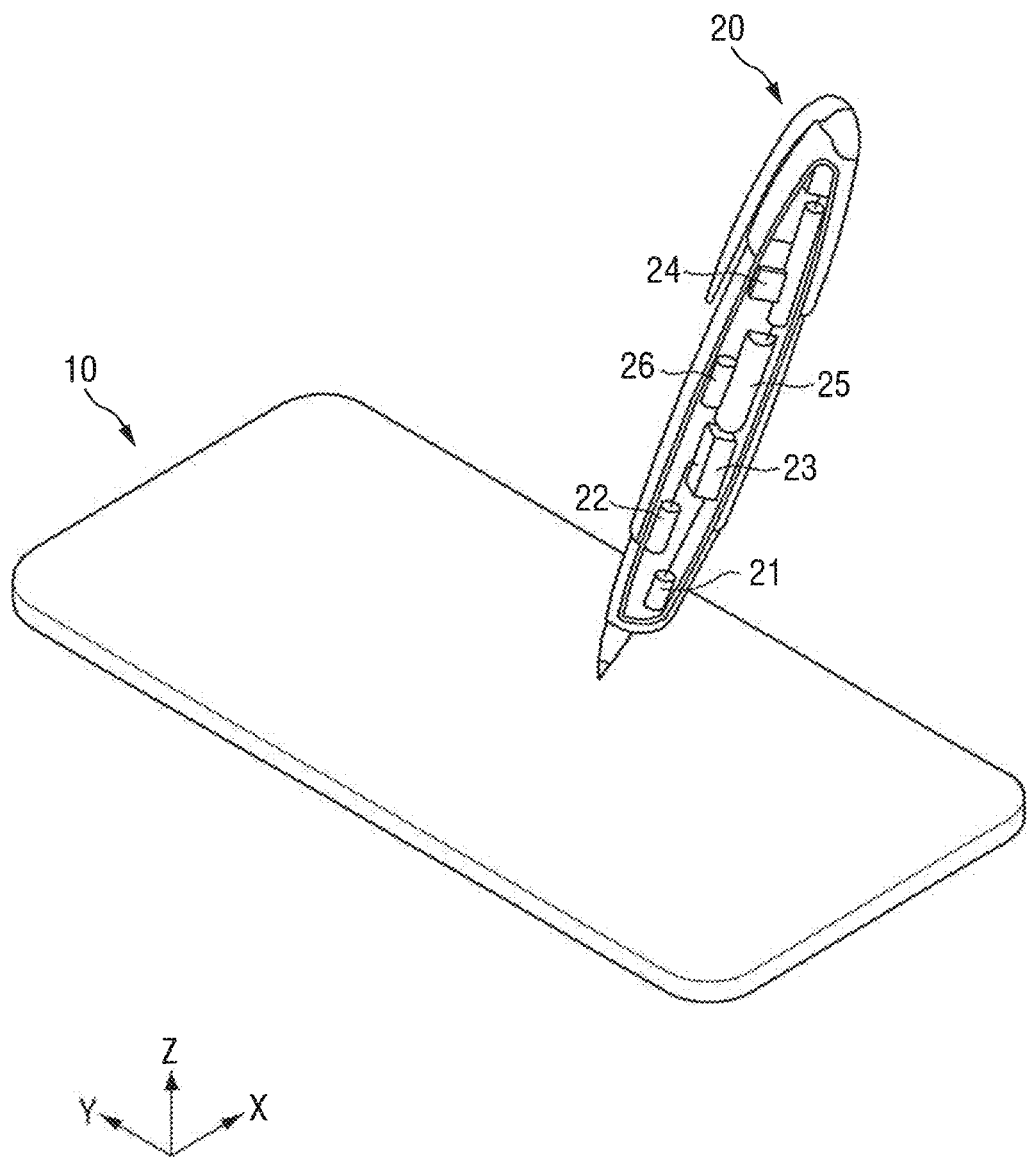
FIG. 26 is a perspective view of a touch input system according to an embodiment of the present disclosure.
Figure 27:
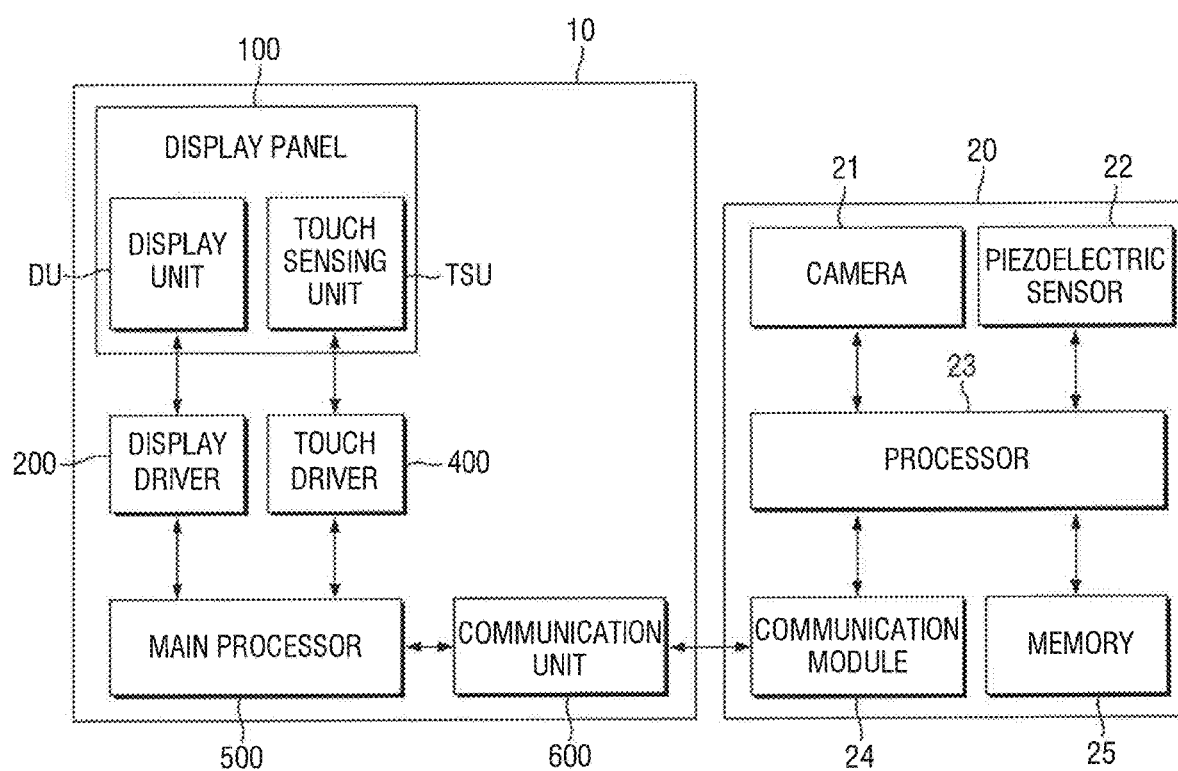
FIG. 27 is a block diagram illustrating a display device and a touch input device of the touch input system of FIG. 26.

FIG. 26 is a perspective view of a touch input system according to an embodiment of the present disclosure, and FIG. 27 is a block diagram illustrating a display device and a touch input device of the touch input system of FIG. 26.

Referring to FIGS. 26 and 27, the touch input system may include a display device 10 and a touch input device 20.

The display device 10 may include a display panel 100, a display driver 200, a touch driver 400, a main processor 500, and a communication unit 600.

The display panel 100 may include a display unit DU and a touch sensing unit TSU. The display unit DU may include a plurality of pixels and may display an image.

The touch sensing unit TSU may include a plurality of touch electrodes SEN and may detect a touch input from a user in a capacitive manner. Since at least some of the touch electrodes SEN includes a code pattern part CDP, a touch input from the touch input device 20 is can be detected. The code pattern part CDP may include a plurality of code patterns CP, which are cut in accordance with a predetermined set of criteria and thus have location information. The code patterns CP may correspond to predefined data codes DC.

The display driver 200 may output signals and voltages for driving the display unit DU. The display driver 200 may provide data voltages to data lines. The display driver 200 may provide power supply voltages to power supply lines and may provide gate control signals to a gate driver.

The touch driver 400 may be connected to the touch sensing unit TSU. The touch driver 400 may provide touch driving signals to the touch electrodes SEN of the touch sensing unit TSU and may sense capacitance variations between the touch electrodes SEN. The touch driver 400 may detect the presence of a touch input from the user and the coordinates of the touch input based on the capacitance variations between the touch electrodes SEN.

The main processor 500 may control all functions of the display device 10. In one example, the main processor 500 may provide digital video data to the display driver 200 to display an image on the display panel 100. In one example, the main processor 500 may receive touch data from the touch driver 400, may determine the coordinates of a touch input from the user, and may generate digital video data based on the coordinates of the touch input or execute an application pointed to by an icon at the coordinates of the touch input. In another example, the main processor 500 may receive coordinate data from the touch input device 20, may determine the coordinates of touch input from the touch input device 20 based on the received coordinate data, and may generate digital video data based on the coordinates of the touch input or execute an application pointed to by an icon at the coordinates of the touch input.

The communication unit 600 may communicate with an external device in a wired or wireless manner. In one example, the communication unit 600 may transmit communication signals to, or receive communication signals, from a communication module 24 of the touch input device 20. The communication unit 600 may receive coordinate data that consists of data codes DC from the touch input device 20 and may provide coordinate data to the main processor 500.

The touch input device 20 may include a camera 21, a piezoelectric sensor 22, a processor 23, a communication module 24, a memory 25, and a battery 26. In one example, the touch input device 20 may be a smart pen generating coordinate data in an optical manner, but the present disclosure is not limited thereto.

The camera 21 may be disposed at the front of the touch input device 20. The camera 21 may capture an image of a code pattern part CDP included in at least some of the touch electrodes SEN of the touch sensing unit TSU. As the touch input device 20 moves, the camera 21 may continuously capture an image of a code pattern portion CDP at each corresponding location of the touch input device 20. The camera 21 may provide the captured image to the processor 23.

The piezoelectric sensor 22 may sense pressure applied by the touch input device 20 to the display device 10. The piezoelectric sensor 22 may provide pressure information of the touch input device 20 to the processor 23.

The processor 23 may receive an image of a code pattern part CDP from the camera 21. In one example, the processor 23 may receive an image of the code pattern part CDP of FIG. 9 and may identify a plurality of code patterns CP based on the locations of the first and second reference lines HRL and VRL. Then, the processor 23 may convert the identified code patterns CP into data codes DC and may generate coordinate data by combining the data codes DC. The processor 23 may transmit the coordinate data to the display device 10 through the communication module 24.

In another example, the processor 23 may receive an image of the code pattern part CDP of FIG. 11 and may identify a plurality of code patterns CP based on the locations of the first and second reference points RP1 and RP2. Then, the processor 23 may convert the identified code patterns CP into data codes DC and may generate first data. Data1 and second data Data2 of coordinate data by combining the data codes DC. Here, the first data Data1 may correspond to, but is not limited to, the X-axis coordinate of a touch location, and the second data Data2 may correspond to, but is not limited to, the Y-axis coordinate of the touch location.

In yet another example, the processor 23 may receive an image of the code pattern part CDP of FIG. 13 and may identify a plurality of code patterns CP based on the locations of the first and second reference points RP1 and RP2. Then, the processor 23 may convert the identified code patterns CP into data codes DC and may generate first data Data1 and second data Data2 of coordinate data by combining the data codes DC.

The processor 23 receives an image of a code pattern part CDP and can quickly generate coordinate data, without using a complicated computation/correction process, by converting a plurality of code patterns CP of the code pattern part CDP into data codes DC that correspond one-to-one to the code patterns CP. Thus, the touch input system can reduce cost and power consumption and can simplify a driving process thereof. In addition, since the touch input system includes a plurality of code patterns CP provided in at least some of the touch electrodes SEN, the touch input system can be applied to nearly all types of electronic devices having a touch function without any size limitations.

The communication module 24 may communicate with an external device in a wired or wireless manner. In one example, the communication module 24 may transmit communication signals to, or receive communication signals from, the communication unit 600 of the display device 10. The communication module 24 may receive coordinate data that consist of data codes DC from the processor 23 and may provide the coordinate data to the communication unit 600.

The memory 25 may store data necessary for driving the touch input device 20. The touch input device 20 may convert a plurality of code patterns CP into data codes DC that correspond one-to-one to the code patterns CP and may provide coordinate data directly to the display device 10. Thus, a memory 25 having a relatively small storage capacity may be provided in the touch input system.

What is claimed is:

1. A display device, comprising:
a display unit comprising a plurality of emission areas which emit light; and
a plurality of touch electrodes disposed on the display unit to detect a touch input,
wherein at least some of the touch electrodes include a code pattern part comprising a plurality of code patterns that include cutouts corresponding to location information,
wherein the touch electrodes are formed in a mesh shape in a plan view and surround at least one of the emission areas,
wherein the code pattern part further comprises:
a reference point, which is used to identify the code pattern part, wherein the reference point corresponds to an area between intersecting first and second touch electrodes, the area including a first cut between first and second parts of the first touch electrode that protrude towards and face each other and a second cut between third and fourth parts of the second touch electrode that protrude towards and face each other, wherein ends of the first and second parts at the first cut are not connected to each other and ends of the third and fourth parts at the second cut are not connected to each other;
a first reference line extending from the reference point along a plurality of intersection points of the touch electrode that are arranged in a first direction; and
a second reference line defined by connecting a plurality of intersection points and a cutout part, the intersection points disposed in a second direction intersecting the first direction from the reference point, the cutout part being disposed between the intersection points,
the code patterns are disposed in an area defined by the first and second reference lines, the area including a plurality of rows and a plurality of columns,
the touch electrodes are not physically connected to each other in the reference point, and
the reference point and the cutout part of the second reference line have the same shape.

2. The display device of claim 1, wherein
each of the code patterns corresponds to an intersection between the at least some of the touch electrodes, and
a directional location corresponding to the cutout corresponds to a predefined data code associated with the location information.

3. The display device of claim 2, wherein
at least one of the code patterns does not include a cutout such that the at least one code pattern does not have a data code value.

4. The display device of claim 1, wherein the code pattern part further comprises first and second reference points, which are used to identify the code pattern part, and
the plurality of code patterns are disposed in an area defined by the first and second reference points.

5. The display device of claim 4, wherein the first and second reference points are disposed on sides of the code patterns and are spaced apart from each other.

6. The display device of claim 4, wherein
the code patterns include sides that are cut to form the cutouts and sides that are not cut, and the location or absence of the cut side in each of the code patterns corresponds to a particular data code.

7. The display device of claim 4, wherein the first and second reference points are arranged in rows and columns where the code patterns are arranged.

8. The display device of claim 4, wherein the first and second reference points correspond to an area where stems of the sensing electrodes are cornpletely removed.

9. The display device of claim 4, wherein
each of the code patterns includes a cutout at one of its sides, and
a location of the cutout corresponds to a predefined data code associated with the location information.

10. The display device of claim 1, wherein
the display unit further comprises:
a substrate;
a thin-film transistor layer including a plurality of thin-film transistors disposed on the substrate;
a light-emitting element layer disposed on the thin-film transistor layer and including a plurality of light-emitting elements; and
an encapsulation layer covering the light-emitting element layer, and
the touch electrodes are disposed on the encapsulation layer.

11. The display device of claim 1, further comprising:
a plurality of color filters disposed in the emission areas on the display unit; and
a light-blocking part surrounding each of the color filters on the display unit,
wherein the touch electrodes are covered by the light-blocking part.

12. The display device of claim 11, wherein
the light-blocking part includes an organic light-blocking material and transmits infrared light or ultraviolet light therethrough, and
the touch electrodes include an infrared reflective material or an ultraviolet reflective material.

13. The display device of claim 1, wherein
the display unit further comprises:
a first substrate;
a thin-film transistor layer including a plurality of thin-film transistors disposed on the first substrate; and
a light-emitting element layer disposed on the thin-film transistor layer and including a plurality of light-emitting elements,
the display device further comprises:
a second substrate facing the first substrate;
wavelength conversion parts disposed on a surface of the second substrate that faces the first substrate to correspond to the emission areas; and
a light-blocking part surrounding the wavelength conversion parts, on the surface of the second substrate, and
the touch electrodes are disposed on the surface of the second substrate and covered by the light-blocking part.

14. The display device of claim 1, wherein
the display unit further comprises:
a substrate;
a thin-film transistor layer disposed on the substrate and including a plurality of thin-film transistors; and
a light-emitting element layer disposed on the thin-film transistor layer and including a plurality of light-emitting elements,
the display device further comprises:
wavelength conversion parts disposed on the light-emitting element layer to correspond to the emission areas; and
a light-blocking part disposed on the light-emitting element layer and surrounding the wavelength conversion parts, and
the touch electrodes are disposed on the sitting element layer and covered by the light-blocking part.

15. The display device of claim 1, wherein:
the display unit further comprises:
a first substrate;
a thin-film transistor layer disposed on the first substrate and including a plurality of thin-film transistors; and
a light-emitting element layer disposed on the thin-film transistor layer and including a plurality of light-emitting elements,
the display device further comprises:
a second substrate facing the first substrate;
light-transmitting parts disposed on a surface of the second substrate that faces the first substrate to correspond to the emission areas; and
a light-blocking part disposed on the surface of the second substrate and surrounding the light-transmitting parts, and
the touch electrodes are disposed on the surface of the second substrate and covered by the light-blocking part.

16. A touch input system, comprising:
a display device for displaying an image; and
a touch input device for entering a touch input to the display device,
wherein
the display device comprises:
a display unit comprising a plurality of emission areas that emit light; and
a plurality of touch electrodes disposed on the display unit to detect the touch input,
at least some of the touch electrodes include a code pattern part comprising a plurality of code patterns having cutouts corresponding to location information, and
the touch input device is configured to capture an image of the code patterns, convert the code patterns into predefined data codes, and transmit coordinate data that consists of the data codes to the display device,
wherein the touch electrodes are formed in a mesh shape in a plan view and surround at least one of the emission areas,
wherein the code pattern part further comprises:
a reference point, which is used to identify the code pattern part, wherein the reference point corresponds to an area between intersecting first and second touch electrodes, the area including a first cut between first and second parts of the first touch electrode that protrude towards and face each other and a second cut between third and fourth parts of the second touch electrode that protrude towards and face each other, wherein ends of the first and second parts at the first cut are not connected to each other and ends of the third and fourth parts at the second cut are not connected to each other;
a first reference line extending from the reference point along a plurality of intersection points of the touch electrode that are arranged in a first direction; and
a second reference line defined by connecting a plurality of intersection points and a cutout part, the intersection points disposed in a second direction intersecting the first direction from the reference point, the cutout part being disposed between the intersection points, the code patterns are disposed in an area defined by the first and second reference lines, the area including a plurality of rows and a plurality of columns, the touch touch electrodes are not physically connected to each other in the reference point, and the reference point and the cutout part of the second reference line have the same shape.

17. The touch input system of claim 16, wherein the touch input device comprises:
   a camera for capturing an image of the code patterns;
   a processor for converting the code patterns into the predefined data codes by analyzing the captured image of the code patterns and generating coordinate data that consists of the data codes; and
   a communication module for transmitting the coordinate data to the display device.

18. The touch input system of claim 17, wherein the display device further comprises:
   a communication unit for receiving coordinate data from the communication module; and
   a main processor for generating image data based on the received coordinate data,
   the display unit displays an image based on the image data.

19. A display device, comprising:
   a display unit comprising a plurality of emission areas which emit light; and
   a plurality of touch electrodes disposed on the display unit to detect a touch input,
   wherein a first touch electrode includes a first pattern corresponding to first location information, and a second touch electrode includes a second pattern corresponding to second location information,
   wherein the touch electrodes are formed in a mesh shape in a plan view and surround at least one of the emission areas,
   wherein the touch electrodes comprise:
   a reference point, which is used to identify the first and second patterns, wherein the reference point corresponds to an area between intersecting touch electrodes, the area including a first cut between first and second parts of one of the intersecting touch electrodes that protrude towards and face each other and a second cut between third and fourth parts of the other one of the intersecting touch electrodes that protrude towards and face each other, wherein ends of the first and second parts at the first cut are not connected to each other and ends of the third and fourth parts at the second cut are not connected to each other;
   a first reference line extending from the reference point along a plurality of intersection points of the touch electrode that are arranged in a first direction; and
   a second reference line defined by connecting a plurality of intersection points and a cutout part, the intersection points disposed in a second direction intersecting the first direction from the reference point, the cutout part being disposed between the intersection points,
   the first and second patterns are disposed in an area defined by the first and second reference lines, the area including a plurality of rows and a plurality of columns,
   the touch electrodes are not physically connected to each other in the reference point, and
   the reference point and the cutout part of the second reference line have the same shape.

20. The display device of claim 19, wherein the first pattern is different from the second pattern.

21. The display device of claim 19, wherein the first pattern includes a first cut portion of the first touch electrode.

22. The display device of claim 19, wherein the first location information corresponds to a row and column where the first touch electrode is located in a matrix formed by the plurality of touch electrodes.

23. The display device of claim 22, wherein the row and column where the first touch electrode is located corresponds to a data code.

\* \* \* \* \*